(12) United States Patent
Knox

(10) Patent No.: US 10,541,643 B2
(45) Date of Patent: Jan. 21, 2020

(54) TWO-AXIS SOLAR CONCENTRATOR SYSTEM

(71) Applicant: RayDyne Energy, Inc., Austin, TX (US)

(72) Inventor: Richard Morris Knox, Austin, TX (US)

(73) Assignee: RayDyne Energy, Inc., Plano, TX (US)

( * ) Notice: Subject to any disclaimer, the term of this patent is extended or adjusted under 35 U.S.C. 154(b) by 0 days.

(21) Appl. No.: 15/382,957

(22) Filed: Dec. 19, 2016

(65) Prior Publication Data

US 2017/0179874 A1    Jun. 22, 2017

Related U.S. Application Data

(60) Provisional application No. 62/270,305, filed on Dec. 21, 2015.

(51) Int. Cl.
*H02S 20/32* (2014.01)
*H02S 40/22* (2014.01)
(Continued)

(52) U.S. Cl.
CPC .............. *H02S 20/32* (2014.12); *F24S 20/20* (2018.05); *F24S 20/25* (2018.05); *F24S 23/71* (2018.05);
(Continued)

(58) Field of Classification Search
CPC .......... H02S 20/30; H02S 20/32; H02S 30/10; H02S 40/22; H02S 40/10; H02S 40/20;
(Continued)

(56) References Cited

U.S. PATENT DOCUMENTS

| 4,015,585 A | 4/1977 | Fattor |
| 4,149,523 A | 4/1979 | Boy-Marcotte et al. |

(Continued)

FOREIGN PATENT DOCUMENTS

CN    102540402 A    7/2012

OTHER PUBLICATIONS

International Search Report and Written Opinion mailed in counterpart application PCT/US2016/067459, dated Apr. 13, 2017.

(Continued)

*Primary Examiner* — Lindsey A Bernier

(57) ABSTRACT

A system for use on a surface to collect solar energy from the sun has a stand, a module, and solar collector(s). The stand supportable on the surface has rotational points rotatably supporting the module so it can rotate about a first axis of rotation. A first drive disposed on the stand is operable to provide first rotation, and a cable connected between a hoop pulley of the module and the first drive on the stand can rotate the module about the first axis to direct the solar collector(s) toward the sun. The solar collector(s) disposed on the module can be photovoltaic cells for collecting solar energy. A second drive on the module can rotate an adjacent solar collectors on the module using pulleys and cable. Reflectors on the collectors can focus the sun rays to photovoltaic cells. The second drive can rotate the collectors about a second axis, carried by the first axis, to direct the solar collector(s) toward the sun.

24 Claims, 35 Drawing Sheets

(51) Int. Cl.
| | |
|---|---|
| *H02S 20/30* | (2014.01) |
| *H02S 40/20* | (2014.01) |
| *H02S 30/10* | (2014.01) |
| *H02S 40/10* | (2014.01) |
| *F24S 30/40* | (2018.01) |
| *F24S 30/45* | (2018.01) |
| *F24S 30/20* | (2018.01) |
| *F24S 20/20* | (2018.01) |
| *F24S 23/74* | (2018.01) |
| *F24S 20/25* | (2018.01) |
| *H02S 20/23* | (2014.01) |
| *H01L 31/054* | (2014.01) |
| *F24S 30/455* | (2018.01) |
| *F24S 23/71* | (2018.01) |
| *F24S 30/458* | (2018.01) |
| *F24S 25/00* | (2018.01) |
| *F24S 30/00* | (2018.01) |
| *F24S 23/70* | (2018.01) |

(52) U.S. Cl.
CPC ............... *F24S 23/74* (2018.05); *F24S 30/20* (2018.05); *F24S 30/40* (2018.05); *F24S 30/45* (2018.05); *F24S 30/455* (2018.05); *F24S 30/458* (2018.05); *H01L 31/0547* (2014.12); *H02S 20/23* (2014.12); *H02S 20/30* (2014.12); *H02S 30/10* (2014.12); *H02S 40/10* (2014.12); *H02S 40/20* (2014.12); *H02S 40/22* (2014.12); *F24S 2023/84* (2018.05); *F24S 2025/017* (2018.05); *F24S 2030/133* (2018.05); *Y02B 10/12* (2013.01); *Y02E 10/42* (2013.01); *Y02E 10/47* (2013.01); *Y02E 10/52* (2013.01)

(58) Field of Classification Search
CPC .. F24S 30/20; F24S 30/40; F24S 30/45; F24S 20/20; F24S 20/25; F24S 23/71; F24S 23/74; Y02E 10/52
See application file for complete search history.

(56) References Cited

U.S. PATENT DOCUMENTS

| | | |
|---|---|---|
| 4,153,039 A | 5/1979 | Carroll |
| 4,355,630 A | 10/1982 | Fattor |
| 5,132,188 A | 7/1992 | Datta et al. |
| 5,202,950 A | 4/1993 | Arego et al. |
| 5,325,844 A | 7/1994 | Rogers et al. |
| 5,851,309 A | 12/1998 | Kousa |
| 6,958,868 B1 | 10/2005 | Pender |
| 8,474,445 B2 | 7/2013 | Fairstein |
| 8,844,135 B2 | 9/2014 | Denkmann et al. |
| 2004/0035460 A1 | 2/2004 | Gonsiorawski |
| 2006/0283497 A1 | 12/2006 | Hines |
| 2007/0056625 A1 | 3/2007 | Higuchi et al. |
| 2007/0193620 A1* | 8/2007 | Hines ............... H01L 31/0547 136/246 |
| 2008/0271776 A1 | 11/2008 | Morgan |
| 2008/0314437 A1 | 12/2008 | Regev |
| 2009/0056698 A1 | 3/2009 | Johnson et al. |
| 2009/0064993 A1 | 3/2009 | Ghosh et al. |
| 2009/0067784 A1 | 3/2009 | Ghosh et al. |
| 2009/0101192 A1 | 4/2009 | Kothari et al. |
| 2009/0114280 A1 | 5/2009 | Jensen et al. |
| 2009/0223555 A1 | 9/2009 | Ammar |
| 2009/0250094 A1 | 10/2009 | Robison et al. |
| 2010/0018520 A1* | 1/2010 | Prueitt ............... F24S 23/74 126/694 |
| 2010/0108124 A1 | 5/2010 | Knox et al. |
| 2010/0218807 A1 | 9/2010 | Arbore et al. |
| 2011/0155211 A1 | 6/2011 | Einav |
| 2011/0284055 A1 | 11/2011 | Almogy et al. |
| 2012/0024374 A1 | 2/2012 | Knox et al. |
| 2012/0037206 A1 | 2/2012 | Norman et al. |
| 2012/0192922 A1 | 8/2012 | Waring |
| 2012/0291766 A1* | 11/2012 | Varga ............... F03G 6/067 126/600 |
| 2012/0312351 A1 | 12/2012 | Knox |
| 2012/0318325 A1* | 12/2012 | Liu ............... G05D 3/105 136/246 |
| 2013/0042856 A1 | 2/2013 | Switkes |

OTHER PUBLICATIONS

Hanitsch et al., "Shading Effects on Output Power of Grid Connect Photovoltaic Generator Systems," Rev. Energ. Ren.: Power Engineering (2001), pp. 93-99.

Weast, Robert C., "C.R.C. Mathematical Tables, Thirteenth Edition," 1964, published by The Chemical Rubber Company, pp. 446-450.

ESRL Global Monitoring Division, NOAA Solar Calculator, generated Dec. 19, 2016, obtained from https://www.esrl.noaa.gov/gmd/grad/solcalc/, 4-pgs.

\* cited by examiner

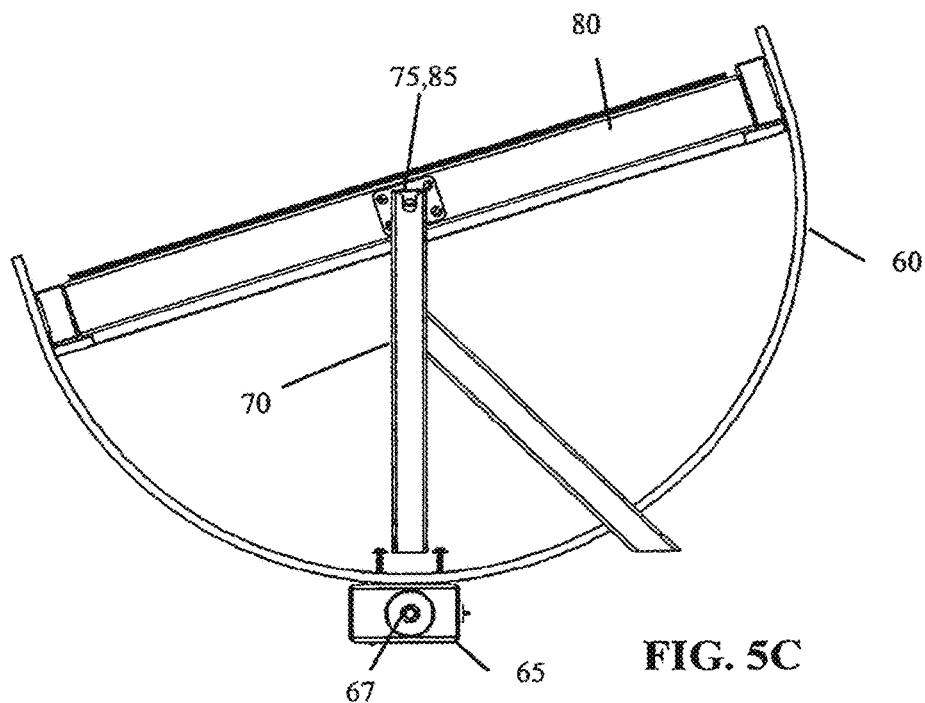
FIG. 5C
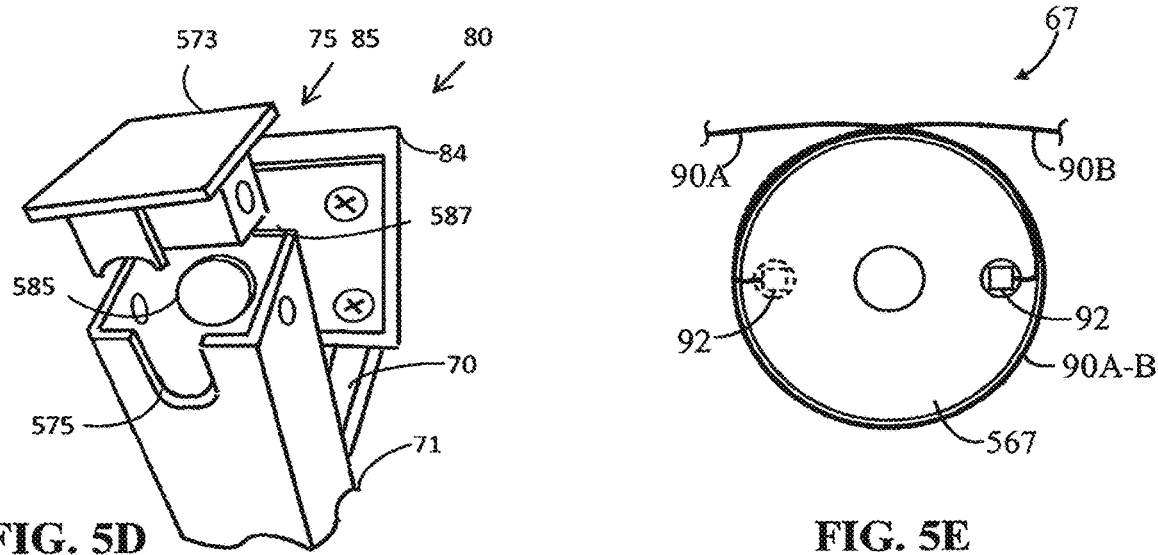
FIG. 5D
FIG. 5E

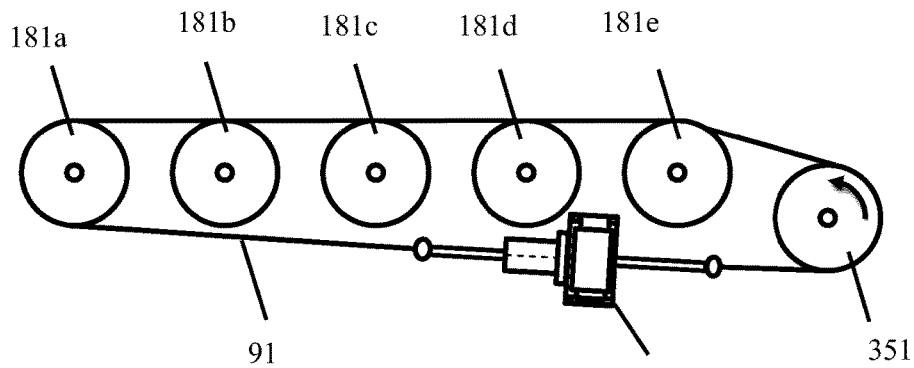
FIG. 7G
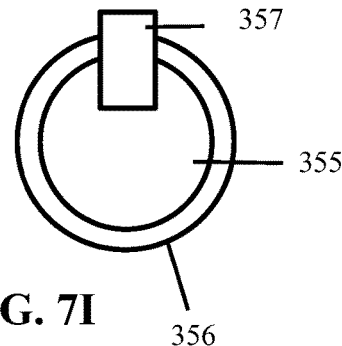
FIG. 7H
FIG. 7I
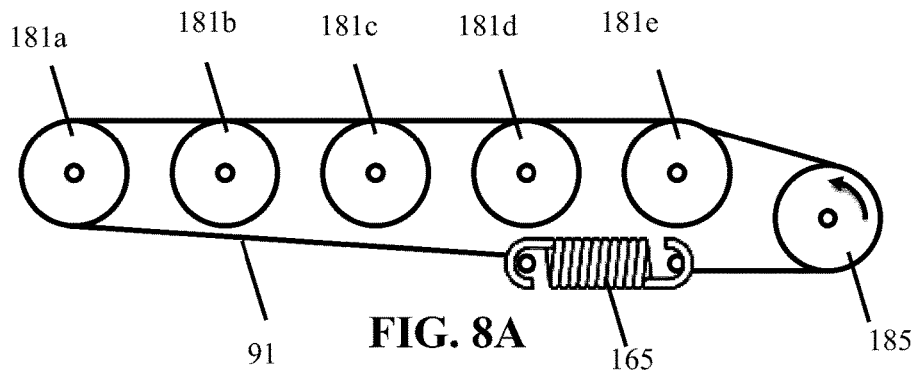
FIG. 8A
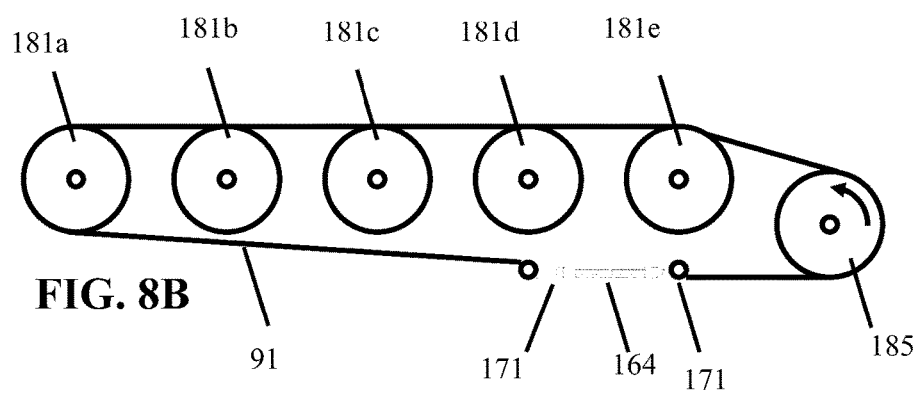
FIG. 8B

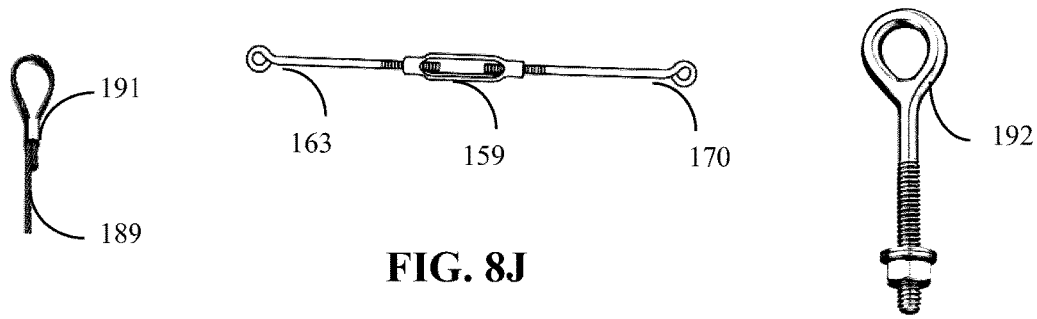
FIG. 8J
FIG. 8I
FIG. 8K
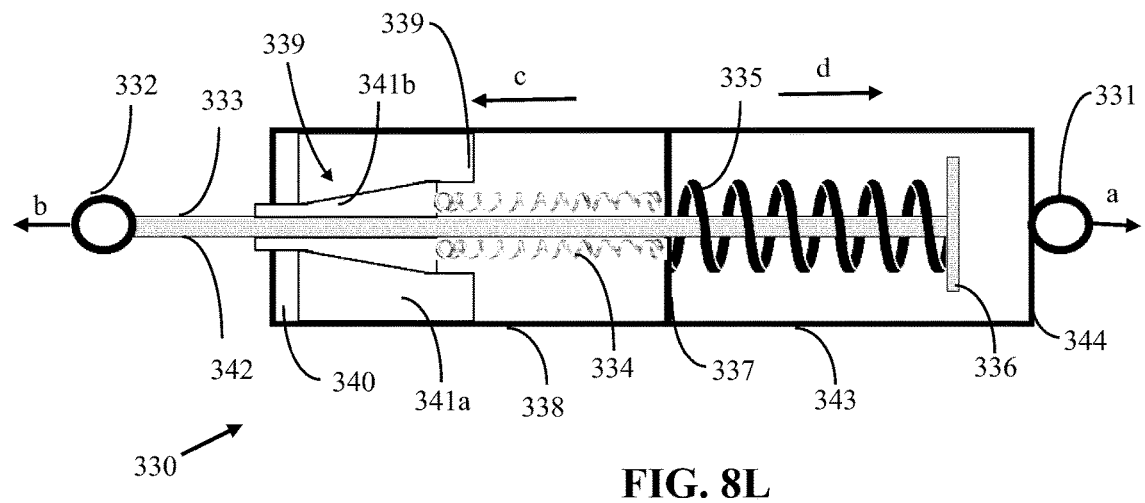
FIG. 8L
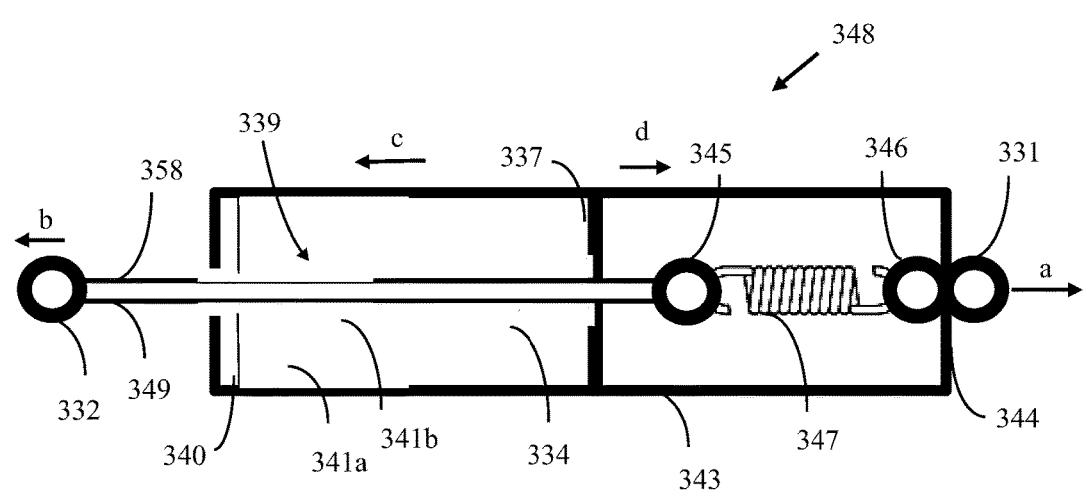
FIG. 8M

| | Item | Description |
|---|---|---|
| A | Collect Data to be Used for NOAA Sun Position Calculator | |
| 1 | Latitude - Longitude | Installed coordinates for solar concentrator assembly |
| 2 | Real time clock | Date / Local time after local midnight |
| B | Outputs of NOAA Sun Position Calculator | |
| 3 | Theta AZ | Solar azimuth angle measure CW from true north |
| 4 | Theta ALT | Solar elevation measured upward from level |
| C | Adjustments due to Solar Concentrator System Installation | |
| 5 | Theta AZ Offset (CW = +, CCW = -) | Angle of daily axis relative to north – south axis |
| D | Apply Adjustments to Solar Position Azimuth Angle | |
| 6 | Theta2 AZ = Theta AZ - Theta AZ Offset | Defines new solar azimuth angle relative to the intermediate coordinate system of the solar concentrator system |
| E | Convert Solar Angle from Intermediate Solar Concentrator Coordinate System to Final Solar Concentrator Coordinate System | |
| 7 | Signcalc - \| Theta2 AZ – 180°\| / {Theta2 AZ -180°} | Calculates sign correction factor |
| 8 | Theta INT = Arctan ( Tan (Theta ALT / Cos (Theta2 AZ – 90°)) * Signcalc | Calculates intermediate value as part of Theta E-W calculation |
| 9 | Theta E-W = (90° + Theta INT) * Signcalc | Calculates angle for daily driver (frame) as part of solar concentrator system internal coordinates |
| 10 | Theta N–S = Arccos ( -sin (Theta2 AZ - 90°) * (Cos (Theta ALT))) | Calculates angle for seasonal drive (collector assemblies) as part of solar concentrator system internal coordinates |
| F | Convert Solar Concentrator Coordinates into Stepper Motor Commands | |
| | Converting an angular position to a number of steps required to drive the stepper motor to the new angular position typically requires knowledge of the current angular position of the stepper motor and of the step angle (number of degrees per step). Stepper motor controllers are available from many manufacturers together with Application Notes and Reference Designs describing how to implement and use them. Other solutions are available that can accept the angular position directly. | |

FIG. 15C

TWO-AXIS SOLAR CONCENTRATOR SYSTEM

CROSS-REFERENCE TO RELATED APPLICATIONS

This is non-provisional of U.S. Patent Application Ser. No. 62/270,305, filed 21 Dec. 2015 and entitled "Asymmetrical Articulated Solar Energy Concentrator with Thermal Management," which is incorporated herein by reference in its entirety and to which priority is claimed.

FIELD OF THE DISCLOSURE

The subject matter of the present disclosure relates to solar panels used to generate electrical or thermal power. More particularly, the subject matter relates to solar panels comprising an array of solar concentrators with optical gain in two axes utilizing photovoltaic cells to generate electricity.

BACKGROUND OF THE DISCLOSURE

Concentrators for solar energy have been in use for many years. These devices are used to focus the sun's energy into a small area to raise the power level being concentrated on a photovoltaic converter to generate electrical power directly, or on a fluid line to heat water to make steam to drive a turbine to generate electrical power.

One difficulty with these concentrators has been that they are generally large and bulky and are not suitable for residential applications or other locations where the aesthetics of the installation are of importance. Additionally, they are very susceptible to environmental damage due to wind and other elements.

Thin film solar panels have been used extensively in recent years for installations on buildings and homes. These panels may be articulated in one or two dimensions or may be fixed. A fixed installation is the least expensive implementation but is also the least efficient because the plane of the panel is rarely normal (90°) to the solar axis. A single point of articulation that allows a panel to track the angle of the sun during the day improves on this approach but there will still be an angle. A second, orthogonal point of articulation will allow a panel to track the sun and maintain the panel so that the solar axis is normal to the plane of the panel. Such systems are inherently bulky and in general are considered more suitable for surface installations than for roof top installations.

An additional problem with roof top installations of any type is the problem of shading. Shading often occurs by environmental features such as trees or tall buildings nearby. Little or nothing can be done about these other than using good planning and commonly available software tools. The difficulty that shading poses is that it can also affect the output of portions of a solar installation that are not placed in the shading because of electrical interaction between the shaded areas and the unshaded areas of the solar installation. This phenomenon is understood and is well reported in the literature. "Shading Effects on Output Power of Grid Connect Photovoltaic Generator Systems," Hanitsch et al, Rev. Energ. Ren.: Power Engineering (2001) 93-99, provides enlightening information on the matter.

Another cause of shading relates to installation factors. Individual solar concentrator assemblies may shade adjacent solar concentrator assemblies at times of the day, with sunrise and/or sunset being the most frequent times. Solutions to these problems depend on the type of solar system involved. A solution for concentrating solar energy systems is particularly difficult. A consideration of solutions is presented in the present application.

FIG. 1 presents a prior art solution for the need to keep the optical axes of a plurality of trough mirrors aligned while moving the trough mirrors to maintain alignment with the sun. Articulating solar concentrator system 10 comprises trough mirrors 25, solar energy collecting tubes 40, support 30, energy transmitting tube 35, trough mirror linking rod 20 and linking rod actuator 15. Trough mirrors 25 are arrayed parallel to one another with solar energy collecting tubes 40 at the focal point of the trough mirrors 25. Solar energy collecting tubes 40 are each physically connected to one of the trough mirrors 25 and are supported by mounting assemblies 30 such that all energy collecting tubes 40 lie in the same plane. Energy transmitting tube 35 connects to each collecting tube 40 by a sealed fitting or the like as is well known in the art. Energy transmitting tube 35 is supported by energy collecting tubes 40. Energy transmitting tube may be connected to a suitable energy harvesting system (not shown) such as a turbine or a hot water heater as is well known in the art. Linking rod 20 is connecting to each of the trough mirrors 25 by an articulating component (not shown). When linking rod 20 is moved by linking rod actuator 15 all trough mirror respond by rotating in the same direction. In this implementation the movement of trough mirrors 25 enables solar concentrator system 10 to track the sun during the course of a day.

Wire cables have long been used as a way of transferring mechanical energy from one location to another. Wire cables are used in diverse applications such as moving the control surfaces of aircraft and moving the print head of dot matrix printers.

One example is the Texas Instruments TI810BSC, designed by the inventor of the present disclosure, which was used for an extended period of time in the airline industry to print tickets and baggage tags. The printer uses a driver pulley to move the print head back and forth across the paper or other material to be printed by moving a wire cable. The wire cable loops over an idler pulley and is routed back to the driver pulley. A tensioner pulley is typically added in the return path of the wire cable. The interior of a dot matrix printer is a hostile environment because in decades of service a significant amount of paper lint and dust will accumulate there. The wire cable drive arrangements work well in that environment and also return the print head to a precise position.

Many of these wire cables are pre-stretched to minimize the development of additional slack in the wire cable during extended operation. The slack occurs as a natural consequence of the catenary effects of gravity on any cable suspended from two ends. The slack follows the shape of the hyperbolic cosine function. The slack becomes problematic as the driver pulley reverses its direction of motion. Too much slack can lead to an unacceptable level of play.

The present disclosure seeks to overcome the foregoing difficulties associated with rooftop installations while maintaining the ability to track the sun in two axes through the use of pulleys driven by wire cables.

The subject matter of the present disclosure is directed to overcoming, or at least reducing the effects of, one or more of the problems set forth above.

SUMMARY OF THE DISCLOSURE

A solar energy concentrator in the form of a plurality of articulating solar concentrator modules mounted parallel within a frame receives solar energy into each module and focuses it onto a series of photovoltaic cells within each module that convert the solar energy into electrical energy. The articulating solar concentrator modules are moved by a pulley arrangement configured such that a driver pulley moves a wire cable that is routed to each driven pulley causing the driven pulleys to move the solar concentrator modules in concert. The frame is mounted to a stand by two axles oriented coaxially and orthogonal to the orientation of the solar concentrator modules. A hoop pulley attached to the frame parallel to the articulating solar concentrator modules is moved by a wire cable moved by a motor attached to the stand.

The solar concentrator modules of the present disclosure can include a plurality of spherical or aspheric half mirrors arrayed so as to focus solar energy on a plurality of photovoltaic cells arranged in a circuit to gather electricity generated by the photovoltaic cells and deliver the electricity to a circuit on the frame. Alternatively, the solar concentrator modules of the present disclosure can include a plurality of Fresnel lenses arrayed so as to focus solar energy on a plurality of photovoltaic cells arranged in a circuit to gather electricity generated by the photovoltaic cells and deliver the electricity to a circuit on the frame.

A system for tracking the sun in two axes optics using wire cable pulleys to enable the use of high gain solar concentrator is described.

The foregoing summary is not intended to summarize each potential embodiment or every aspect of the present disclosure.

BRIEF DESCRIPTION OF THE DRAWINGS

FIG. 5C depicts an end view of a hoop pulley and driver motor for the disclosed system.

FIG. 5D depicts an arrangement of the rotations points between the stand and frame.

FIG. 5E depicts one way the one or more wire cables can connect to a drive pulley for the hoop pulley.

FIGS. 6A-1 and 6A-2 depict front and side views of a first configuration for tensioning the hoop pulley drive system by an extension spring.

FIG. 7G depicts a pulley drive system comprising a linear stepper motor.

FIG. 7H depicts details of a linear stepper motor.

FIG. 7I depicts a shaft of a linear stepper motor inserted into an anti-rotational sleeve.

FIG. 8A depicts a tensioner having an extension spring in-line with the return side of the wire cable.

FIG. 8B depicts a tensioner having a turnbuckle placed in-line with the return side of the wire cable;

FIGS. 8C-1, 8C-2, and 8C-3 depict a side view, top view, and cutaway view of a pulley system with a tensioner having a tensioning pulley and an extension spring.

FIG. 8I depicts a cable loop formed by a cable and ferrule.

FIG. 8J depicts a tensioner comprising a turnbuckle and two rods.

FIG. 8K depicts an eyelet bolt suitable to support a tensioner rod.

FIG. 8L depicts an autonomous tensioner assembly.

FIG. 8M depicts an alternative autonomous tensioner assembly.

FIGS. 10A-1, 10A-2, and 10A-3 depict a side view, a top view, and a cutaway view of a pulley system having a tensioner with a tensioning pulley and an extension spring, and having driven pulleys wrapped by wire cable on both the drive side and the return side of the wire cable.

FIG. 15C presents the calculation elements of an algorithm operative to transform solar azimuth and solar altitude to the local coordinate system of a solar concentrator system of arbitrary orientation;

DETAILED DESCRIPTION

Figure 2A:
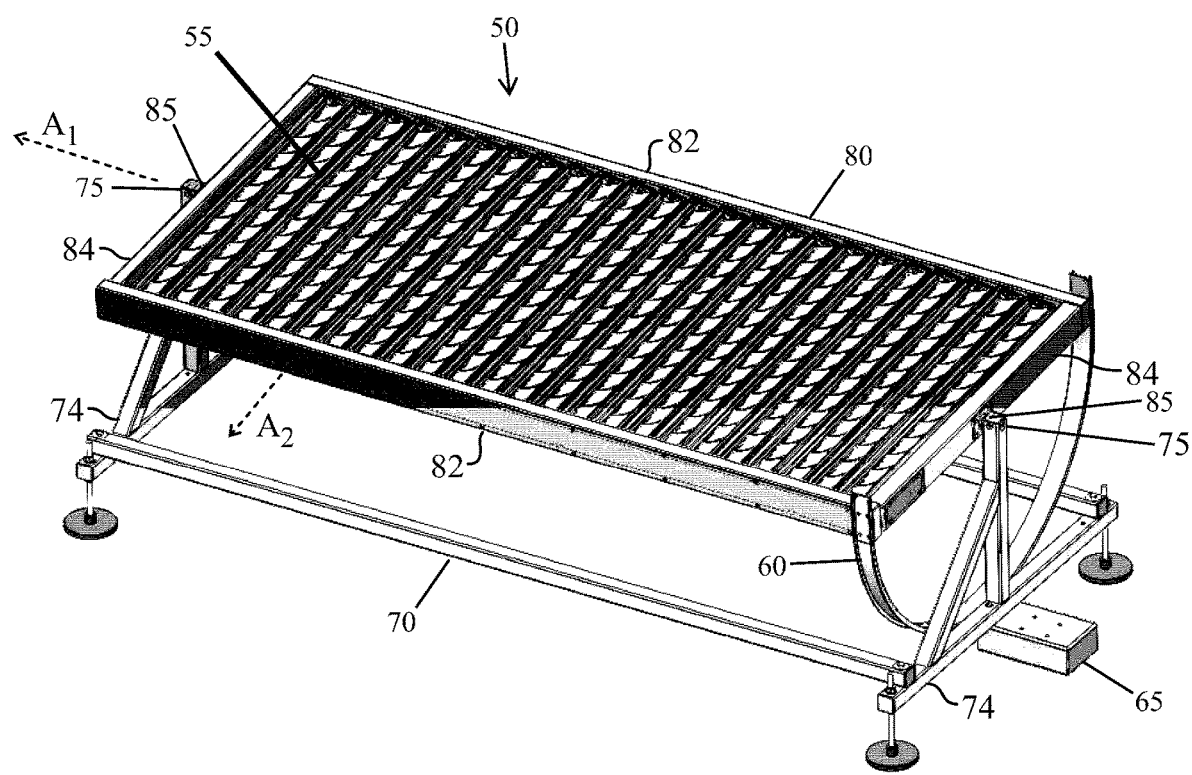
FIG. 2A depicts a perspective view of a solar concentrator system according to the present disclosure.

FIG. 2A depicts a solar concentrator system 50 according to the present disclosure for use on a surface to collect solar energy from the sun. The system 50 includes a base or stand 70, a first drive, a frame or module 80, and one or more solar collectors 55. The stand 70 is supportable on the surface (not shown), such as the ground, a rooftop, or the like. The stand 70 has first opposing ends 74, which include first rotational points 75. The module 80 has second opposing ends 84 with second rotational points 85. As assembled, the second rotational points 85 of the module 80 rotatably connect to the first rotational points 75 of the stand 70. In this way, the module 80 is balanced and rotatable on the first and second rotational points 75, 85 about a first axis $A_1$ of rotation.

To rotate the module 80, the system 50 uses the first drive and a hoop pulley 60. The first drive is disposed on the stand 70 and is operable to provide first rotation. The hoop pulley 60 disposed on the module 80 defines a curvature about the first axis $A_1$, and at least one first cable (not shown) connected between the hoop pulley 60 and the first drive is used for rotating the module 80 about the first axis $A_1$ in response to the first rotation of the first drive. Rotation of the module 80 about the first axis $A_1$ enables the planar face of the module 80 having one or more solar collectors 55 disposed thereon to collect solar energy of the sun as it traverses across the sky.

As shown in particular in FIG. 2A, the stand or base unit 70 with the first drive includes a daily actuator or drive motor 65 and daily rotational points 75 (axels, axel mounts, bearings, slots, etc.) affixed thereto. The frame 80 has the hoop pulley 60 affixed thereto for connection to the daily drive motor 65. The frame 80 is mounted with its rotational points 85 (axels, axel mounts, bearings, slots, etc.) on daily rotational points 75 of the stand 70 for rotation thereabout as noted above.

The module or frame 80 can have one or more solar collectors 55, such as a conventional solar panel having a number of photovoltaic cells (not shown) disposed on a planar surface (not shown) supported on the frame 80. Preferably, and as shown in FIG. 2A, the frame 80 has a plurality of solar collectors 55 arranged to articulate on the frame 80. For example, the solar collectors 55 are disposed in parallel to one another between the second opposing ends 84 of the frame 80.

The solar collectors 55 can have a number of features. For example, some suitable features for the solar collectors 55 can be found in US 2010/0108124, US 2012/0024374, and US 2012/0312351, each of which is incorporated herein by reference in its entirety. As discussed in more detail later with reference to FIGS. 3A-3C, each solar collector 55 can be a solar concentrator having reflective surfaces and photovoltaic cells. Additionally, each collector 55 can have either an axle or axle mount (not shown) at both ends wherein the axles or axle mounts forms a second axis $A_2$ of rotation along the longitudinal axis of collector 55. This second axis $A_2$ of rotation is carried by the first axis $A_1$ of rotation.

In one embodiment as shown, frame 80 is rectangular in shape, although other shapes can be used. A side 82 of frame 80 can be aligned to true north with the plane of the frame 80 rotatable east and west relative to the ground, a building rooftop, or other surface (not shown). In one embodiment, a side 82 of frame 80 is aligned to be parallel to the axis of rotation of the earth, and the solar collectors 55 can be perpendicular to the side 82 of frame 80. In one embodiment, the first axis $A_1$ of frame 80 is aligned with true north and is placed with the north end of the frame 80 elevated higher relative to the ground than the south end of the frame 80 (in the Northern hemisphere). In one embodiment, daily rotational points 75, 85 are aligned parallel to the rotational axis of the Earth.

Hoop pulley 60 is connected to the first drive having daily drive motor 65 by wire cable (not shown) affixed to hoop pulley 60. Daily drive motor 65 is operative to rotate and thereby move hoop pulley 60 to orient the frame 80.

In the case where daily rotational points 75, 85 are aligned parallel to the rotational axis of the Earth, for example, frame 80 must rotate on its axis $A_1$ every day to keep the frame 80 aligned to the sun as the day passes. In this instance, solar collectors 55 will move only slightly in tilt during a single day. Solar collectors 55 must change tilt angle about their axes $A_2$ as the seasons progress because the apparent position of the sun in the sky changes. Because of these characteristics, the first axis $A_1$ is referred to as the daily axis, and the second axis $A_2$ of solar collectors 55 is referred to as the seasonal axis, even in those cases in the present application where the axis $A_1$ of the frame 80 is not parallel to the axis of rotation of the Earth.

In one embodiment, the actuator 65 can be a daily drive motor, such a stepper motor that divides a full rotation into a number of equal steps. The stepper motor's position can then be commanded to move and hold at one of these steps without any feedback sensor (open loop) as long as the stepper motor 65 is carefully selected. As will be appreciated, other actuators and motors can be used.

FIG. 2A shows one system 50 on its own. A typical installation at a site will have a plurality of these systems 50 disposed adjacent one another in an array or a matrix to provide increased surface area for the collection of solar energy. Each of the various systems 50 can be mounted end-to-end and adjacent one another in as much as a packed manner as possible as long as consideration is given to possible overshadowing of the systems 50 with one another.

Figure 2B:
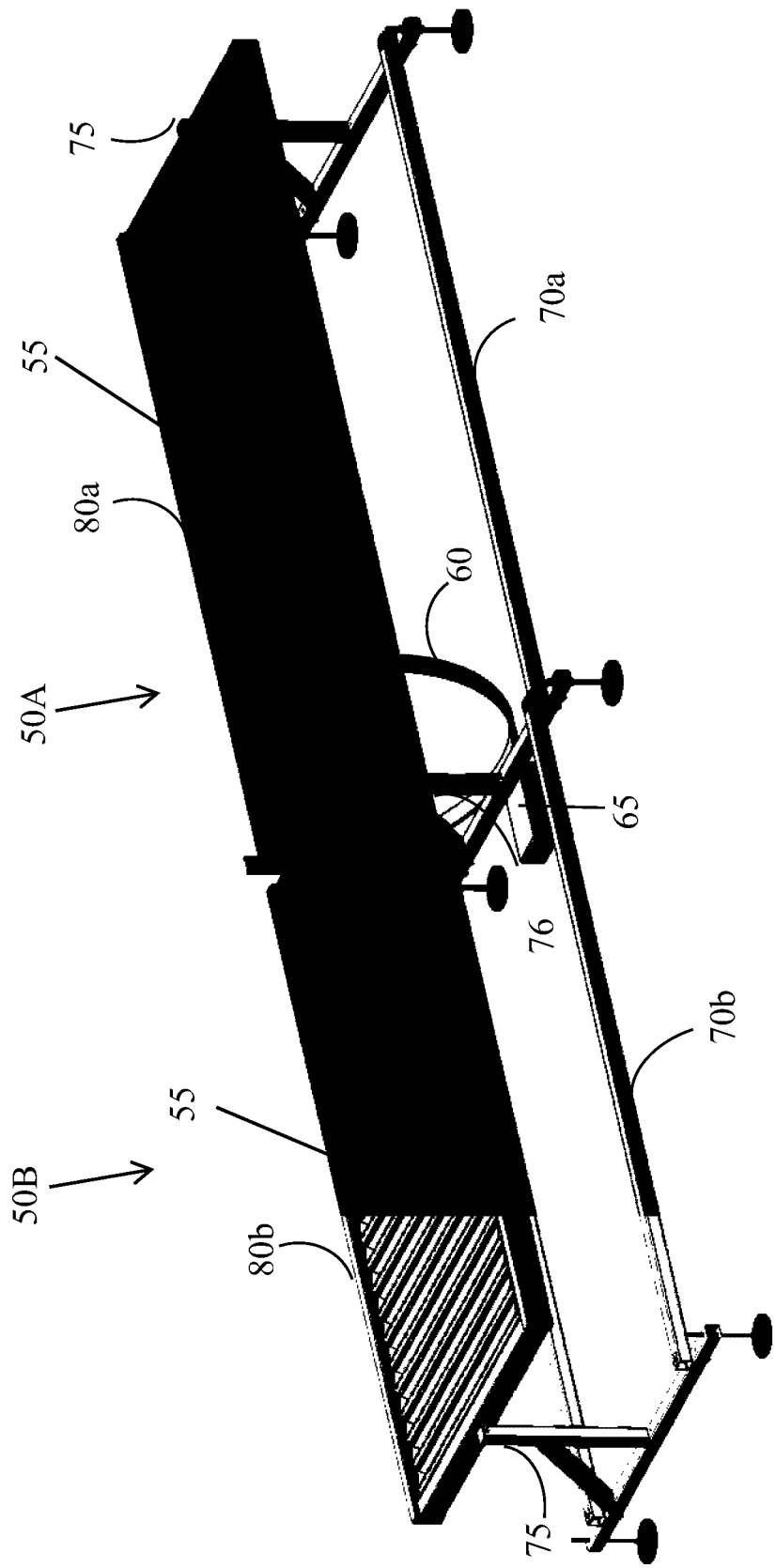
FIG. 2B depicts a perspective view of another configuration of the solar concentrator system.

Each of the systems 50 for such an installation can be self-contained as shown in FIG. 2A. However, several of the systems 50 can be integrated together so as to connect and/or operate together, which can simplify installation, maintenance, and operation. For example, FIG. 2B depicts two solar concentrator systems 50A-B of FIG. 2A integrated with one another. (Although only two systems 50A-B are connected in FIG. 2A, other installations may interconnect more than two systems 50 depending on the size, weight, and other factors involved.)

One of the systems 50A has the first drive with the daily drive motor 65, and the other system 50B relies on that daily drive motor 65. In this way, the one motor 65 can drive both frames 80a and 80b, resulting in an inherent cost reduction. The solar systems 50A-B as before include stands 70a and 70b, daily rotational points 75, and solar collectors 55. The systems 50A-B share the one daily drive motor 65, the hoop pulley 60, and a central upright 76. Stands 70a and 70b are connected so as to form a single supporting unit for solar concentrator system 51. Central upright 76 is affixed to stand 70a by clamps or welding. Hoop pulley 60 is affixed to frame 80a and is driven by daily drive motor 65. Frame 80a is rigidly connected by connectors, slates, plates, etc. (not shown) so that rotation of one frame 80a about daily rotational points 75, 85 induces the same motion of the other frame 80b. For example, the connector may comprise a plate attached to both frame 80a and frame 80b. Frames 80a and 80b each rotate about a central daily axle (not shown) affixed to central upright 76. Other considerations noted above with respect to the solar concentrator system 50 of FIG. 2A apply to each of these interconnected systems 50A-5B.

Figure 3A:
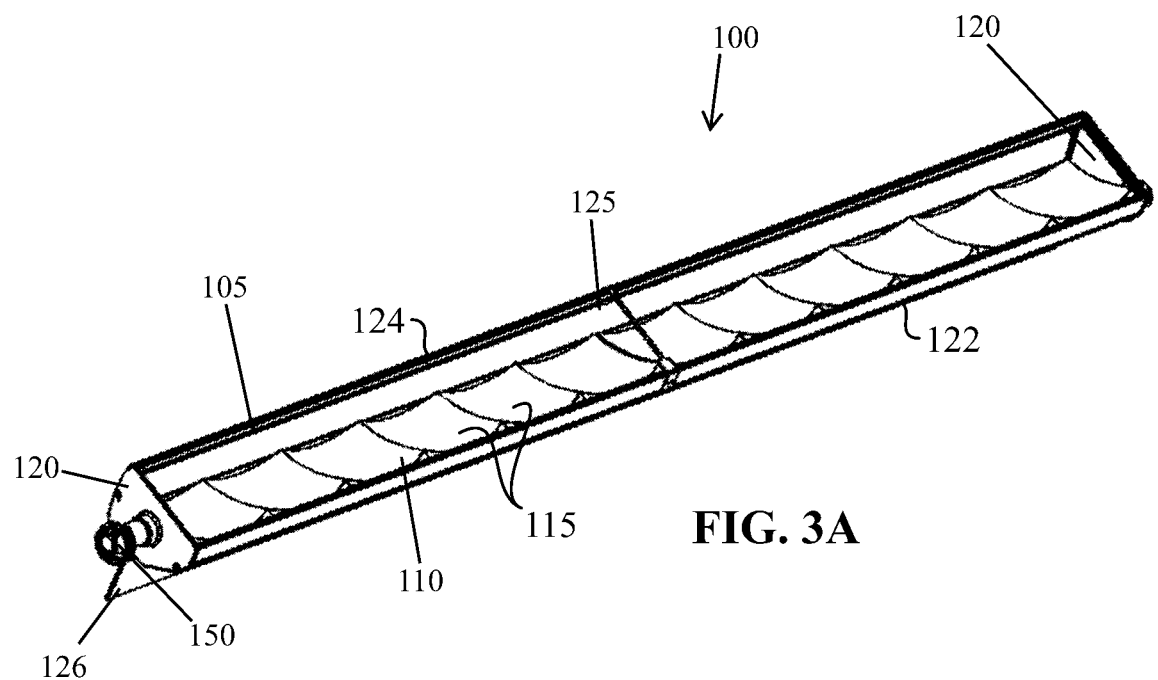
FIG. 3A depicts a perspective view of a solar concentrator module.

As noted above, each of the solar collectors 55 for the system 50 can be a solar concentrator. FIG. 3A depicts an overview of a solar concentrator 100 according to the present disclosure. The solar concentrator 100 includes at least one reflector 110 disposed on a first face 122 of the solar collector 100 and includes at least one photovoltaic cell 105 disposed on a second face 124 of the solar collector 100 angled adjacent the first face 124. The at least one photovoltaic cell or photovoltaic unit 105 is disposed at a focus of the at least one reflector 110 and converts solar energy reflected thereto into photovoltaic energy.

Figure 3B:
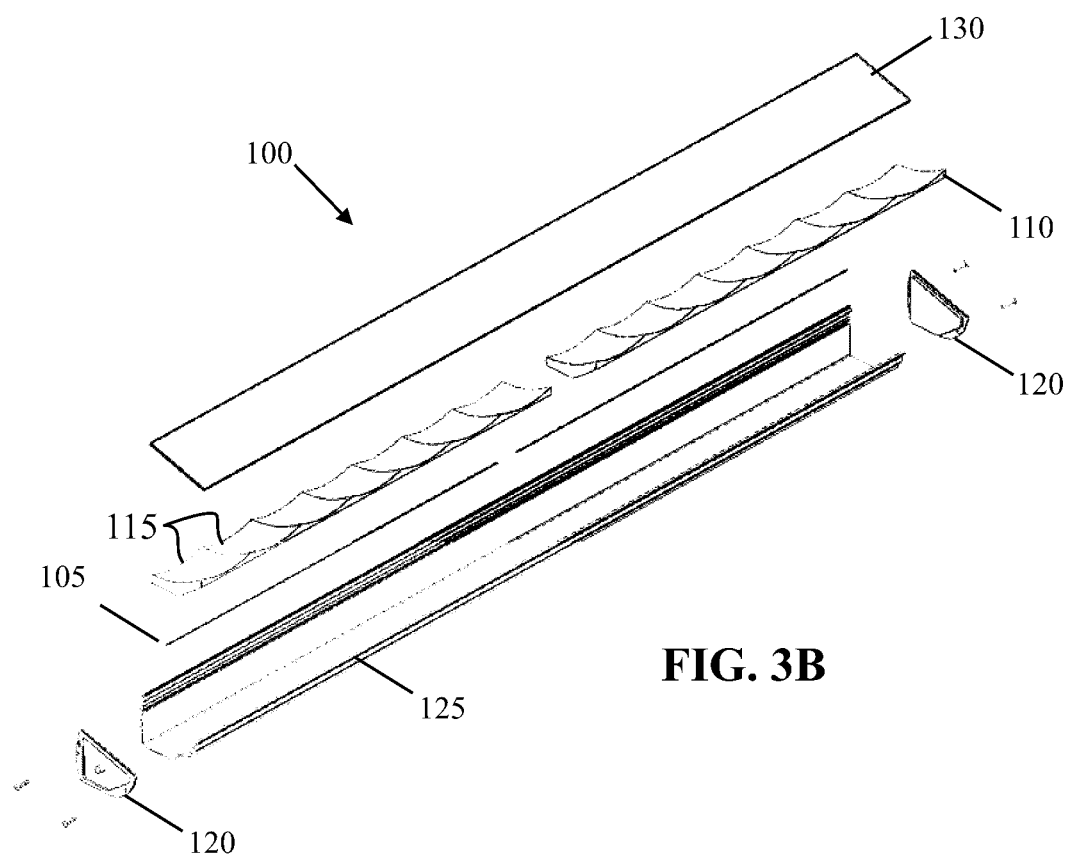
FIG. 3B depicts an expanded view of the components of the solar concentrator module.

As shown in particular in FIG. 3B, solar concentrator 100 has a tray or housing unit 125 with opposing ends 120 and with the adjacent first and second faces 124, 125 extending between the opposing ends 120. The adjacent first and second faces 124, 125 defines an open trough 123 of the tray or housing unit 125. The opposing ends 120 having third rotational points rotatably connect to the opposing sides of the frame (80), as noted in more detail later.

As shown, the at least one reflector 110 comprises a plurality of concave reflective surfaces or mirrors 110 disposed along a length of the housing unit 125. The at least one photovoltaic cell or photovoltaic unit 105 thereby includes a plurality of the photovoltaic cells each disposed relative to one of the concave reflective surfaces 110. Each of the concave reflective surfaces 110 comprises gain in two optic axes concentrating solar energy to the relative photovoltaic cell 105.

Figure 3C:
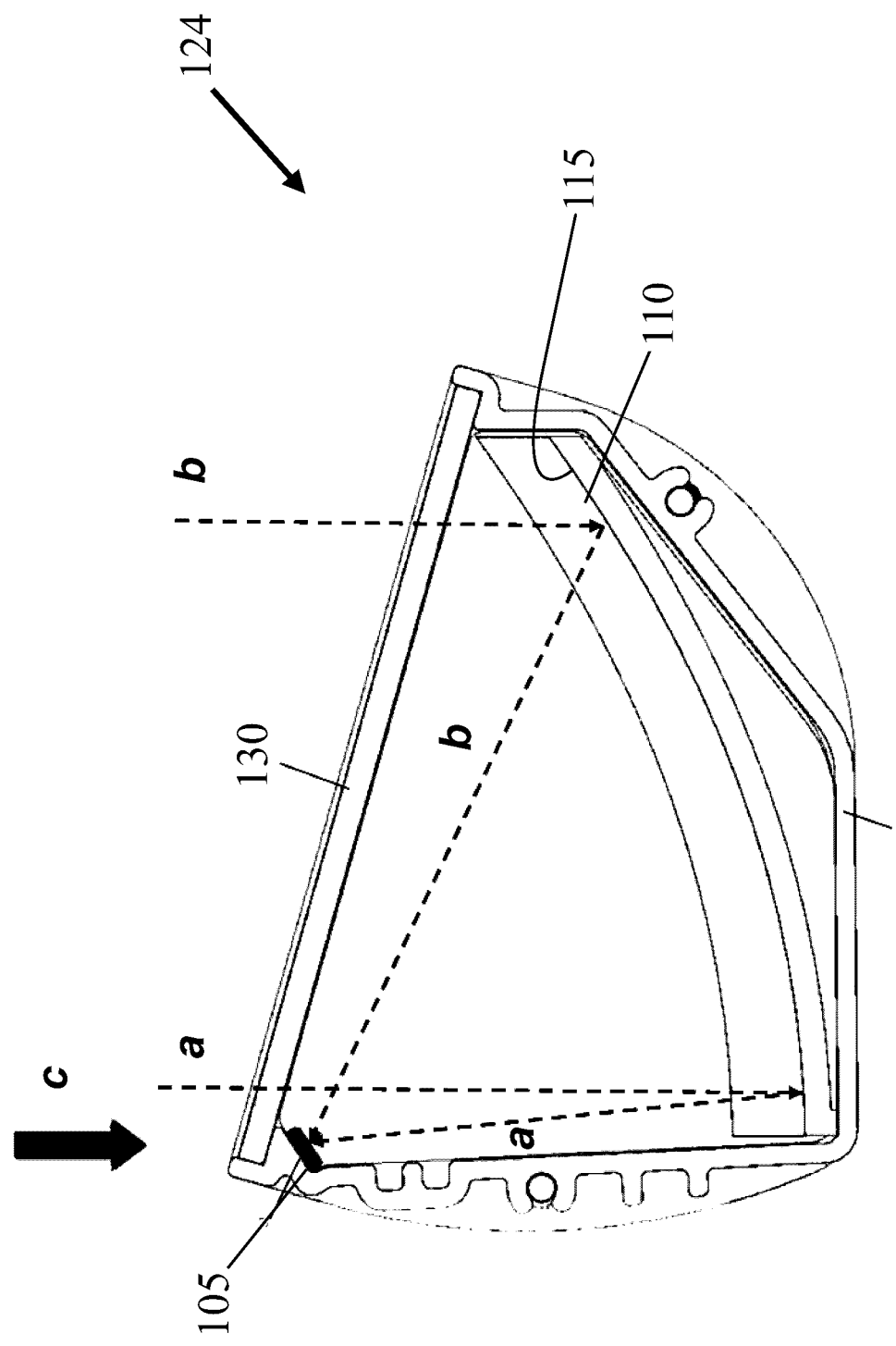
FIG. 3C depicts a ray trace of a reflective for the solar concentrator module.

As shown in particular in FIGS. 3A-3C, the housing unit 125 having the concave reflective surfaces 115 on the reflector 110 and having the photovoltaic unit 105. The housing unit 125 has end caps 120 at the opposing ends and has axle 150 as rotational points. Photovoltaic unit 105 is disposed so as to receive concentrated solar radiation (not shown) reflected by reflective surfaces 115 and to convert same into electrical energy. Reflective surfaces 115 may be spherical or aspherical mirrors. In one embodiment, reflective surfaces 115 are rotationally symmetrical.

FIG. 3B depicts an exploded diagram of solar concentrator 100 having cover glass 130, housing 125, end caps 120, a plurality of reflective surfaces 115, and photovoltaic unit 105. Cover glass 130 acts as a weather shield for the components of solar converter unit 100.

FIG. 3C depicts a cross-sectional view of the optical functions of solar concentrator 100. Solar rays a and b pass through cover glass 130 and are reflected by reflector surfaces 115 to photovoltaic unit 105 affixed to housing assembly 125 where the solar rays a and b are converted to electrical energy. Arrow c represents the optic axis of reflective surface 115.

The reflective surfaces 115 can have a number of shapes, and each of the reflective surfaces 115 can have the same or different shape from one another depending on the advantages. In one embodiment, for example, each of the reflective surfaces 115 is a parabolic mirror with gain in two axes. Alternatively, reflective surfaces 115 can each be a parabolic mirror with rotational symmetry or a parabolic mirror with rotational symmetry where at least one aspheric constant is not equal to zero.

In one embodiment, the surface formula for the reflective surface 115 is given by:

$$y(x)=x^2 \div (R(1+\sqrt{(1-(1+K)x^2 \div R^2)}))+\alpha_1 r^2+\alpha_2 r^4$$

K (conic constant)=−0.986
R (radius)=75.7
$\alpha_1$ (aspheric constant)=1.084×10$^{-4}$
$\alpha_2$ (aspheric constant)=1.129×10$^{-10}$
Focal length=37.30

The advantage of the use of aspheric constants in the design of reflective surface 115 is that they can be used to make the spot of light more uniform, which increases the harvesting efficiency of the solar concentrator units and prevents damage resulting from high intensity spikes within the spot of light.

Figure 4A:
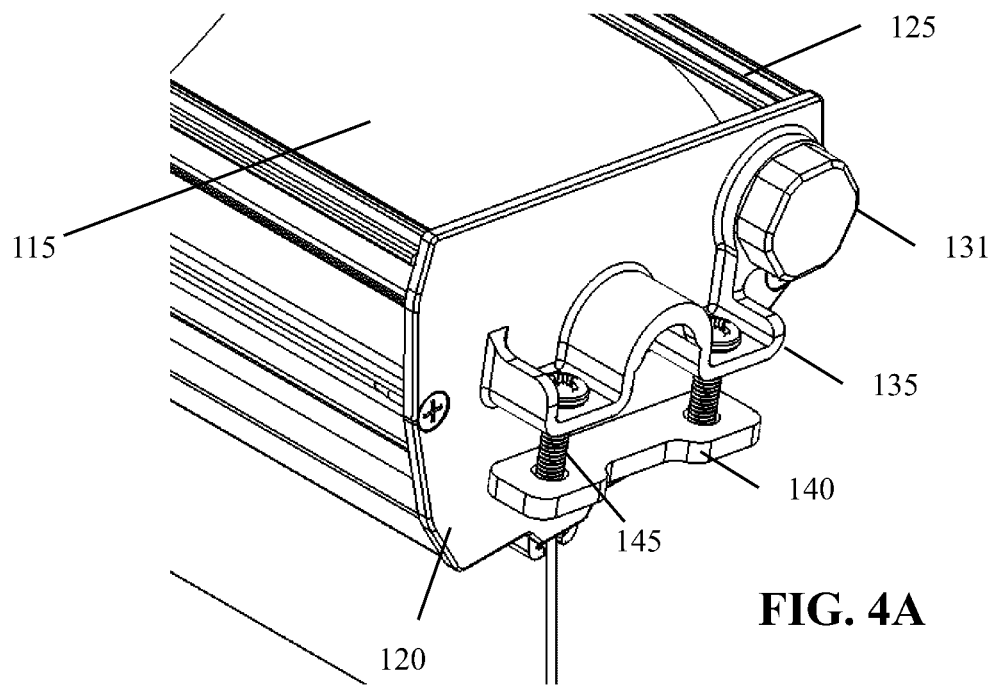
FIG. 4A depicts a drive (clamp) mount end of the solar concentrator module.

FIG. 4A depicts a first end of solar concentrator 100 (not shown) comprising housing 125, reflective surfaces 115, end cap 120, clamp 135, flange 140, screws 145 and pressure relief cap 131. Clamp 135, flange 140 and screws 145 are used for attaching the depicted end of solar concentrator 100 (not shown) to pulley axle 183 (not shown). Pulley axle 183 (not shown) is inserted between clamp 135 and flange 140, and screws 145 are then tightened by a screw driver or similar instrument (not shown) to form a tight bond around pulley axle 183.

Figure 4B:
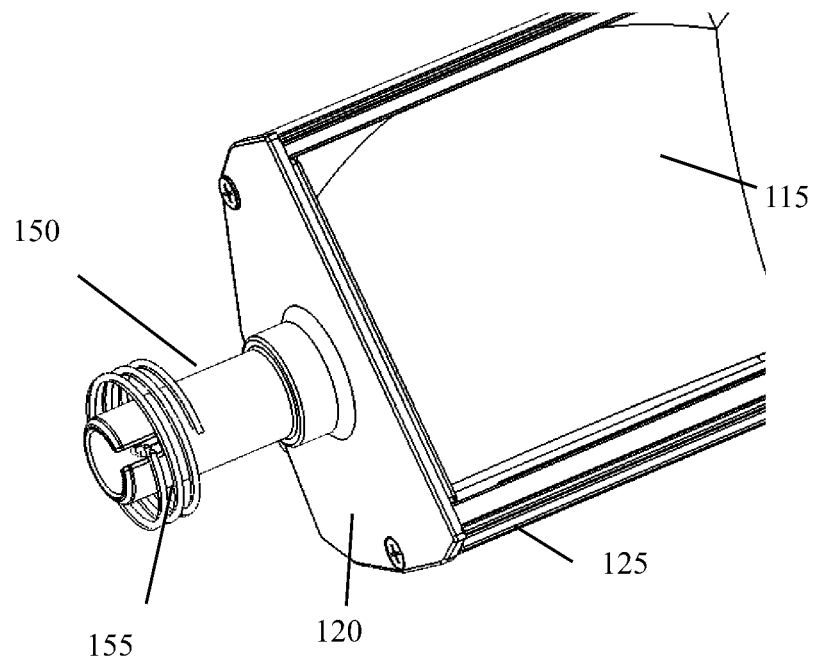
FIG. 4B depicts an electrical connector (axle) end of the solar concentrator module.

FIG. 4B depicts a second end of solar concentrator 100 (not shown) comprising housing unit 125, reflective surfaces 115, end cap 120, hollow axle 150, and wiring 155 routed through hollow axle 150. Axle 150 is inserted into bearing mount 184 (not shown). All electrical connections to photovoltaic cells (not shown) that form a part of solar concentrator modulation 100 are made through wiring 155. In one embodiment, wiring 155 is a wiring material capable of withstand repeated flexing.

Figure 4C:
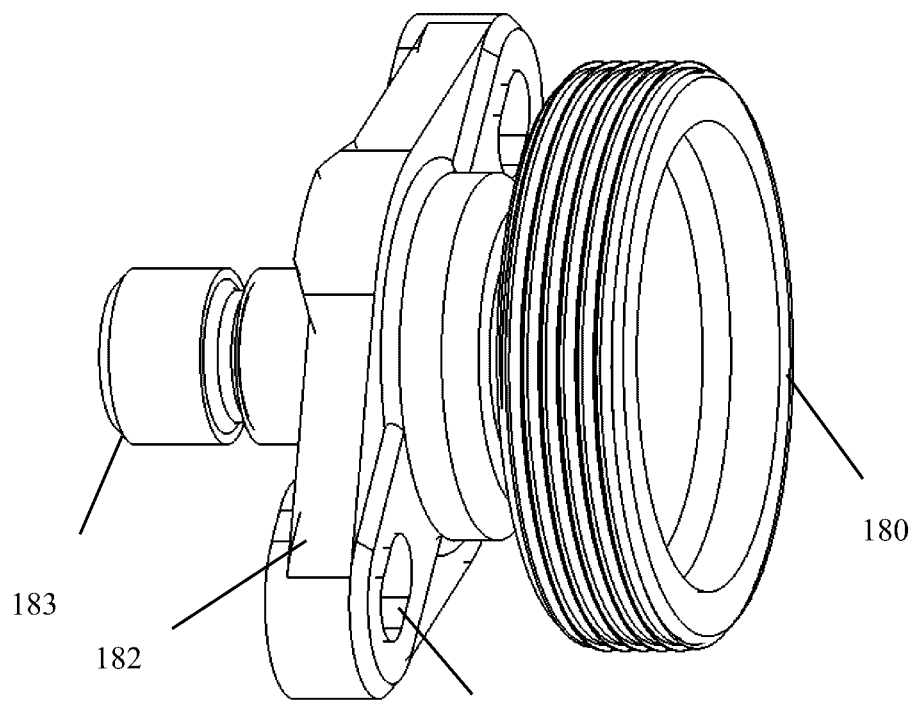
FIG. 4C depicts a pulley, a bearing housing, and axle combination compatible with the drive mount end of the solar concentrator module.

FIG. 4C depicts a pulley 180/pulley axle 183 combination mounted onto bearing mount assembly 182. Bearing mount assembly 182 is affixed to frame (80) by mounting hardware (not shown), such as a bolt, nut, and washer combination inserted through mounting hole 181.

Figure 4D:
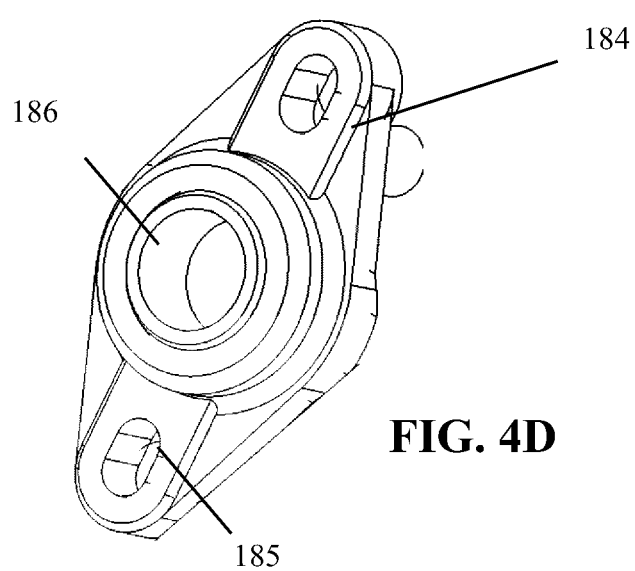
FIG. 4D depicts a bearing housing assembly compatible with the axle end of the solar concentrator module.

FIG. 4D depicts bearing mount assembly 184. Hollow axle 150 mounts into bearing mount assembly 184 through aperture 186. In one embodiment, the bearing mount assemblies 182 and 184 are fabricated to identical specifications. Bearing assembly 184 may be fabricated by inserting a commonplace ball bearing with inner and outer races into a housing. Fixing of the bearing in the housing may be as simple as first lowering the temperature of the bearing in a refrigerator before inserting the bearing into the cavity in the housing. When the bearing returns to normal temperature, it will fit snuggly into the cavity. In one embodiment, the bearings on the pulley side are metal and the bearings on the axle end are plastic. In one embodiment, the pulley bearings on the solar concentrator module closest to the driver pulley are metal and the pulley bearings on the end opposite the driver pulley are metal whereas all other pulley bearings are plastic. Bearing mount assembly 184 may be affixed to frame (80) by mounting hardware (not shown), such as a bolt, nut, and washer combination inserted through mounting hole 185.

Figure 5A:
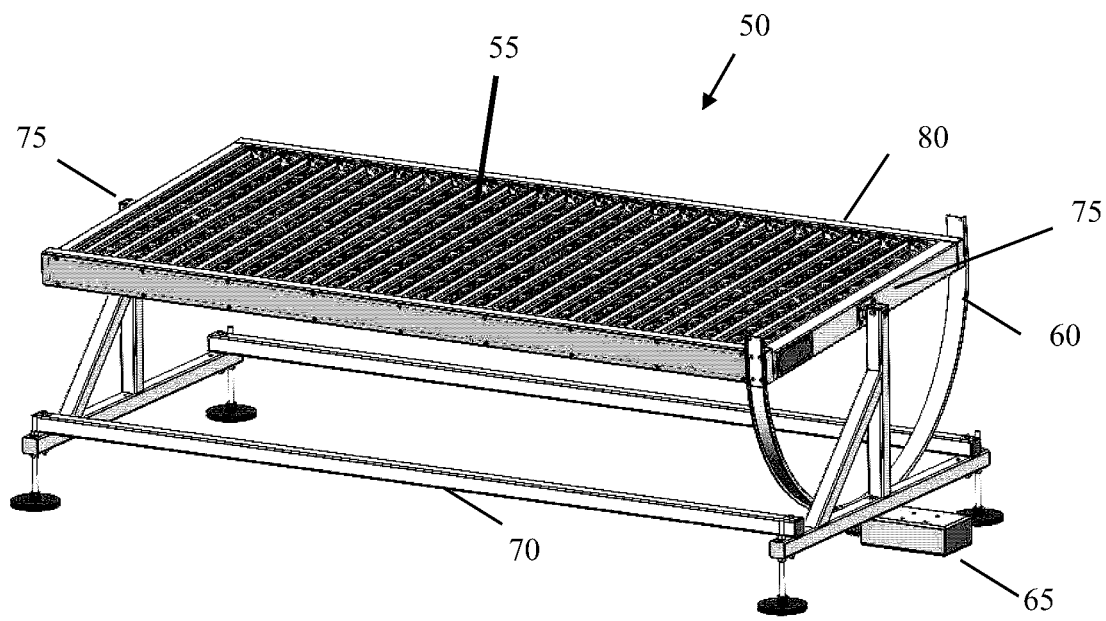
FIGS. 5A-5B depicts other perspective views of the disclose system.

FIG. 5A depicts the solar concentrator system 50 again showing base unit or stand 70 with drive motor 65 and rotational points 75 affixed thereto, and showing frame 80 with concentrators 55 and hoop pulley 60 affixed thereto, the frame 80 being mounted on rotational points 75. As noted, each concentrator 55 comprises either an axle or axle mount (not shown) at both ends wherein the axles or axle mounts forms a point of rotation along the longitudinal axis of concentrator module 55. In one embodiment, the long side of frame 80 is aligned with true north with the plane of the frame parallel to the ground or a building rooftop (not shown). In one embodiment, the long side of frame 80 is aligned to be parallel to the axis of rotation of the earth. In one embodiment in the Northern hemisphere, the long axis of frame 80 is aligned with true north and is placed with the north end of the frame elevated higher relative to the ground than the south end of the frame. Hoop pulley 60 is connected to drive motor 65 by wire cable 90 affixed to hoop pulley 60 (not shown). Drive motor 65 is operative to rotate and thereby move hoop pulley 60.

Drive motor 65 can be used to drive rotational points 75 directly. Although this may be possible, it is preferred that the pulley arrangement disclosed herein is used to provide the mechanical advantage offered by the pulley arrangement herein presented.

It is envisioned that the optic axis (c of FIG. 3C) of each reflective surface (115 of FIG. 3C) of each solar concentrator (124 of FIG. 3C) on every solar concentrator module 55 is substantially parallel to the optic axis (c of FIG. 3C) of each concentrator reflective surface (115 of FIG. 3C) of every other solar concentrator (124 of FIG. 3C) of every other solar concentrator module 55 of the system 50. In a properly designed system according to the present disclosure, this condition will be met whether operation is dynamic (rotating) or static.

Figure 5B:
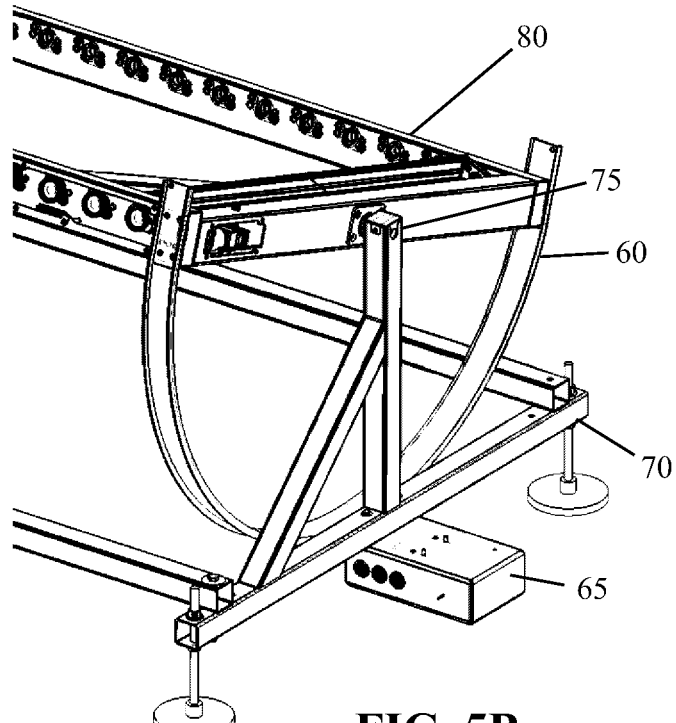

FIGS. 5B and 5C depicts end views of solar concentrator system 50 showing the frame 80, rotational points 75, base unit 70, drive motor 65 and hoop pulley 60. Hoop pulley 60 is affixed to frame 80 such that drive motor rotates frame 80 on rotational points 75 by one or more wire cables (not shown). Drive pulley 67 is affixed to driver motor 65. Together frame 80, rotational points 75, 85, drive motor 65, and hoop pulley 60 constitute a daily drive system operative to rotate frame 80 about rotational points 75, 85 in response to commands from a control system (not shown).

FIG. 5D depicts an arrangement of the rotations points 75, 85 between the stand 70 and frame 80. The first rotational point 75 of the stand 70 includes slots 575 defined in a central post 71 of the stand 70. The second rotational point 85 of the frame 80 includes a bearing assembly 587 disposed on the frame's end 84 and includes an axel 585 extending from the bearing assembly 587. For assembly, the axle 585 fits into the open slot 575, and an end cap 573 can affix on the post 71. Each side of the post 71 may have slots 575 so the system can readily support the axels 585 of two adjoining frames 80 in the combined configuration noted in FIG. 2B.

FIG. 5E depicts one way the one or more wire cables 90A-B can connect to a drive pulley 67 for the hoop pulley 60, such as in FIG. 5C. Here, the drive pulley 67 includes a pulley body 567 having two segments of cable 90A-B wrapped in opposing directions about the outer circumference. One cable 90A affixes with a fixture 92 at one end of the body 567 and wraps counter clockwise around the circumference from the outer edge toward the center. Another cable 90B affixes with a fixture 92 at the opposite end of the body 567 and wraps clockwise around the circumference from the outer edge toward the center. As the pulley body 567 rotates counter-clockwise, the one segment 90A pays out, while the other segment 90B winds up. As the pulley body 567 rotates clockwise, the one segment 90A winds up, while the other segment 90B pays out. As an alternative to the two cable segments 90A-B, one continuous cable can be used with portion of the cable wrapped around the drive pulley 567. A portion of the continuous cable can be affixed to the pulley 567 in a number of ways.

Figure 1:
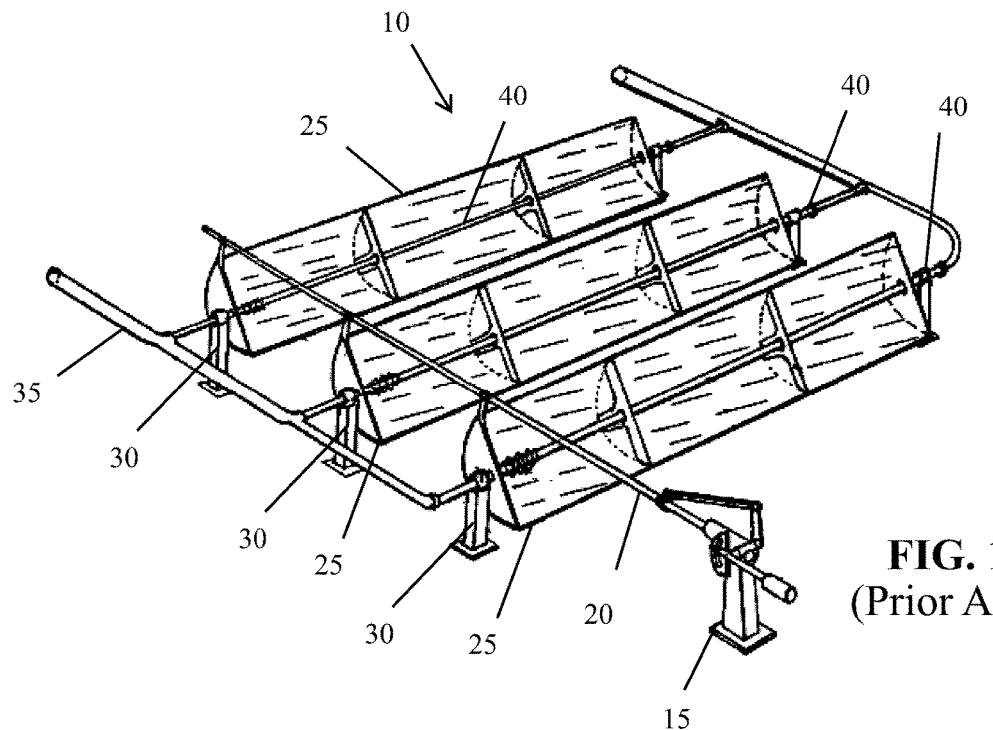
FIG. 1 is a prior art implementation of a system to keep a plurality of concentrator modules pointed at the same angle relative to a frame.
Figures 1, 6A:
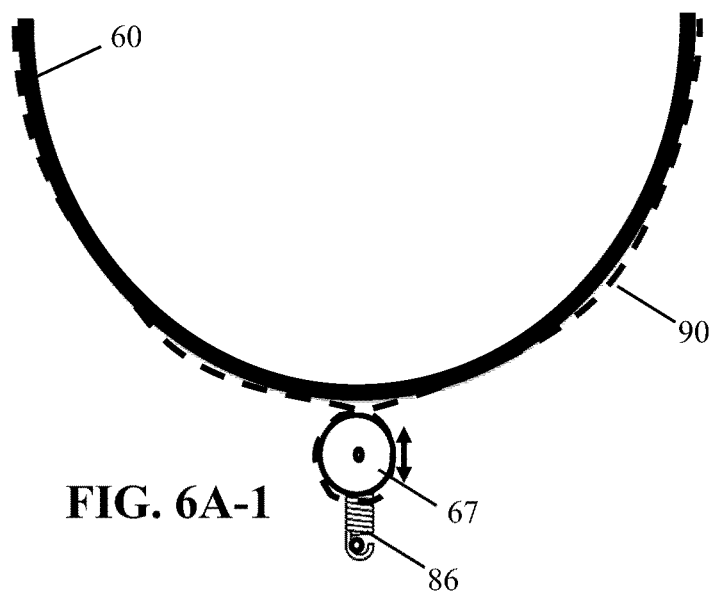
Figures 2, 6A:
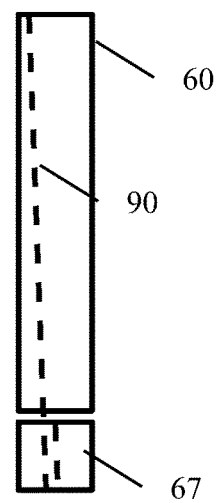

The drive pulley 67, the wire cable 90, and the hoop pulley 60 can have a number of configurations and can use a number of tensioning arrangements. For example, FIGS. 6A-1 and 6A-2 depict one arrangement of wire cable 90 on hoop pulley 60. Wire cable 90 is affixed to the two ends of hoop pulley 60 by a fastener, such as a clamp or a screw (not shown). Wire cable 90 is deployed along the circumference of hoop pulley 60 and is wrapped around driver pulley 67. In one embodiment, driver pulley 67 is a helical grooved pulley. Tensioning spring 86 keeps wire cable 90 taut by applying tension on driver pulley 67. Driver pulley 67 is affixed to drive motor 65 (not shown). Wire cable 90 is affixed to both ends of hoop pulley 60 by a fastener, such as a screw or clamp (not shown). Hoop pulley 60 has substantial breadth. One end of wire cable 90 is affixed to a first edge of hoop pulley 60 that is closes to the interior of frame 80 and the other end is affixed to the edge of hoop pulley 60 that is opposite the first edge of hoop pulley 60. Drive pulley 67 is configured with helical grooves deployed such that as wire cable 90 is driven by driver pulley 67 the position of wire cable 90 on drive pulley 67 remains in a line with the position of wire cable 90 on hoop pulley 60.

Figure 6B:
FIG. 6B depicts a second configuration for tensioning the hoop pulley drive system using a tensioning pulley mounting outside the drive path of the hoop pulley drive system.

FIG. 6B depicts an alternate way for tensioning wire cable 90. Wire cable 90 is affixed to hoop pulley 60 by a fastener, as previously stated. Wire cable 90 is routed to driver pulley 67 which is affixed to drive motor 65 (not shown). Wire cable 90 is wrapped about drive pulley 67 at least once in the direction of each end of wire cable 90 and then is further routed to tensioner pulley 87. In one embodiment, wire cable 90 is only wrapped about tensioner pulley 87 by a half turn. Tensioner spring 86 hold wire cable 90 taut by pulling on tensioner pulley 87.

Figure 6C:
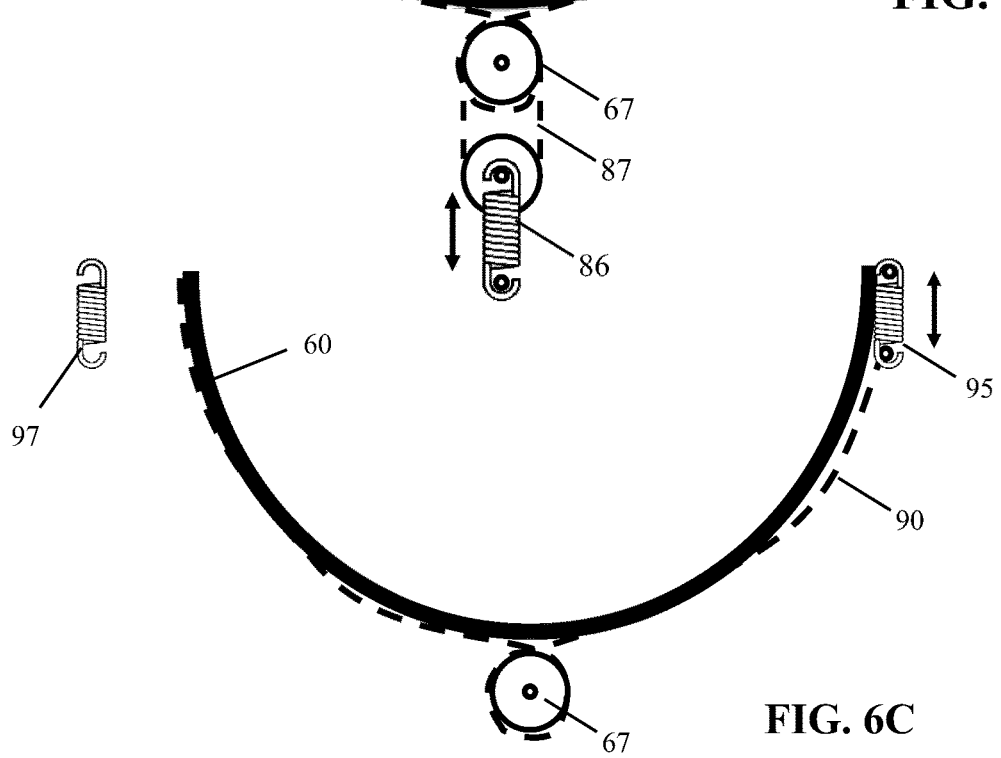
FIG. 6C depicts a third configuration for tensioning the hoop pulley drive system using an extension spring mounted at the end of the hoop.

FIG. 6C depicts yet another alternate way for tensioning wire cable 90. Wire cable 90, driver pulley 67, and hoop pulley are deployed as in previous examples. Wire able 90 is affixed to one end of tensioning spring 95 and the other end of tensioning spring 95 is affixed to hoop pulley 60. Optionally a second tensioning spring 97 may be deployed by affixing the remaining end of wire cable 90 to one end of tensioning spring 97 and the other end of tensioning spring 97 is affixed to the remaining end of hoop pulley 60.

Figure 6D:
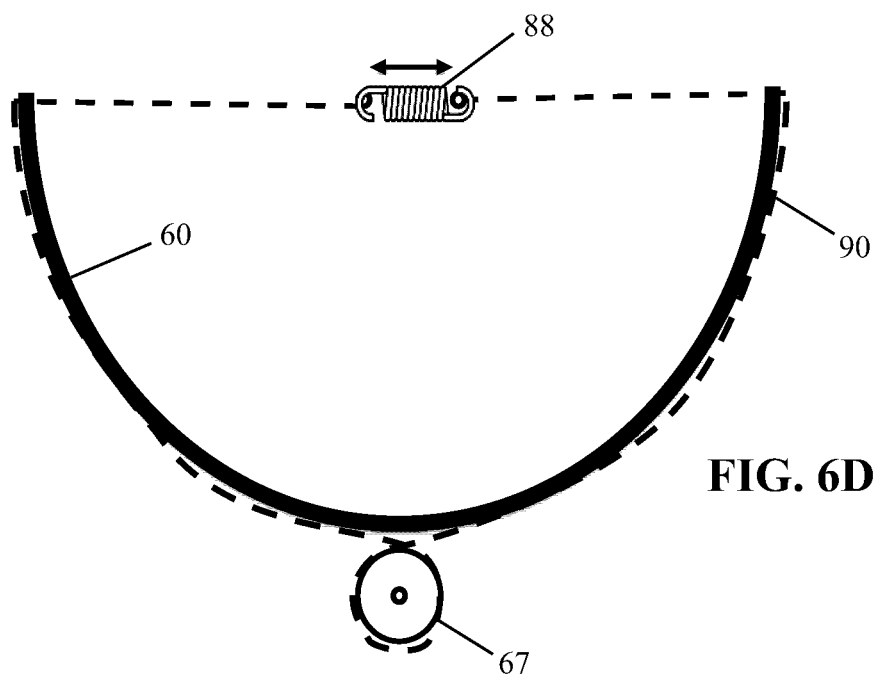
FIG. 6D depicts a fourth configuration for tensioning the hoop pulley drive system using an in-line extension spring positioned between the two ends of the hoop.

FIG. 6D depicts another alternate way for tensioning wire cable 90. Wire cable 90 is double wrapped on drive pulley 67. Wire cable 90 is deployed along hoop pulley 60 and then extended beyond hoop pulley to tensioning spring 88. A first end of wire cable 90 is affixed to a first end of tensioning spring 88 and the remaining end of wire cable op is affixed to the remaining end of tensioning spring 88. In one embodiment, wire cable 90 is affixed at one end of hoop pulley 60 by a fastener, such as a screw or clamp (not shown).

Figure 6E:
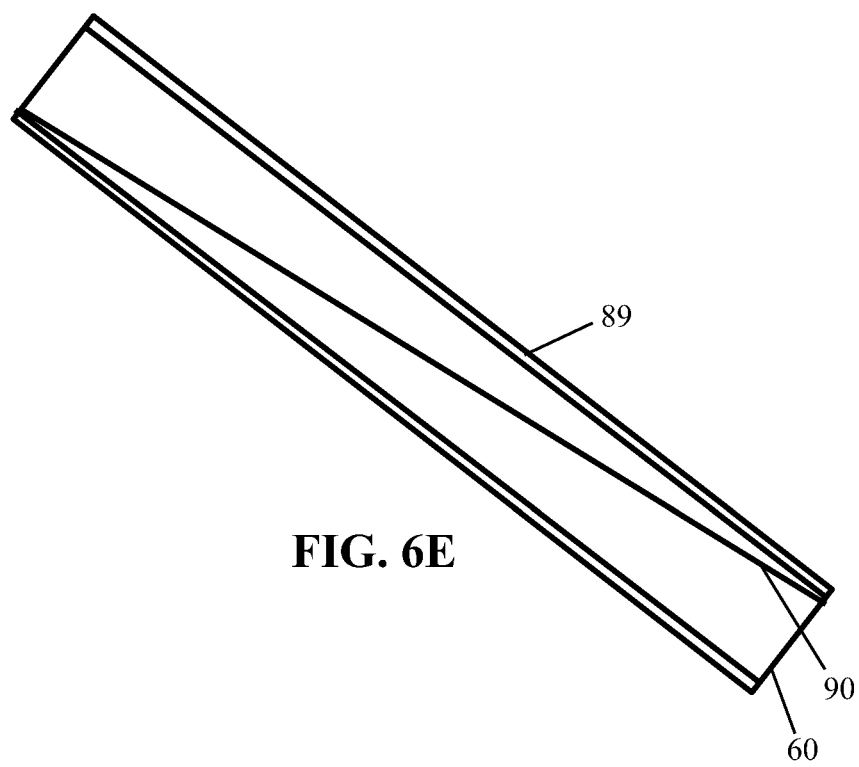
FIG. 6E depicts a method of mounting a wire cable to a hoop pulley.
Figure 6F:
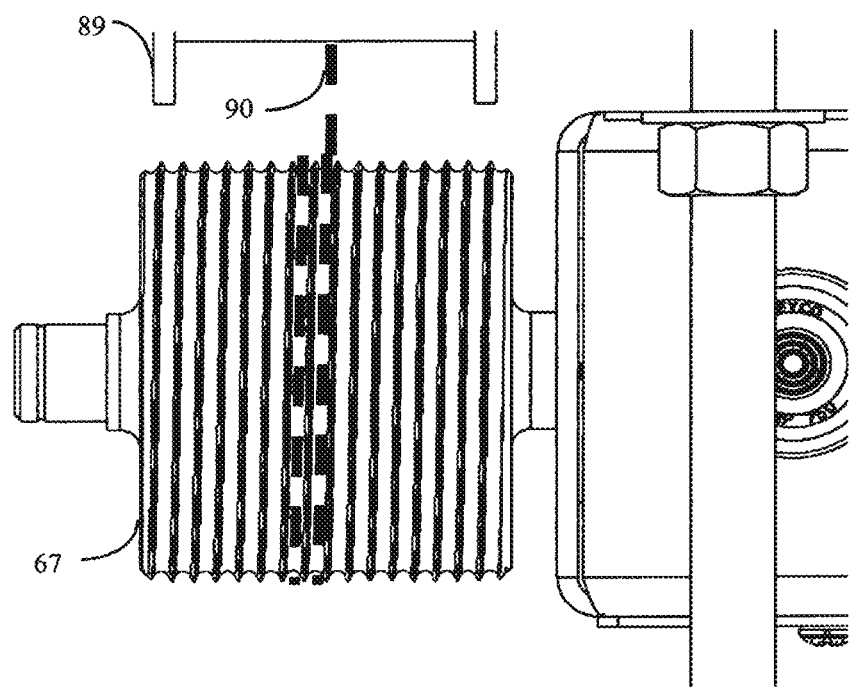
FIG. 6F depicts a driver pulley configured for a hoop pulley system.

FIGS. 6E and 6F depict additional details of the arrangement of wire cable 90, hoop pulley 60, and drive pulley 67. In particular, FIG. 6E further illustrates the point of attachment for wire cable 90 to hoop pulley 60. Flange 89 is provided to insure that wire cable 90 stays routed around the circumference of hoop pulley in the even wire cable 90 is momentarily slack. For its part, FIG. 6F depicts the helical groove structure of drive pulley 67, as well as one way of wrapping a continuous wire cable 90 thereon, as opposed to the arrangement of FIG. 5E.

Figure 7A:
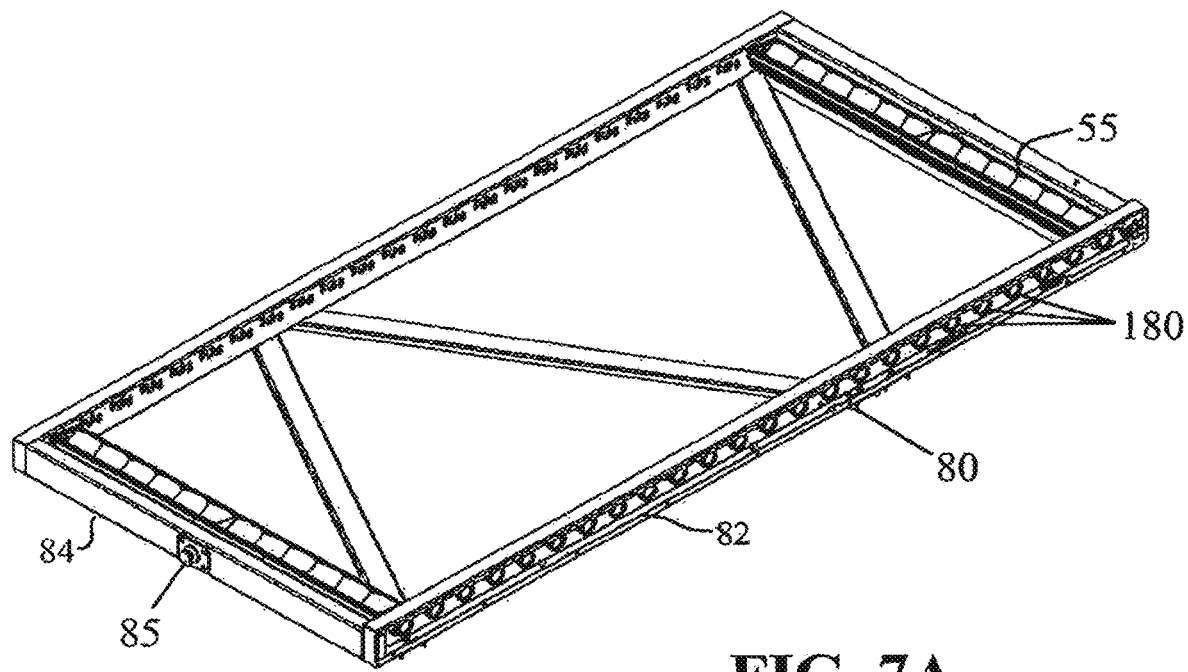
FIG. 7A depicts a perspective view of a frame of the disclosed solar concentrator system.
Figure 7B:
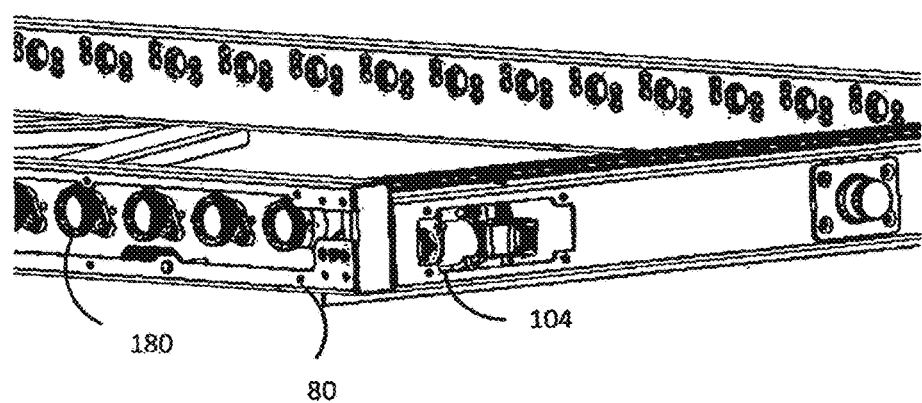
FIG. 7B depicts a perspective view of a partially assembled frame of the disclosed solar concentrator system.

As alluded to above with reference to FIG. 2A, the module 80 of the system 50 is a frame rotatably mounted on the stand 70. FIGS. 7A and 7B depict frame 80 and rotational points 85. Again, the frame 80 has second opposing ends 84 and has opposing sides 82. Several of the solar collectors 55 are not shown so the structure of the frame 80 can be more clearly seen. However, as noted, the solar collectors 55 are rotatable along second parallel axes between the opposing sides 82.

A plurality of pulleys 180 are disposed along at least one of the opposing sides 82 and are connected to the second axes $A_2$ of the solar collectors (55). A second drive 104 disposed on the frame 80 is operable to provide second rotation, and at least one second cable (not shown) connected between the second drive 104 and the pulleys 180 rotates the solar collectors (55) in tandem about the second axes $A_2$ in response to the second rotation.

In particular as shown, a series of driven pulleys 180 mounted along the side of frame 80 are depicted. Seasonal drive motor 104 is affixed to frame 80 in at a position where a driver pulley (not shown) may be positioned in line with driven pulleys 180.

Figure 7C:
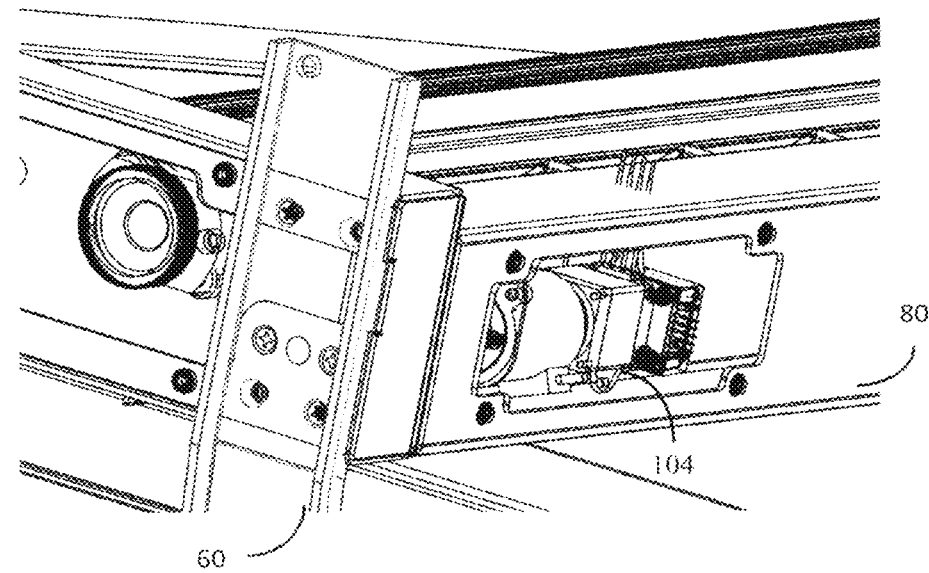
FIG. 7C depicts a seasonal driver motor affixed to the frame of the system.

FIG. 7C depicts frame 80 and hoop pulley 60 and the location of driver motor 104. Driver motor 104 is connected to a driver pulley (not shown) which serves to drive the series of driven pulleys (180) which in turn rotate concentrators (55). Driver motor 104 is referred to as the seasonal driver motor because it drives the concentrator modules (55) on their seasonal axes $A_2$.

In one embodiment, driver motor 104 is a stepper motor that enables the motor to be driven to a known position. A stepper motor divides a full rotation into a number of equally spaced steps. A commonly used number of steps is 200, so that each full step corresponds to 1.8°. A stepper motor may then be driven to a precisely known shaft position based on the number of pulses it is driven by. Such motors are well known in the art. A properly designed stepper motor control system comprising controller hardware and firmware may drive the stepper motor from a first known position corresponding to a first angle to a second known position corresponding to a second angle. This enables coordination based on angles in degrees or in other units of angular measurement such as radians, mils, grad, or arbitrary units. As an alternative to using a stepper motor alone, the drive may use an angular positioning system based on a motor, a circular or shaft encoder, and a motor control system having hardware and firmware operative to read the circular encoder and drive the motor from a first position corresponding to a first angle to a second known position corresponding to a second angle. A motor for such implementations may be a brushless DC motor, a brushless AC motor, a brushed DC motor, or other motors known in the art. An angular position drive system for such an arrangement would include a motor, a motor controller and control hardware and firmware operative to move the optic axis of the solar concentrator (55) from a first angle to a second angle. In the present disclosure, all references to firmware are understood to include both firmware and software as both are machine executable code.

As will be appreciated, separate drives, such as a single stepper motor, can drive each individual concentrator module (55) directly. This requires coordinated control, increased complexity, more weight and hardware, etc. For this reason, driving a large number of concentrator modules (55) with one drive is preferred using the cable and pulley arrangement disclosed herein.

Figure 7D:
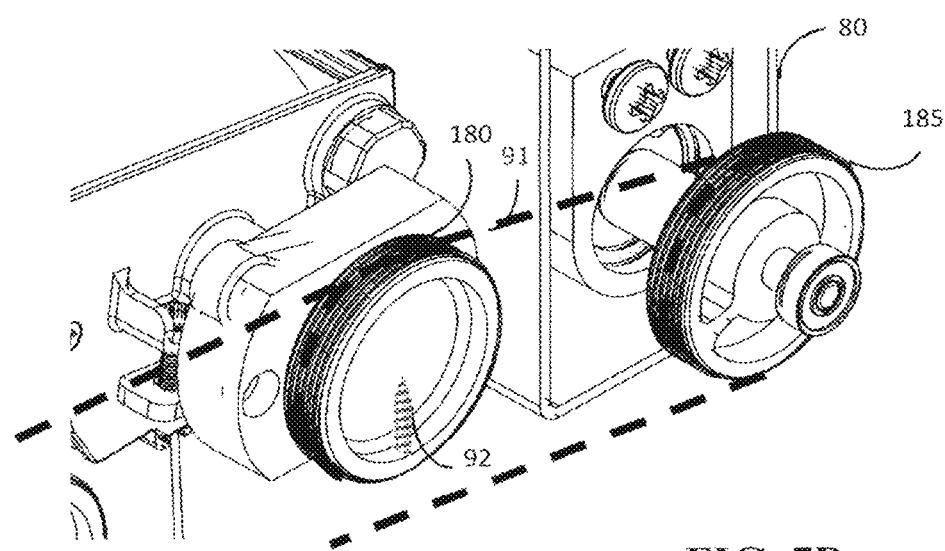
FIG. 7D depicts two driven pulleys and a driver pulley without wire cable.

FIG. 7D depicts a section of frame 80 located adjacent to hoop pulley 60. Driver pulley 185 is connected to driver motor (104). Driven pulleys 180 are driven by driver pulley 185 through a wire cable 91 that connects them together. Fastener 92 in this case is a screw operative to clamp wire cable 91 to driven pulley 180.

Figure 7E:
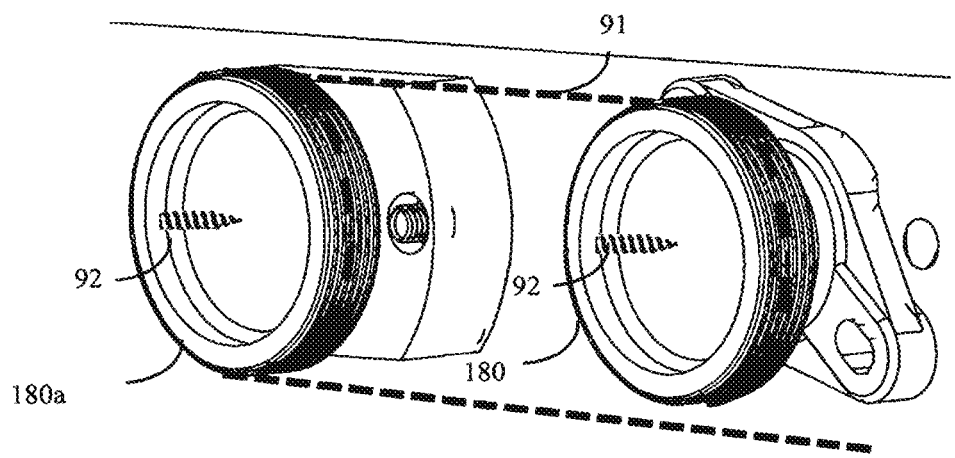
FIGS. 7E-7F depict a pulley wherein a wire cable is held in place on the pulley by a clamp having a pan head screw.

FIG. 7E depicts driven pulleys 180 and 180a connected by wire cable 91. Wire cable 91 is wrapped once around all driven pulleys 180 and wrapped 1½ times around driven pulley 180a which is the last of the driven pulleys. Drive pulley 180a is the last driven pulley at the opposite end to driver pulley (185). Fastener 92 is used on driven pulley 180 to secure the position of wire cable 91. A fastener is not used on driven pulley 190a because it has been demonstrated not to afford a sufficient rotation. Increasing the number of turns of wire cable 91 about driven pulley 180a to 2½ turns would overcome this limitation and allow the use of fastener 92 on driven pulley 180a. Driver pulley 180 and driven pulley 180a are identical in all manufacturing respects.

Figure 7F:
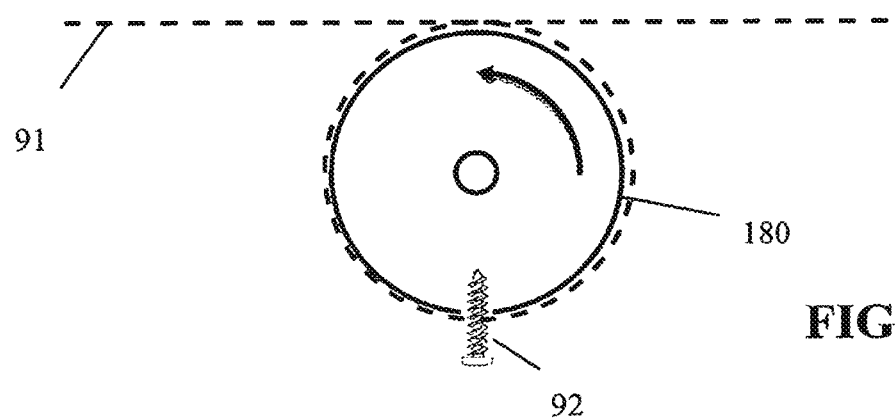

FIG. 7F depicts a single driven pulley 180 wherein wire cable 91 is anchored to driven pulley 180 by fastener 92. Wire cable 91 (represented by a dashed line) is wrapped once around driven pulley 180. A concentrator module 55 (not shown) is attached to each driven pulley 180. Each driven pulley 180 with concentrator module (55) affixed thereto may rotate slightly less than 180° in each direction from the point where fastener 92 is directly opposite the point where wire cable 91 first touches driven pulley 180 in each direction.

FIG. 7G depicts an alternate way of moving a wire cable 91 according to the present disclosure. Linear actuator 350 comprises a linear stepper motor attached at two points to cable 91. Driven pulleys 181a-e are operative to rotate solar concentrators (55). Idler pulley 351 serves to pull the return line for cable 91 away from driven pulleys 181a-e. Linear actuator 350 is ideally affixed to the same frame that all the pulleys 181a-e are attached to, although the disclosed arrangement will operate correctly provided the position of linear actuator 350 relative to all of the pulleys regardless of the point of attachment. In one embodiment, idler pulley 351 serves as part of a tensioning system designed to keep cable 91 taut.

FIG. 7H presents more detail of linear actuator 350. Linear actuator 350 comprises motor 352, shaft 354, and anti-rotational sleeve 353 attached to motor 352. Anti-rotational sleeve 353 is operative to prevent shaft 354 from rotating while moving. This is advantageous because twisting cable 91 of FIG. 7F may have an adverse impact on cable lifetime as well as on the smooth function of the moving of the cable. There are several configurations of linear actuator 350 that can achieve this. In one example, for example, motor 352 my rotate a worm gear that operates on a series of grooves in shaft 354.

FIG. 7I depicts a cross-section of one configuration to prevent rotation of a shaft. Shaft 355 passes through anti-rotational sleeve 356. Rotation is controlled by key 357, which passes through anti-rotational sleeve 356 and seats into a groove of rectangular cross section in shaft 355.

Figures 1, 8C:
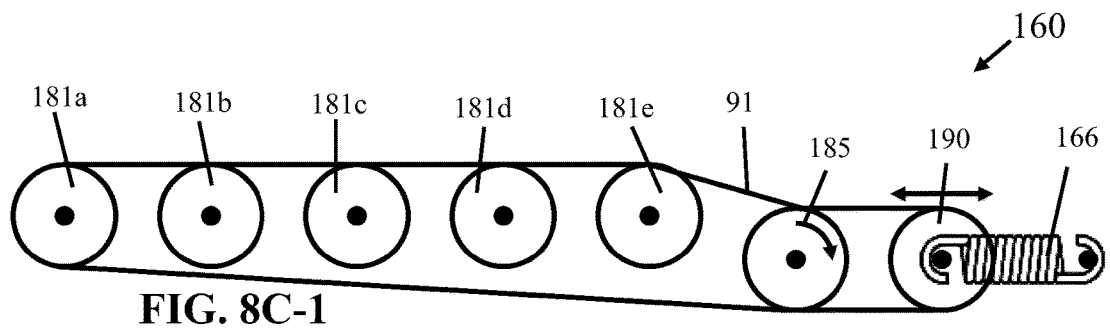
Figures 2, 8C:
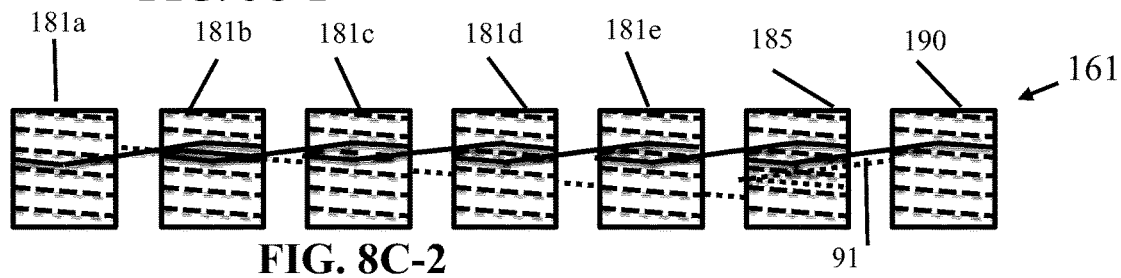
Figures 3, 8C:
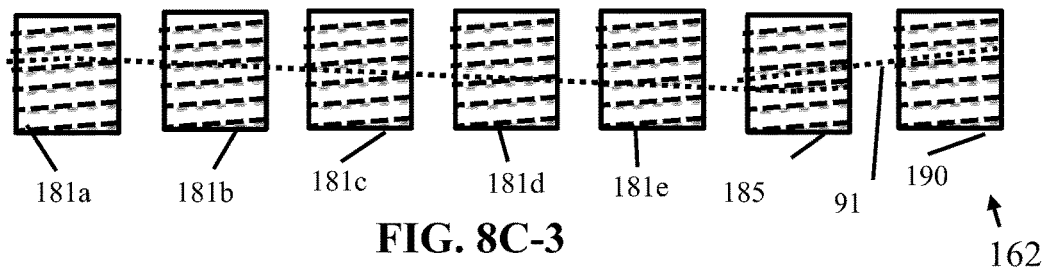

Various tensioner arrangements can be used to tension the wire cable 91 for the seasonal drive system. For example, FIG. 8A depicts a full seasonal drive system according to the present disclosure comprising driven pulleys 181a-e, wire cable 91, driver pulley 185, and tensioning spring 165. Placing tensioning spring 165 at this position may result in unequal force depending on which direction driver pulley 185 is rotating. Therefore, alternate ways of tensioning can be used to reduce the degree of unequal force in the two directions of rotation.

In another example, FIG. 8B depicts a full seasonal drive system comprising driven pulleys 181a-e, wire cable 91, driver pulley 185 eyelet bolts 171 having reverse threads from each other and turnbuckle 164. Placing turnbuckle 164 at this position in place of tensioning spring 165 of FIG. 8A can eliminate the issue of unequal force depending on which direction driver pulley 185 is rotating.

In other examples, FIGS. 8C-1, 8C-2, and 8C-3 depict three views of a full seasonal drive system for a solar concentrator system, such as system 50 of FIG. 2. View 160, view 161, and view 162 of the seasonal drive system each comprise driven pulleys 181a-e, driver pulley 185, tensioner pulley 190, and wire cable 91. View 160 further comprises tensioner (compression) spring 166. Driven pulley 160a receives a full wrap and an additional half wrap of wire cable 91. The additional half wrap is helpful because wire cable 91 changes direction at driven pulley 181a. Driven pulleys 181b-e each receive one full wrap as can be seen in view 161. Both upper and lower parts of wire cable 91 are wrapped on full turn around driver pulley 185 and then connect by one half turn around tensioner pulley 190. View 161 presents additional detail about wire cable 91 and its wrap around driver pulley 185. Tensioner spring 166 exerts force on tensioner pulley 190 to assist in keeping wire cable 91 taut. View 161 depicts from above the layout of wire cable 91 under drive pulleys 181a-e, driver pulley 185, and tensioner pulley 190. In one embodiment, tensioner spring 166 may be replaced by a turnbuckle such as turnbuckle 164 of FIG. 8B.

Figure 8D:
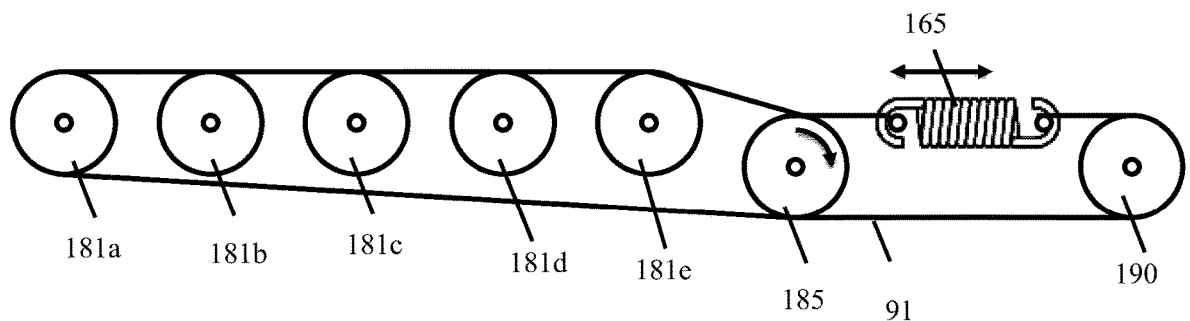
FIG. 8D depicts a pulley system having a tensioner with an in-line extension spring between an idler pulley and the driver pulley.
Figure 8E:
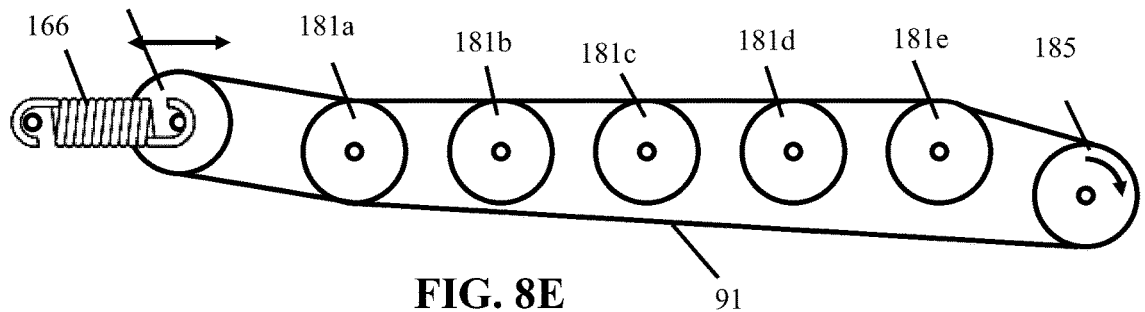
FIG. 8E depicts a pulley system having a tensioner with a tensioner pulley interfaced to the driver and driven pulleys through a driven pulley.

FIGS. 8D and 8E depict two alternative methods of deploying tensioner pulley 190 in the example of FIGS. 8C-1, 8C-2, and 8C-3. In FIG. 8D tensioner pulley 190 is located on the opposite side of driver pulley 185 from driven pulleys 181a-e. Tensioner spring 165 is placed in line on wire cable 91 between driver pulley 185 and in line tensioner pulley 190. Wire cable 91 is wrapped about driven pulleys 181a-e and driver pulley 185 as disclosed in FIGS. 8C-1, 8C-2, and 8C-3.

FIG. 8E depicts a substantial alteration from FIGS. 8C-1, 8C-2, and 8C-3. Tensioner pulley 190 is placed at the opposite end from driver pulley 185. Driver pulley 185 and driven pulleys 181b-e are substantially the same as previously disclosed. Driven pulley 181a is double wrapped as previously described for driver pulley 185 in FIGS. 8C-1, 8C-2, and 8C-3. Tensioner pulley 190 is wrapped as previously described in FIGS. 8C-1, 8C-2, and 8C-3. Tensioner spring 166 acts upon tensioner pulley 190 to keep wire cable 91 taut.

Figure 8F:
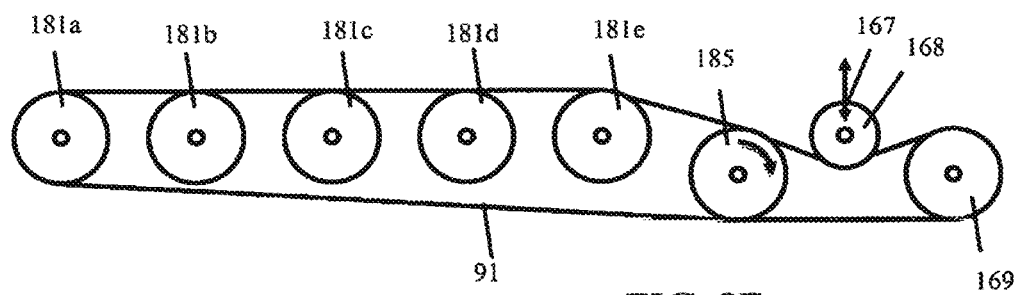
FIG. 8F depicts a pulley system having a tensioner with a tensioner pulley system and a compression spring.

FIG. 8F depicts anther method of tensioning wire cable 91. The example of FIG. 8F replaces tensioner pulley 190 and tensioner spring 166 with an alternative arrangement comprising idler pulley 169 and tensioner pulley 168. Tensioner pulley 168 is acted on by compression spring 167 to depress any slack in wire cable 91 and thereby keep wire cable 91 taut.

Figure 8G:
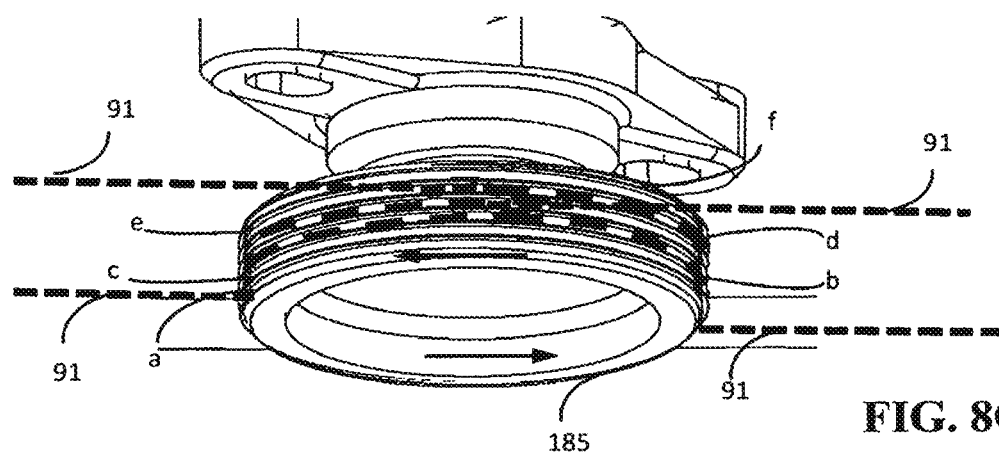
FIG. 8G depicts a pulley (driver or driven) which is wrapped by a wire cable extending to a tensioner pulley and returning from the tensioner pulley.

FIG. 8G depicts details regarding the wire cable 91 double wrap of driver pulley 185. Driver pulley 185 comprises a spiral groove formed onto a cylindrical surface. In the example of driver pulley 185 the spiral groove comprises six complete turns. For purposes of this disclosure, the grooves are designated by letters a through f beginning at the side of pulley 185 away from the frame (80). Each letter designated segment comprises one full revolution of the spiral beginning at the bottom of driver pulley 185 as depicted in FIG. 8G. Spiral segments a and b are not used. Wire cable 91 is routed from tensioner pulley 190 (not shown) and comes into contact with driver pulley 185 at segment d. Wire cable 91 wraps around one turn of a groove of driver pulley 185 and breaks contact with driver pulley 185 at segment e, whereupon it is routed to driver pulleys, such as 181e (not shown). The return routing of wire cable 91 first makes contact with driver pulley 185 at a position near the boundary of segment b and segment c. It wraps around driver pulley 185 in segment c and breaks contact underneath driver pulley 185 near the boundary between segment c and segment d. It then is routed to tensioner pulley 190 (not shown). Thus, wire cable is double wrapped around driver pulley 185, once in each direction.

One issue with cable drive systems is that wire cables may stretch over time. The forces acting on the cable include stretching due to tension, torque and the force of gravity on the wire. While not presenting a short term issue, it is useful to find solutions that can be applied over the lifetime of the solar concentrator system 50 without requiring major maintenance. This problem may be addressed through a combination of components. Provision for tightening with a tensioner is one aspect of a solution. A second aspect is to reduce the length of wire cable where possible.

Figure 8H:
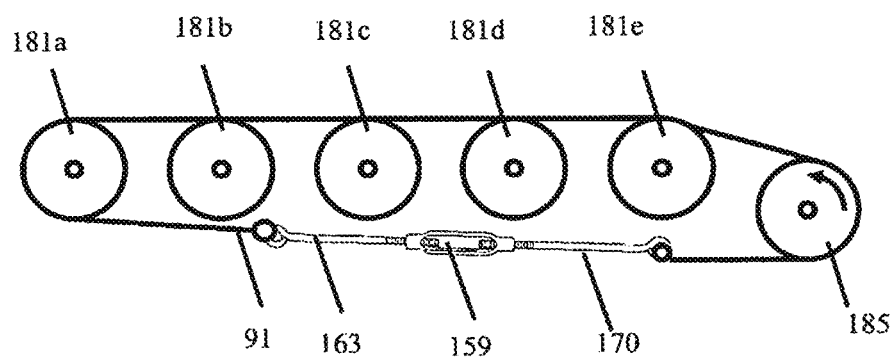
FIG. 8H depicts a pulley system in which a portion of a wire cable is replaced by a tensioner.

As one example, FIG. 8H presents the driver cable routing for a solar concentrator system similar to the driver system depicted in FIG. 8B. FIG. 8B depicts a full seasonal drive system comprising driven pulleys 181a-e, wire cable 91, driver pulley 185, and a tensioner assembly comprising assembly rod 163, assembly rod 170, and turnbuckle 159. Assembly rod 163 is configured with right hand threads and assembly rod 170 is configured with left hand threads so that the tension on wire cable 91 may be changed by rotating turnbuckle 159 without causing rotation of either assembly rod 163 or assembly rod 170. Use of longer rods reduces the length of wire cable 91 by the length of the two rods.

Use of the longer tensioner system requires attaching wire cable 91 to eyelets formed in the ends of assembly rods 163. FIG. 8I demonstrates how a loop may be formed by placing ferrule 191 onto wire cable 189, passing wire cable 189 through the eyelet of one of assembly rods 163, and then passing wire cable 189. Afterwards ferrule 191 may be crimped or otherwise secured to wire cable 189. Assembly rods 163 and turnbuckle 159 are depicted in FIG. 8J.

Even with the use of a rod the force of gravity on the overall length of the return line of wire cable 91 remains. One way to mitigate the effect of gravity is to route each of assembly rods 163 through a suitably placed eyelet bolt 192 as depicted in FIG. 8K. Positioning the eyelet bolts such that each of assembly rods 163 is support along its normal return path to driver cable 185.

The subject of periodic maintenance is of great importance in the operation of the solar concentrator system 50. As discussed, the system 50 is often positioned in relatively inaccessible locations such as a roof top with no convenient way of access. During installation of the system 50, it is useful if a way to adjust tension on the cable is provided. Wire cables are known to stretch slightly over time even if pre-stretched to minimize the effect.

For this purpose, FIG. 8L depicts tension assembly or apparatus 330 operative to maintain tension on a wire cable such as wire cable 91 of FIG. 8H in an autonomous manner. Assembly 330 may replace turnbuckle 159 and may also replace assembly rods 163 when suitably configured (not shown). Assembly 330 may be used in any application in which a wire cable or any other type of cable must be maintained in a taut state over a period of time and is not limited to solar energy applications. Tension assembly 330 acts to maintain tension in a cable by working to shorten the distance between ends 331 and ends 332 in response to an increase in slack in the wire cable (not shown). In this way, the tension assembly 330 is operative to maintain tension on a cable.

The assembly 330 includes a housing 338, a piston 342, a first biasing element 334, a catch 339, and a second biasing element 335. The housing 338 has a first end connected to a first portion of the cable (91). The piston 342 is at least partially movable in the housing 338. The piston 342 has a second end connected to a second portion of the cable (91). The first biasing element 334 is disposed in the housing 338 and biases the piston 342 toward the first end of the housing 338.

The catch 339 is disposed in the housing 338. The catch 339 is engageable against the piston 342 moved in a first direction and is disengagable from the piston 342 moved in a second direction opposite to the first direction. The second biasing element 335 disposed in the housing 338 biases the catch 339 to engage the piston 342.

As depicted in particular in FIG. 8L, tension assembly 330 comprises piston 342, housing 338, biasing elements or compression springs 334 and 335, and catch or brake components 341a and 341b. Piston 342 comprises piston shaft 333, piston platen 336, and piston eyelet 332. Housing 343 comprises housing cylinder 338, end cap 344, eyelet 331, internal platen 337, and end platen 340. Internal platen 337, end cap 344, and end platen 340 are rigidly fixed to housing cylinder 338 by welding, adhesion, and the like. Those of skill in the art having the benefit of the present disclosure will recognize other ways of fabricating the similar structures. Eyelet 331 is affixed to end cap 344. Internal platen 337 and end platen 340 are fabricated with apertures. The aperture (not shown) of internal platen 337 is fabricated such that piston shaft 333 of piston assembly 342 passes through the aperture.

Compression coil spring 335 is positioned around piston shaft 333 and between piston platen 336 and interior platen 337. Because interior platen 337 is fixed, coil spring 335 is operative to press upon piston platen 336 and potentially move piston assembly 342. Compression coil spring 334 is positioned around or adjacent to piston shaft 333 and between interior platen 337 and wedge brake or slips 341a. Wedge brake or slips 341a comprises at least one cone/cylinder unit which may be segmented parallel to the axis of piston shaft 333 such that it may, when under pressure from coil spring 334, seat firmly in brake housing 341b. In another embodiment, the wedge brake 341a may comprise two or more components, slips, wedges, or the like. The term wedge brake as used for this component is selected for the purposes of discussion and is not intended to imply that a wedge brake has all of the attributes of a wedge as is normally understood in the field of mechanics. When wedge brake 341a is pressed into brake housing 341b, it applies a level of pressure to piston shaft 333 which impedes movement of piston shaft 333.

The shape of the cavity of brake housing 341b is substantially the same as that of the exterior surface of wedge brake 341a. The shape of the interior of wedge brake 341a is substantially that of the exterior of piston shaft 333 in that piston shaft 333 should pass through wedge brake 341a when wedge brake 341a is under a lower level of pressure. End platen 340 serves to keep brake housing 341b in place. End platen 340 is fabricated with an aperture such that the cylindrical portion of wedge brake 341a passes through it while being held substantially in place.

Eyelet 332 and eyelet 331 are each attached to a wire cable (not shown) through the use of a loop such as that of FIGS. 8H and 8I. As will be appreciated with the benefit of the present disclosure, there are alternatives other than the eyelet loop for fastening a cable or spring to another element of a system. It is intended that a reference to an eyelet encompasses alternative fasteners.

An understanding of the functioning of tension assembly 330 requires knowledge of the forces applied to the assembly. External forces (marked a and b) are applied by the aforesaid wire cables (not shown) attached to the assembly at eyelets 331 and 332. In all but transitory phenomena, such as movement of the wire cable, forces a and b are equal to each other, thus keeping tension assembly under fixed external force. The magnitude of the external force on tension assembly 330 equals a+b.

Internal force is applied to tension assembly 330 by coil compression spring 335 which acts to maintain or reduce the distance between eyelet 331 and 332. Coil compression spring 335 places pressure d on piston platen 336. Pressure d exerted by coil compression spring 335 acts to move piston assembly 342 further into tensioner system 330 which would reduce the distance between eyelet 331 and eyelet 332 thereby increasing the tension on the wire cable (not shown) which means increasing the force between a and b.

Coil compression spring 334 places pressure with force c on wedge brake 341a. Brake housing 341b directs wedge brake 341a into firmer contact with piston shaft 333 which in turn stops movement of piston assembly 342 in an outward direction. The actual force exerted by wedge brake 341a on piston shaft 333 will continually increase as increasing outward pull is exerted on eyelet 332 by the wire cable (not shown). This shows that the action of wedge brake 341a on piston shaft 333 is sufficient to prevent piston assembly 342 from moving further out of tension assembly 330. Therefore, lengthening of the distance between eyelet 331 and eyelet 332 is prevented.

The force exerted by wedge brake 341a on piston shaft 333 when piston shaft 333 is caused to move further into tension assembly 330 is limited to that required to overcome a level of friction between piston shaft 333 and wedge brake 341a and between brake wedge 341a and brake housing 341b.

Once this friction is overcome, piston assembly 342 will move as far into tension assembly 330 as other forces discussed hereafter permit. The nature of the friction that must be overcome depends on a number of different factors, which include the nature and the finishes of the materials of which piston shaft 333, wedge brake 341a and brake housing 341b are fabricated and which also include the effective apex angle of the conical portions of wedge brake 341a and brake housing 341b. This shows conclusively that piston assembly 344 will retract further into tension assembly 330 if the force applied to piston eyelet 332 by the wire cable (not shown) is not sufficient to prevent force d applied by coil compression spring 335 from overcoming the friction between piston shaft 332 and wedge brake 341a and between wedge brake 341a and brake housing 341b.

A consideration is to accommodate a need to reset the position of piston assembly 342 relative to cylinder 343. One way for doing this is to press the parts of wedge brake 341a that extends beyond exterior housing platen 340 toward the interior of tension assembly 330. This allows the position of piston assembly 342 to be moved either in or out as needed. Once the reposition is finished pressure on wedge brake 341a can be removed after insuring that the wire cable (not shown) is attached.

Thus, tension assembly 330 has been shown to maintain its length when the wire cable (not shown) is sufficiently taut and to be able to shorten its length autonomously when the wire cable is overly slack, thereby increasing the tension on the wire cable.

Those of ordinary skill in the art will recognize with the benefit of the present disclosure that an extension spring placed so as to pull piston assembly 342 toward piston end cap 344 would cause tension assembly 330 to function in a similar manner. In one embodiment, piston platen 336 is eliminated and an eyelet is added. Those of skill in the art will recognize that in one embodiment both extension and compression springs may be used. There may be reasons to prefer one approach over the other, but all can be made to work.

FIG. 8M depicts an alternative tension assembly 348 according to the present disclosure. Tension assembly 348 comprises piston 349, housing 338, first biasing element or compression spring 334, second biasing element or extension spring 347, and catch or brake components 341a and 341b. Piston 349 comprises shaft 358, piston eyelet 345, and piston eyelet 332. Housing 343 comprises housing cylinder 338, end cap 344, eyelet 331, internal platen 337, and end platen 340. Internal platen 337, end cap 344, and end platen 340 are rigidly fixed to housing cylinder 338 by welding, adhesion, and the like. Other ways of fabricating the similar structures can be used. Eyelets 331 and 346 are affixed to end cap 344 externally and internally respectively. Internal platen 337 and end platen 340 are fabricated with apertures. The aperture (not shown) of internal platen 337 is fabricated such that piston shaft 333 of piston assembly 349 passes through the aperture.

The function of commonly numbered elements of FIG. 8L and FIG. 8M are the same. The only substantial point of difference is that internal force d is generated by the action of extension spring 347 to contract. Internal force c is identical between the embodiment of FIG. 8L and FIG. 8M as are external forces a and b. The functionality of the two embodiments is identical in concept.

Platen 336 of piston assembly 343 and eyelet 345 of piston assembly 349 perform the same function, which is to enable compression spring 335 and extension spring 347 to exert force upon their respective piston assemblies tending to move the piston assemblies 343 and 349 deeper into their respective housing assemblies 343 and 343.

Figure 9A:
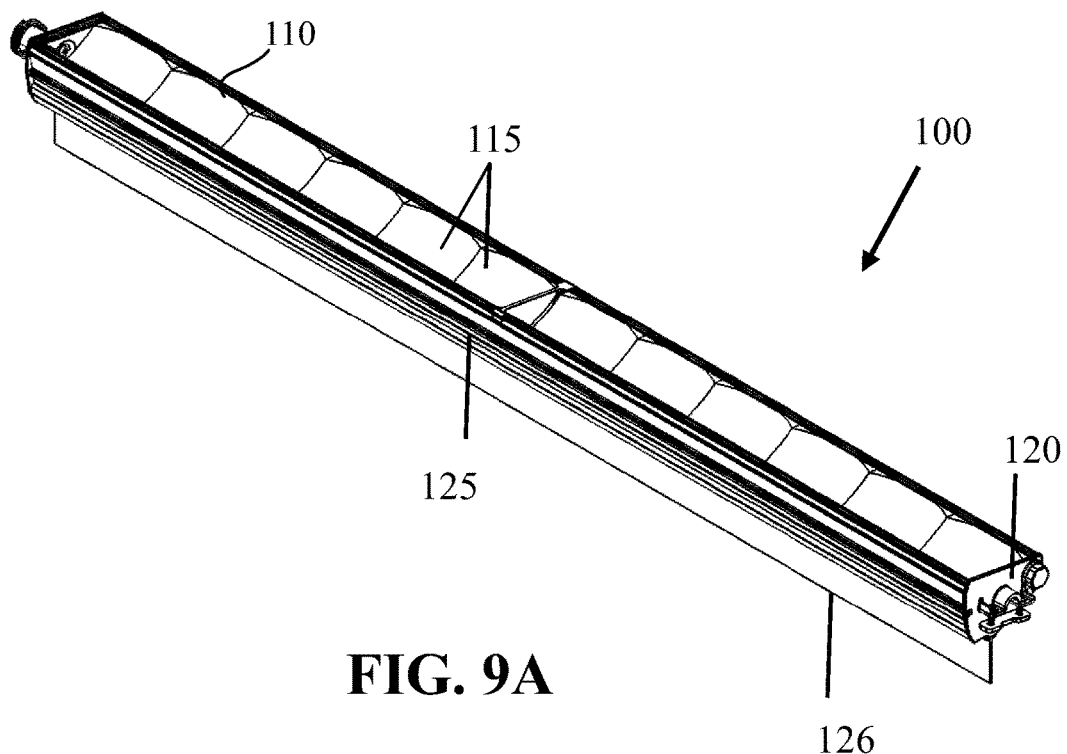
FIGS. 9A-9C respectively depict perspective, side, and end view of a solar concentrator module having a brush attached on the underside.
Figure 9B:
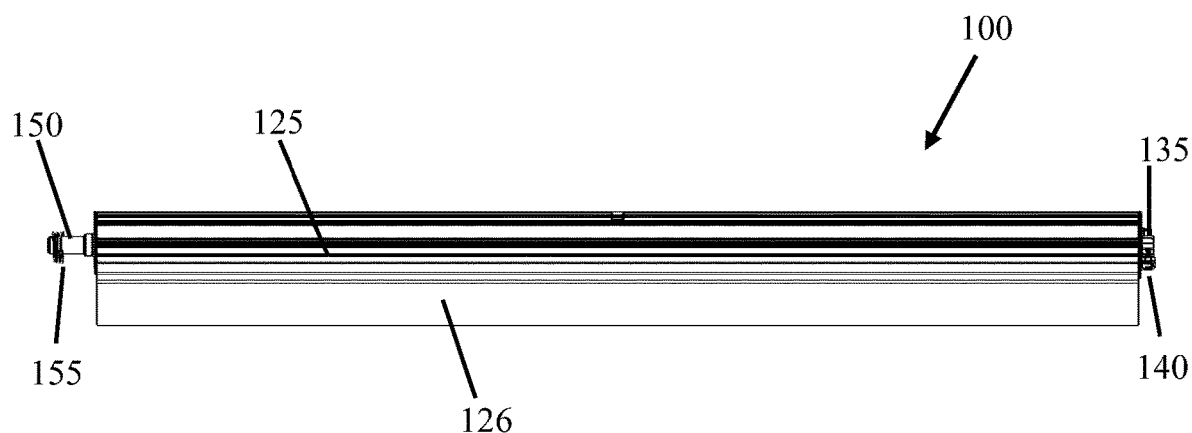

Returning to a discussion of the disclosed solar collector 100, FIGS. 9A and 9B depict perspective and side views of solar collector 100 comprised of mirror assembly 115, module housing 125, end cap 120, and brush assembly 126. FIG. 9B further depicts bottom flange 140 affixed to end cap 120 (not shown) with clamp 135 affixed to bottom flange 140 by fastener 145 (not shown). FIG. 9B additionally depicts axle 150 and wiring 155 at the opposite end of solar collector 100.

Figure 9C:
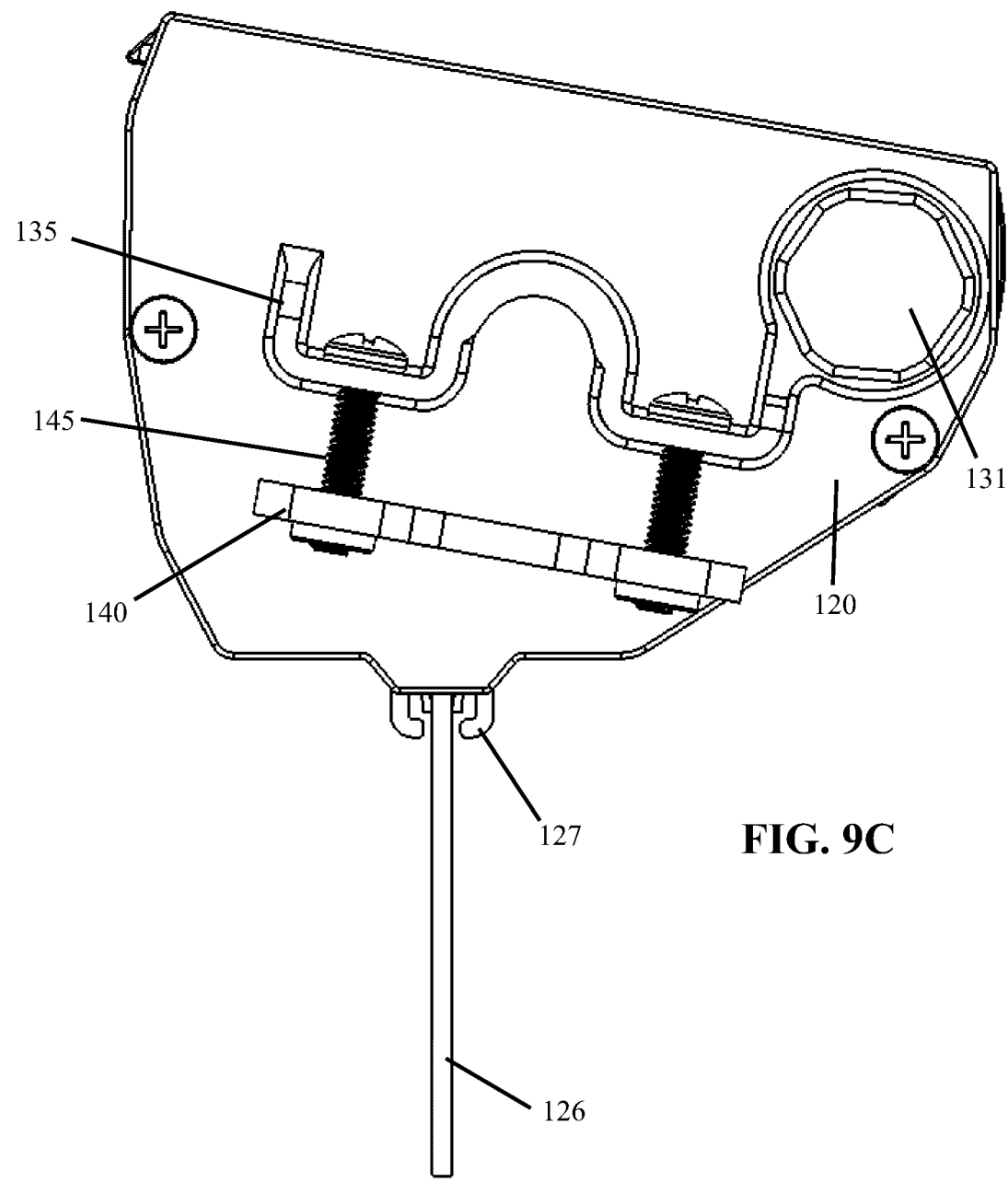

FIG. 9C depicts end cap 120 with bottom flange 140 affixed thereto. Clamp 135 is affixed to bottom flange 140 by fastener (screws) 145. Pressure relief cap 131 is affixed to end cap 120. Brush mounting feature 127 forms part of module housing 125 (not shown) and brush assembly 126 is inserted into brush mounting feature 127 which holds it securely.

One ongoing problem with all solar energy systems is the collection of dust on the collecting surface. This problem has been the subject of a number of studies because dust in the collecting aperture of any solar system, concentrating or not, will reduce its collecting efficiency over time. The presence of snow and water are related but separate problems that need to be dealt with. Getting rid of dust often requires a site visit by maintenance personnel to remove the dust with soap and water. This in turn will require that the solar energy system be shut down to avoid possible injury or death due to the present of high voltage.

As noted, the tray 125 of the collector 100 preferably has a transparent cover 130 disposed on the open trough of the tray 125. To deal with dust and the like, a brush 126 depends from the tray 125 and is configured to contact with the cover of an adjacent one of the solar collectors 100 with the second rotation of the adjacent solar collectors 100.

In one embodiment, solar collectors 100 (FIGS. 3A-3C) are spaced on frame 80 (FIG. 2) such that seasonal drive system 160 (FIGS. 8C-1, 8C-2, and 8C-3) can rotate solar collectors 100 to an angle that brings brush assembly 126 into contact with cover glass 130 (FIG. 3B) on adjacent modules. In one embodiment, seasonal drive system 160 (FIGS. 8C-1, 8C-2, and 8C-3) is capable of performing this in two positions substantial 180° apart so that cover glass 130 of all collectors 100 is brought into contact with brush assembly 126 of an adjacent collectors 100. The brush system herein disclosed can mitigate the effects of snow and water accumulation and can perform some mitigation on the collection of dust.

One source of concern is the possibility of slippage of any system using wire cable repetitively. The environment for outdoor operation will be substantially difficult. Both on a daily and a seasonal basis such a system will be exposed to a far wider range of temperatures and other phenomena such as high wind, freezing fog, and the like. Avoiding such slippage requires careful planning in the design.

FIGS. 10A-10D present an alternative approach to the systems of FIGS. 8A-8G that rely on a first approach to the reduction of slippage. FIGS. 10A-1, 10A-2, and 10A-3 depicts side view 221, top view 222, and bottom view 223 as seen from above. Views 221, 222, and 223 comprise driven pulleys 210a-e, driver pulley 215, tensioner (idler) pulley 220, tensioner spring 225 and wire cable 205. The configuration of the system of FIGS. 10A-1, 10A-2, and 10A-3 differs from that of FIGS. 8C-1, 8C-2, and 8C-3 in that drive pulleys 210B-210E are each configured with the double wrap arrangement disclosed in FIG. 8G. The operation is otherwise similar to that of the system of FIGS. 8C-1, 8C-2, and 8C-3.

Figures 1, 10A:
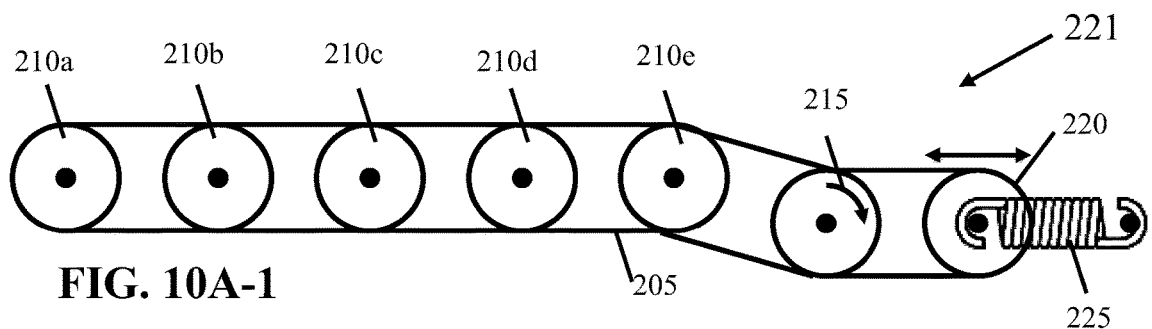
Figures 2, 10A:
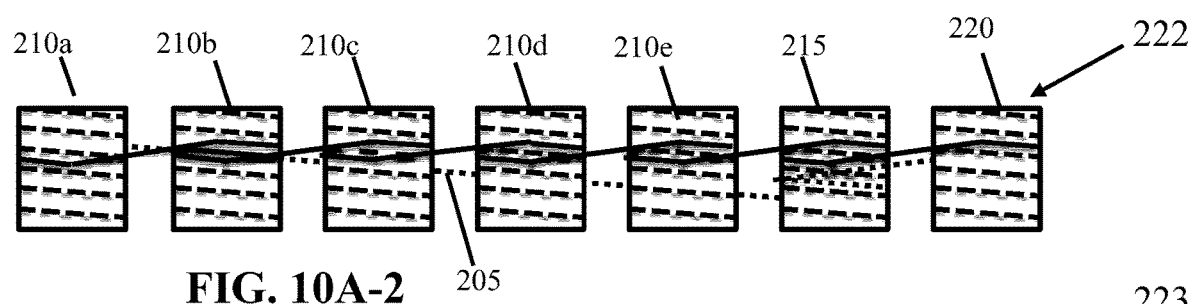
Figures 3, 10A:
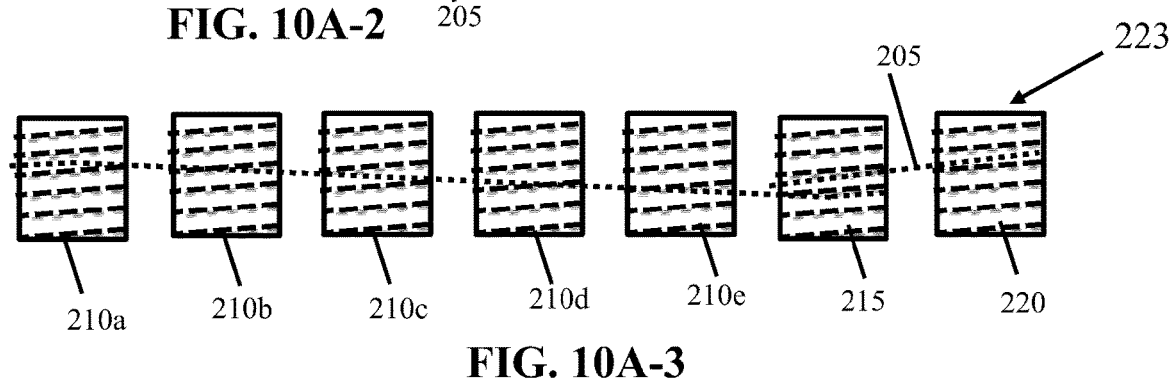
Figure 10B:
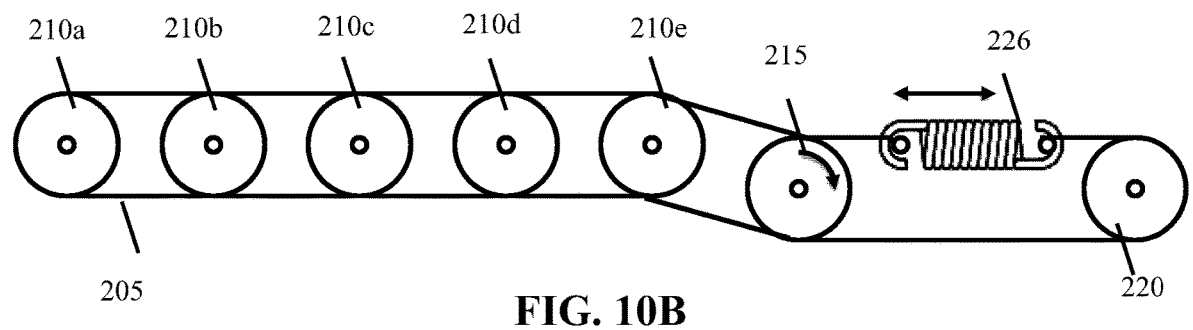
FIG. 10B depicts a pulley system having a tensioner with an in-line extension spring between an idler pulley and the driver pulley and having the driven pulleys wrapped by wire cable on both the drive side and the return side of the wire cable.
Figure 10C:
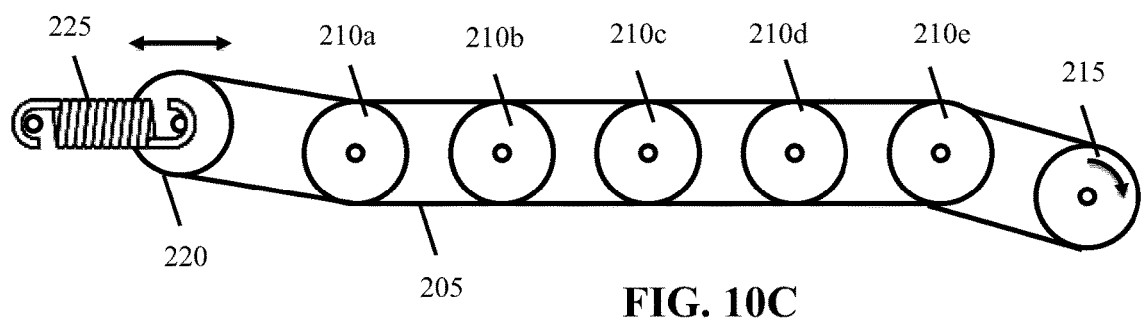
FIG. 10C depicts a pulley system having a tensioner with a tensioner pulley interfaced to the driver and driven pulleys through a driven pulley and having the driven pulleys wrapped by wire cable on both the drive side and the return side of the wire cable.
Figure 10D:
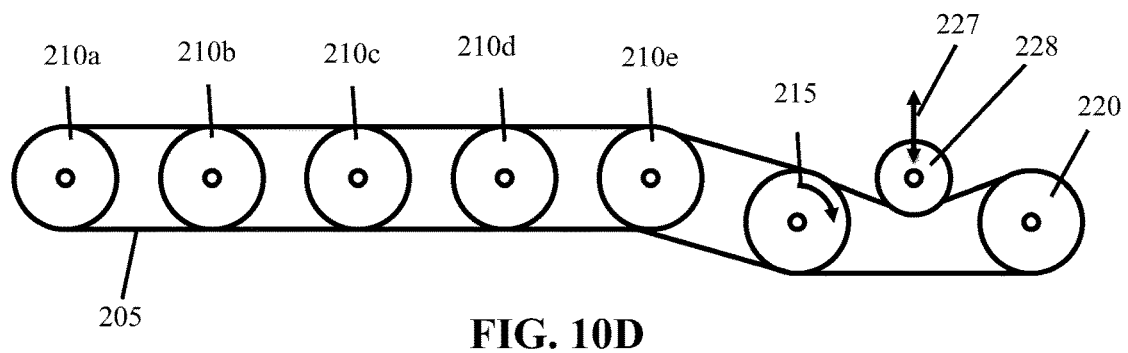
FIG. 10D depicts a pulley system having a tensioner with a pulley and a compression spring and having the driven pulleys wrapped by wire cable on both the drive side and the return side of the wire cable.

FIGS. 10B, 10C and 10D use the double wrap configuration disclosed in FIG. 8G on driven pulleys 210b-e and are otherwise similar to the systems previously disclosed in FIGS. 8D, 8E and 8F. The systems of FIGS. 10B, 10C, and 10D comprise wire cable 205, driven pulleys 210a-e, driver pulley 215, and tensioner pulley 220. The system of FIG. 10B further comprises inline tensioning spring 226. The system of FIG. 10C further comprises tensioner spring 225 deployed opposite driver pulley 215. FIG. 10D further comprises compression spring 227 and tensioning spring 228.

Figure 11A:
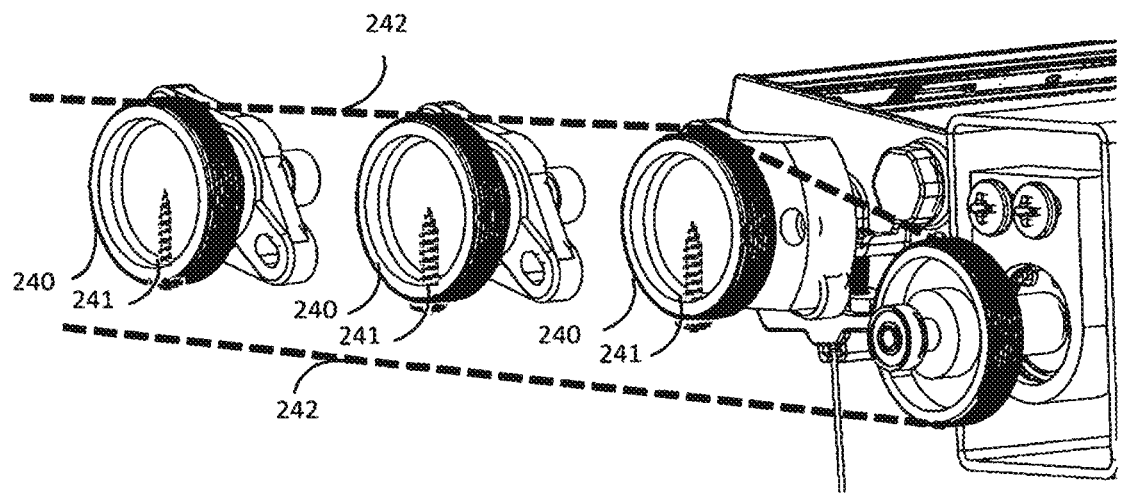
FIG. 11A depicts a set of driven pulleys connected by wire cable wherein the wire cable is held secure to each of the driven pulleys by a fastener.

FIG. 11A depicts an alternative way for preventing slippage in a wire cable driving comprising a set of pulleys and a fastener (screw) to prevent slippage mechanically. This obviates the need for the double wrap method described in FIGS. 10A-10D. Wire cable 242 is routed around each drive pulley 240 by a single wrap. Wire cable 242 is secured to drive pulley 240 by fastener 241, in this case a screw. The fastening position is approximately 180° across from the point on driven pulley 240 at which wire cable 241 falls when the solar concentrator is at its null position as defined in this application. The enables driven pulley to drive almost a full ±180° which is sufficient to operate the solar concentrator system of this application.

Figure 11B:
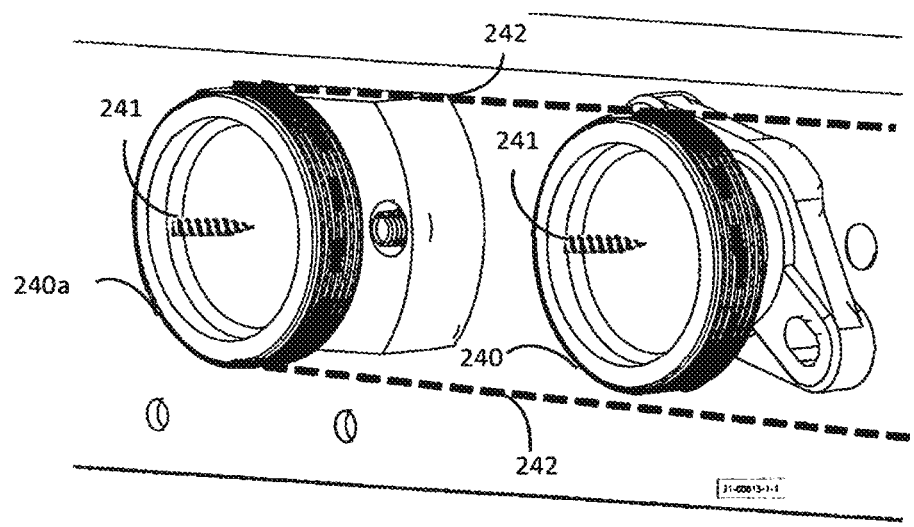
FIG. 11B depicts a set of driven pulleys connect by a wire cable held secure by a fastener wherein one driven pulley is the last pulley in a series of driven pulleys.

FIG. 11B depicts the special case of the last driven pulley 241a. In the case of driven pulley 241a wire cable 242 must make an extra half turn because wire cable reverses direction when it departs pulley 241a to return to driver pulley 245 (not shown). Wire cable 242 is routed from driven pulley 240 to last driven pulley 240a. Wire cable 242 is fastened to driven pulleys 240 and 240a by fastener 241.

Figure 11C:
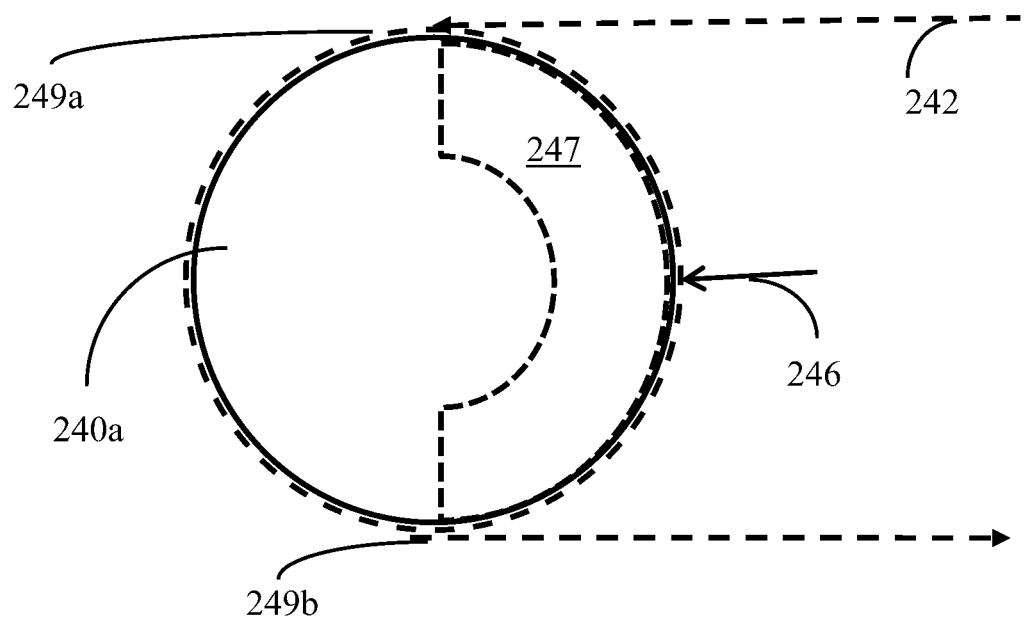
FIG. 11C depicts a last pulley in a series of driven pulleys wherein a range of positions for fastening is indicated.

FIG. 11C depicts a range of positions represented by arc 247 on last driven pulley 240a at which fastener 241 could be placed and still allow the same range of rotary motion found on all other driven pulleys (not shown). Point 249a indicates a point at which the upper part of wire cable 242 first comes in contact with driven pulley 240a. Point 249b indicates a point at which the lower part of wire cable 242 comes in contact with last driven pulley 240a.

Figure 11D:
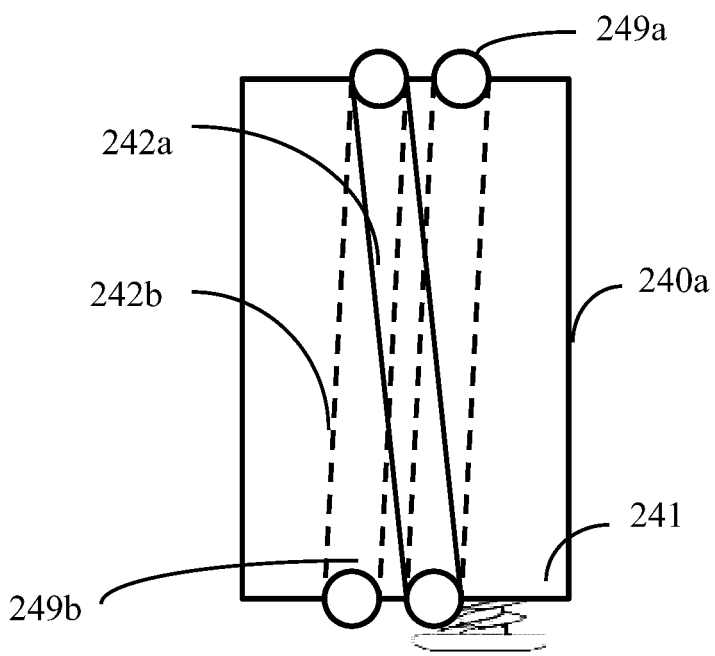
FIG. 11D depicts an alternate view of a last driven pulley in a series of driven pulleys.

FIG. 11D depicts a view of last driven pulley 240a of FIG. 11C as viewed from the closest driven pulley 240. (not shown) Wire cable 242 routing from driven pulley 240 comes in contact with last driven pulley 240a at point 249a. Wire cable 242 then wraps behind last driven pulley 240a (dotted lines) and then in front of last driven pulley 240a (as 242a) and then continues behind last driven pulley 240a (as 242b) until it reaches point 249b at which point wire cable 242 breaks contact with last driven pulley 240a and is routed directly to driver pulley 245 (not shown).

Figure 11E:
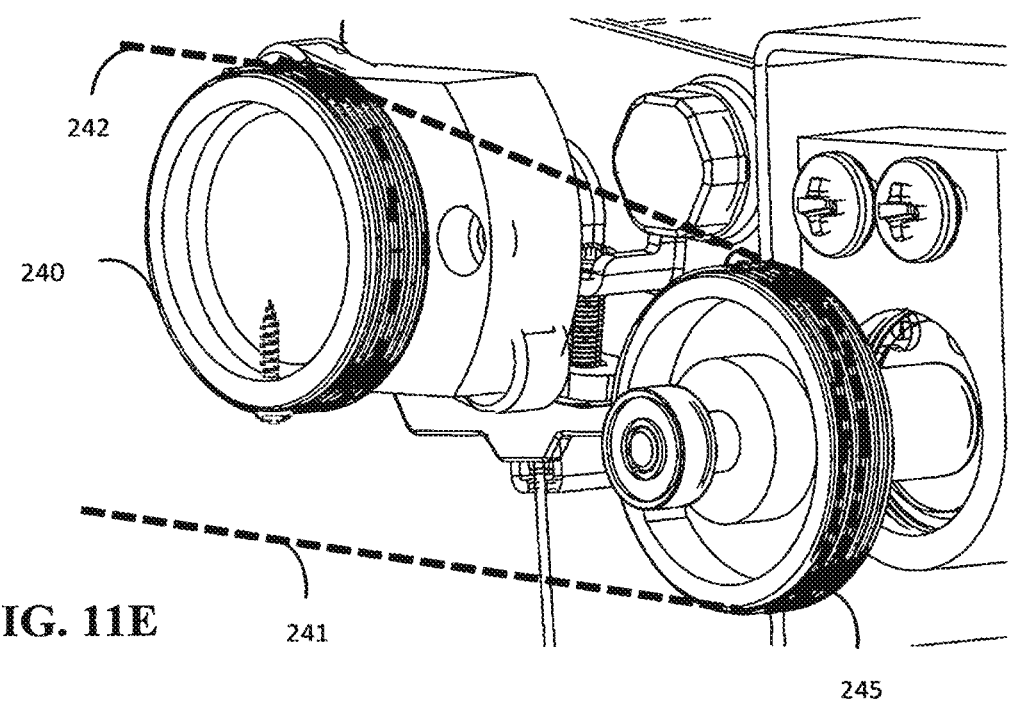
FIG. 11E depicts a first driven pulley in a series of driven pulleys and a driver pulley connected by wire cable such that the driver pulley may turn all driven pulleys together.
Figure 11F:
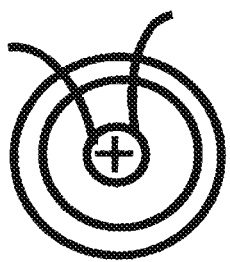
FIG. 11F shows another way to fasten cable to a pulley.

FIG. 11E depicts the arrangement of driver pulley 245 and driven pulley 240. Wire cable 241 is routed from below to driver pulley 245. Wire cable 242 is wrapped about driver pulley 245 by 1½ turns and then is routed to driven pulley 240. Wire cable 242 is wrapped one time about driven pulley 240 and then is routed to other driven pulleys (not shown). In one embodiment, wire cable 242 is fastened to driver pulley 245 in a manner similar to that of FIGS. 11C and 11D. Wire cable 242 may be fastened to driven pulley 240 by fastener 241.

Figure 12A:
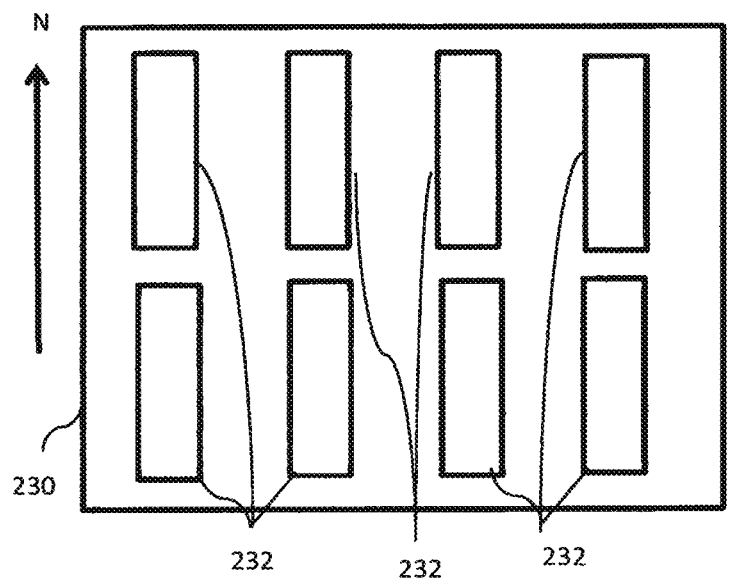
FIG. 12A depicts a rooftop solar concentrator installation wherein a side of the roof is oriented north-south.
Figure 12B:
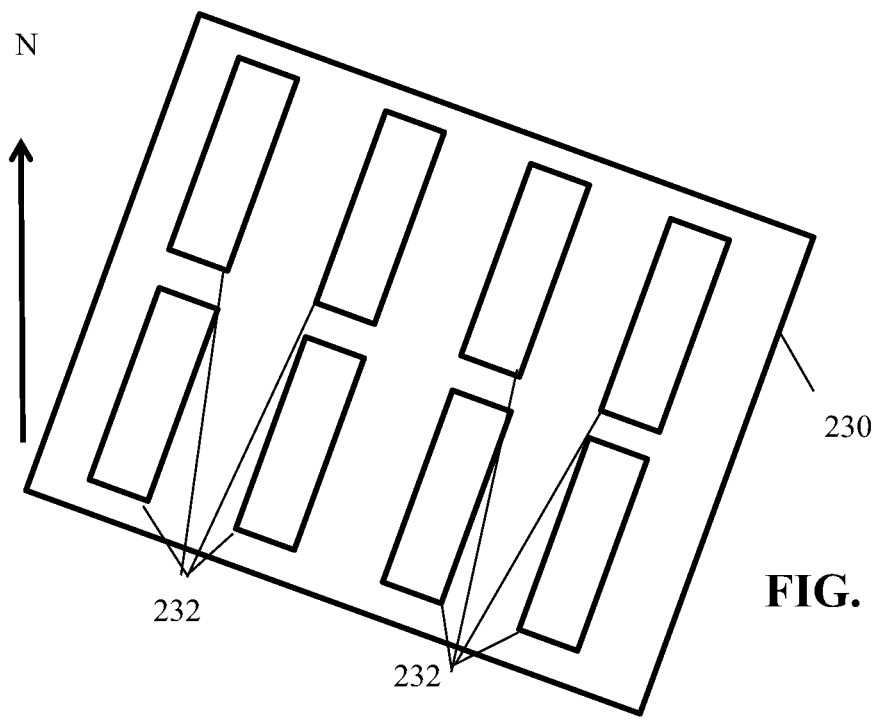
FIG. 12B depicts a rooftop solar concentrator installation wherein no side of the roof is oriented north-south.

As noted herein, several of the solar collector systems 50 can be arranged together in an array or matrix on a rooftop or the like. For example, FIGS. 12A and 12B depict two different orientations of rectangular roof top 230 with solar concentrator systems 232 mounted thereon. Solar concentrator systems 232 are mounted parallel to the sides of roof top 230 to maximize the number of solar concentrators that can be mounted thereon. FIG. 12A depicts a first orientation wherein two sides of roof top 230 are oriented substantially along a true north-south line. The frame axis (daily axis) is also oriented north-south. Because solar concentrators 232 are oriented with daily axes (not shown) parallel to north-south solar concentrator systems 232 may be driven with a simplified set of drive calculations as will be shown. FIG. 12B depicts a second orientation wherein no sides of rectangular roof top 230 are substantially parallel to north-south. Maximizing the number of solar concentrator systems 232 mounted on roof top 230 requires that the daily axes (not shown) of solar concentrator systems 232 not be parallel to north-south. To drive to the sun position more complex drive calculations are required.

Figure 12C:
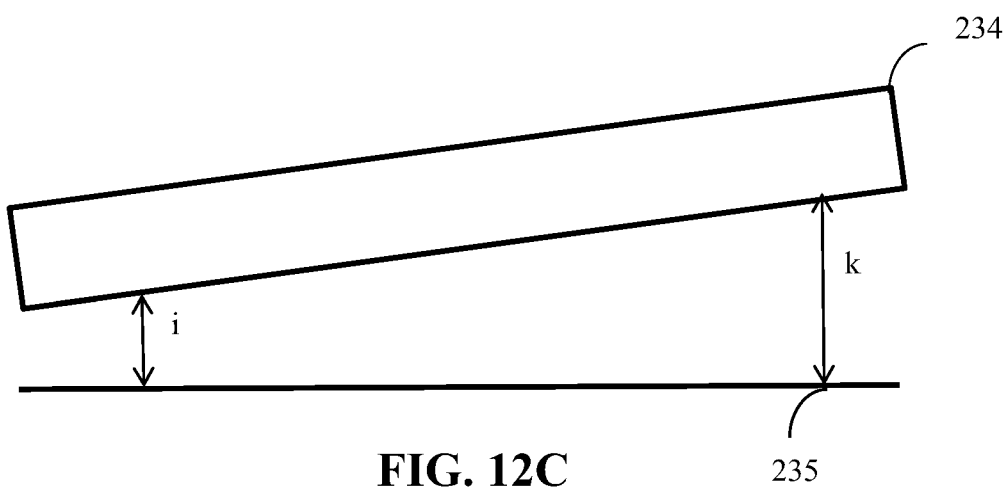
FIG. 12C depicts a side view of a solar concentrator frame wherein one end of the solar concentrator frame is at a different height from the opposite end of the solar concentrator frame.

FIG. 12C depicts one solar concentrator system 234 wherein the solar concentrator system 234 is not mounted with its daily axis parallel to local ground plane 235. One end of the daily axis of solar concentrator system 234 is at distance i from ground plane 235 and the other end of the daily axis is at distance k from ground plane 235, wherein distance i and distance k have different values.

The National Oceanic and Atmospheric Administration Earth System Research Laboratory Global Monitoring Division (NOAA/ESRL/GMD) has published a Solar Position Calculator spreadsheet available in at least two formats that can be used to calculate the position of the sun based on geographic location (latitude and longitude), local date, and time past local midnight. The calculator is stated to be based on equations from "Astronomical Algorithms" by Jean Meeus. One result yielded by the Calculator is an apparent position of the sun in terms of Solar Azimuth measure clockwise from true north and apparent Solar Elevation in degrees corrected for atmospheric refraction. This is an open source tool available to the general public that is used for a number of applications. In this application the Solar Azimuth and apparent Solar Elevation are used as an input to another set of equations used to calculate a position of the sun relative to the axes of solar concentrator system 50 of FIG. 2. In this application the Solar Azimuth angle is referred to as "Theta AZ" and the apparent Solar Elevation (Altitude) angle is referred to as "Theta ALT". The NOAA Solar Calculator may be found at http://www.esrl.noaa.gov/gmd/grad/solcalc/NOAA_Solar_Calculations_day.xls and instructions for its use may be found at http://www.esrl.noaa.gov/gmd/grad/solcalc/calcdetails.html.

Referring to FIG. 2 and FIG. 7C, both daily drive motor 65 and seasonal drive motor 104 of a solar concentrator system (50) may be stepper motors. Because, in a properly designed system, stepper motors can be driven open loop to known angular positions, it is convenient to define a local coordinate system based on angles of rotation of frame 80 and concentrator modules 55. Both coordinates are angles which may be expressed in radians or degrees or in any other convenient system. Most computing systems use radians for actual calculations but degrees are typically easier to place in context. A spherical coordinate system based on a daily drive and a seasonal drive is similar to the latitude-longitude system commonly used to specify specific locations on the earth. Similarly, the daily drive system are somewhat analogous to solar azimuth and solar elevation in the NOAA position calculator. The daily drive system is analogous to an azimuth system and the seasonal drive system is analogous to an inclination system. Daily drive motor 65 of FIG. 2 and seasonal drive motor 104 of FIG. 7C provide the way to position solar module 124 of FIG. 3C such that its optic axis (arrow c) is aligned to a desired set of angles in the coordinate system of the solar concentrator system (not shown).

Figure 13A:
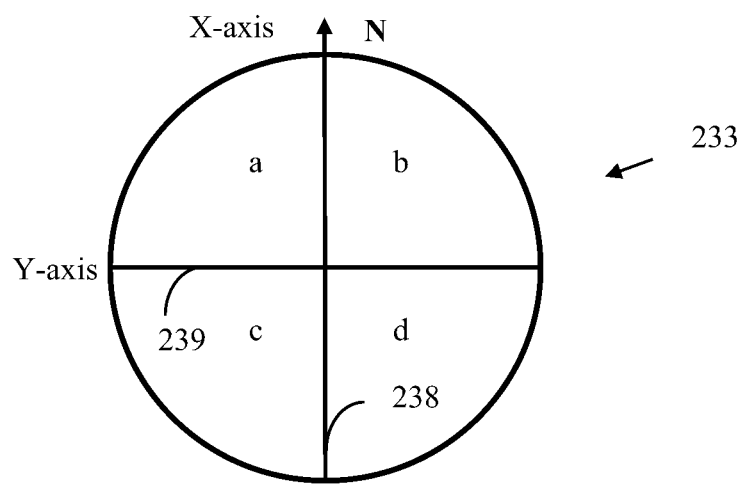
FIG. 13A depicts four sectors for the angles of the daily and seasonal drive systems.

For the purposes of discussing the calculation and control of the disclosed system, FIG. 13A depicts a coordinate system 233 based on the angular positions of a daily drive system after FIGS. 5A and 5B and a seasonal drive system after FIG. 8A. The convention for this application regarding the angles of orientation of the daily drive is that angles to the east of the normal point are negative and angles to the west of the normal point are positive. The convention for this application regarding the angles of orientation of the seasonal drive is that angles north of the normal point are negative and angles south of the normal point are positive. The following table presents the sign values for angles representing the position of a daily drive system after FIGS. 5A and 5B and the position of a seasonal drive system after FIG. 8A wherein the sign depends upon on which quadrant each of the two angles fall into.

| Quadrant from FIG. 13A | Angle Sign | |
|---|---|---|
| | Daily System | Seasonal System |
| 'a | Positive | Negative |
| 'b | Negative | Negative |
| 'c | Positive | Positive |
| 'd | Negative | Positive |

Figure 13B:
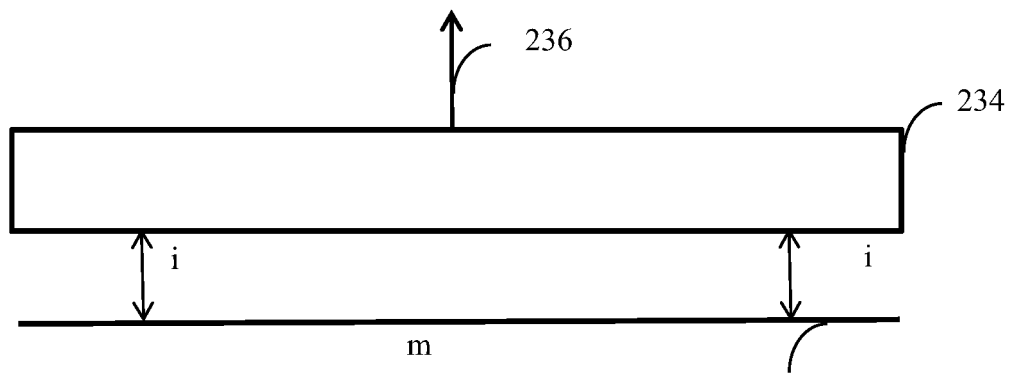
FIG. 13B depicts a configuration of a rectangular frame wherein the frame is parallel to the ground.

A first assumption regarding the null coordinates is that the null point for the daily axis occurs at solar noon. At this time the optical axis is at its closest approach to vertical on the daily axis. The definition of the null point for the seasonal drive system is presented in FIGS. 13B and 13C. An assumption of this is that this is determined with the daily axis at its null position. FIG. 13B comprises a first orientation of frame 234 wherein frame 234 is parallel to ground plane 235 at a distance i from ground plane 235 at all points. Optical axis 236 is perpendicular to the frame and is oriented parallel to a vertical axis perpendicular to ground plane 235. The coordinate for the daily axis is expressed in degrees as Theta E-W and the coordinate for the seasonal system is expressed in degrees as Theta N-S, both with signs as indicated above.

Figure 13C:
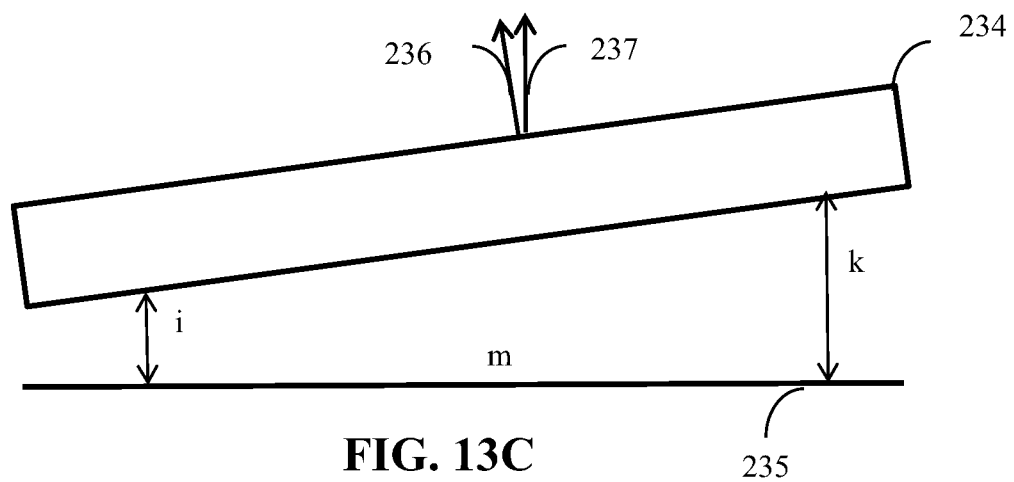
FIG. 13C depicts a configuration of a rectangular frame wherein two sides of the frame are not parallel to the ground.

FIG. 13C depicts a second orientation of frame 234 wherein the daily axis of frame 234 is not parallel to ground plane 235 and rather stands at a first distance i at a first end of the frame 234 end and at a second distance k not equal to i at an end opposite to the first end of frame 234, wherein the measurement points for i and k are separated by a distance m. According to standard rules of trigonometry, optical axis 236 in this case forms an angle n with a vertical axis 237 perpendicular to ground plane 235 wherein the angle n follows the following equation.

$$n = \arctan(k-i)/m$$

The use of the coordinate system of FIGS. 13A-13C requires a systematic approach. In a first case a solar concentrator system 50 such as that of FIG. 2 is assumed to be oriented with its daily axis system oriented north south as in FIG. 12A and with its frame parallel to the local ground plane as shown in FIG. 13B. The angle of the daily axis, hereinafter referred to as Theta E-W, is positive when facing west (solar afternoon) and negative when facing east (solar morning) in this configuration. The angle of the seasonal axis, hereinafter referred to as Theta N-S, is positive when facing south from a line perpendicular to the frame and negative when facing north of a line perpendicular to the frame.

The previously stated output of the NOAA Solar Position Calculator for Solar Azimuth (Theta AZ) is an angle measured clockwise from true north and the output for Solar Elevation is (Theta ALT) is degrees above the horizon corrected for atmospheric refraction. In order to point a solar concentrator system, it may be necessary to perform a transformation upon the output of the Solar Position Calculator from Theta AZ and Theta ALT to the coordinates of the solar concentrator system (Theta N-S and Theta E-W).

The following convention is used in the conversion equations:

$$\text{Signcalc} = |\text{Theta } AZ - 180°|/(\text{Theta } AZ - 180°)$$

Signcalc insures the correct angle sign results in the conversion from Theta ALT and Theta AZ to Theta N-S and Theta E-W.

The following conversion equation will transform Theta ALT and Theta AZ to Theta N-S and Theta E-W.

$$\text{Theta } E\text{-}W =$$

$$\left(90° + \left(Signcalc \times \text{Arctan}\left(\text{Tan}\frac{\text{Theta } ALT}{\cos(\text{Theta } AZ - 90°)}\right)\right)\right) \times SignCalc$$

$$\text{Theta } N\text{-}S = \text{Arccos}\left((-\sin(\text{Theta } AZ - 90°)) \times \cos(\text{Theta } ALT)\right)$$

A program using these formulae must include error traps to avoid division by zero creating overflow conditions, as is well known in the art. One example of an overflow condition would occur when To have the broadest possible range of installation options, it is optimal to be able to orient a set of solar concentrators without a requirement to orient the daily axis to exactly true north. FIG. 12B provides an example of this. The previous equations are useful, but must be expanded to be useful in a more arbitrary installation.

The approach taken to this problem is to develop a second set of equations useful to take Theta AZ and Theta ALT as inputs and derive from them a virtual Theta AZ and Theta ALT which can be used as Theta2 and Theta1 in the above equations, which in turn are useful to calculate Theta E-W and Theta N-S.

One convention in this application is to continue the use of daily drive and daily axis and seasonal drive and seasonal axis.

Figure 14A:
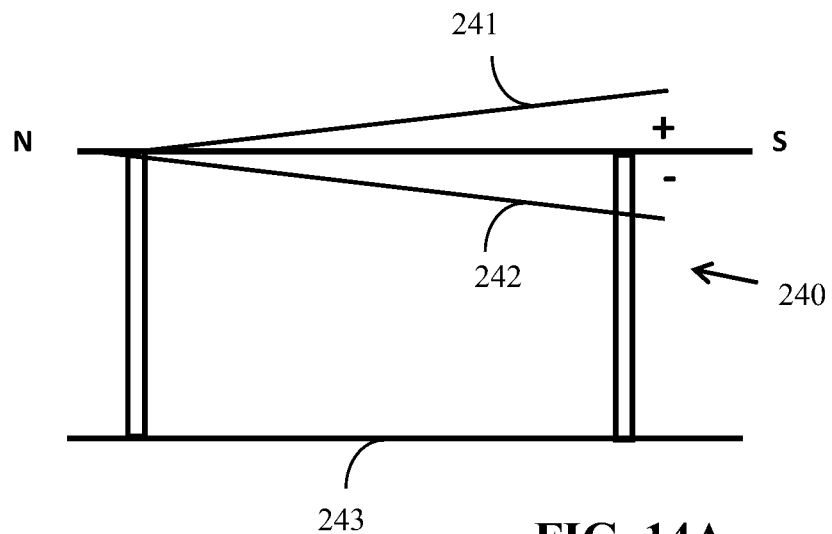
FIG. 14A presents a convention for assignment of positive and negative angles to describe the orientation of the daily axis relative to the local ground plane.

FIG. 14A presents convention 240 for angles related to tilt of the daily axis relative to local ground plane 243. Line 241 depicts a situation in which the south end of the daily axis is higher relative to the ground plane than the north end. The angle that line 241 forms with the ground plane is deemed positive. Line 242 depicts a situation in which the south end of the daily axis is close to the ground than the north end. The angle that line 242 forms with ground plane 243 is by convention deemed negative.

Figure 14B:
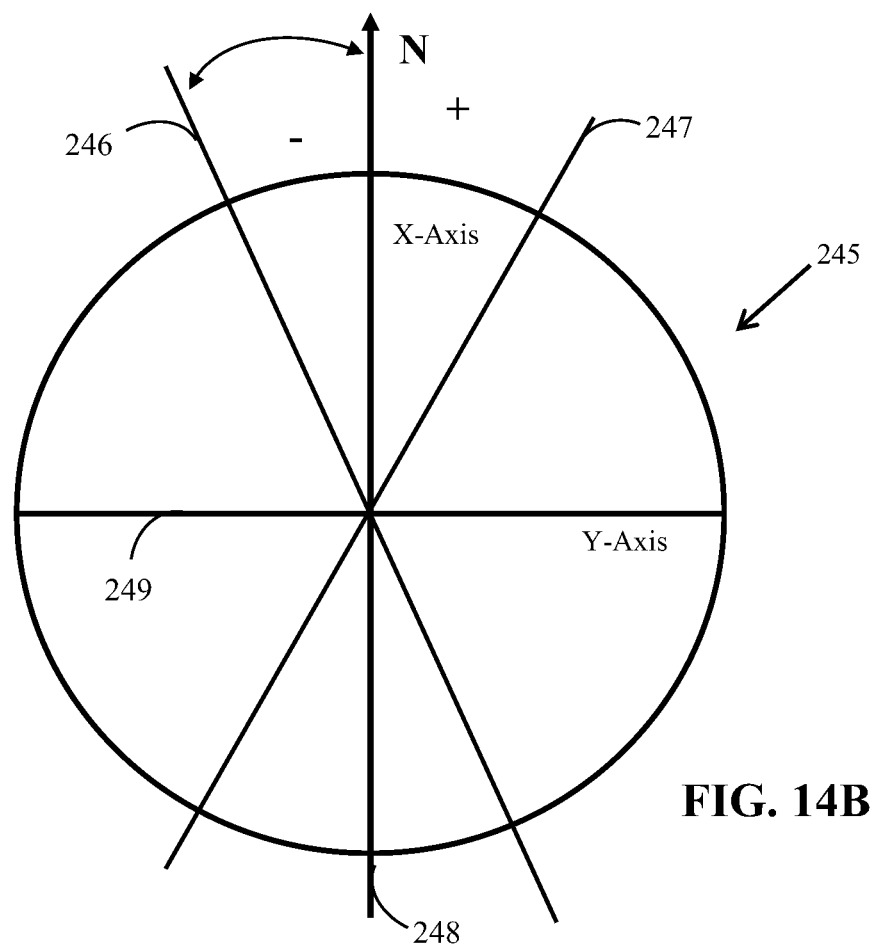
FIG. 14B presents a convention for assignment of positive and negative angles to describe the orientation of the daily axis relative to true north.

FIG. 14B presents convention 245 for angles related to the orientation of the daily axis relative to true north. Angle 246 presents a case wherein the daily axis is oriented to the west of true north, which angle is a negative value. Angle 247 presents a case wherein the daily axis is oriented to the east of true north, which angle is a positive value. Those of ordinary skill in the art will recognize that an angle of +200° is identical to an angle of −160°.

The conversion method of the present application involves applying a number of transforms in the form of a series of equations with a number of intermediate data values needed to arrive at a final value for the inputs to the preceding equations.

The NOAA Solar Calculator provides Theta AZ and Theta ALT according to time of day. Preset data values include latitude and longitude as these will not vary once a system is installed at a given location. This system of coordinates is essentially a spherical coordinate system. The range to the sun is approximately 93,000,000 miles, but the number can be normalized to one (1) without comprising any calculations as will be shown in the texts for FIG. 15A.

The entry data for the process is to obtain the time of day in order to retrieve the values for Theta AZ and Theta ALT. Once these are obtained then the transform process can begin. Preset values in the transform process are those values that do not change once a system is installed at a given location that have not already been taken into account within the NOAA Solar Calculator. The two values of main interest are the daily axis tilt relative to the local ground plane as described for FIG. 14A and the daily axis orientation relative to true north as described for FIG. 14B.

Figure 14C:
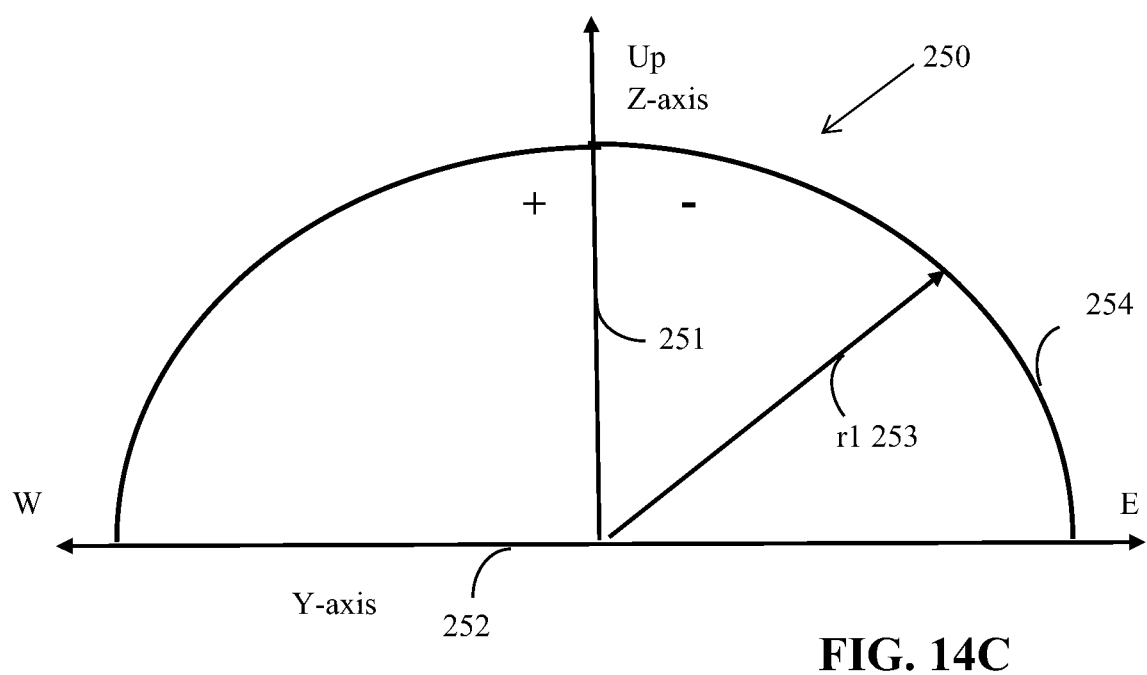
FIG. 14C presents a convention for depiction of the east-west axis and altitude axis of a solar concentrator system.

FIG. 14C depicts schematic 250 of the Y-Z plane of a solar concentrator system after the present application. As previously stated, the east-west axis (Y-axis 252) is a plane parallel to the local ground plane. It may be considered to be substantially pointed east-west but is not necessarily precisely east-west for reasons previously stated. Z-axis 251 is the plane perpendicular to the frame (not shown) of the solar concentrator system when the ends of the frame are substantially parallel to the local ground plane. Angles falling west of Z-axis 251 are positive and angles falling east of Z-axis 251 are negative. Semicircle 354 represents the arc formed by vector 253 as it moves through a day. Vector 253 represents a projection of a unity pointing vector perpendicular to the frame (not shown) of a solar concentrator system onto the Y-Z plane defined by Y-axis 252 and Z-axis 251.

As will be appreciated, a number of mathematical calculations are required to translate the output of the NOAA Solar Calculator into a form that can be used by a solar concentrator system according to the present disclosure. The steps can be accomplished using mathematical formula disclosed in various documents or sources, such as Wikipedia. One source is "C.R.C. Mathematical Tables, Thirteenth Edition," 1964, published by The Chemical Rubber Company, Robert C. Weast, Editor. The section on analytical geometry on pp. 446-450 is particularly useful. The coordinate system of the solar concentrator system is also spherical. The angle of each solar concentrator unit is equivalent to elevation and the angle of the frame is equivalent to azimuth. Thus the present calculations convert from one coordinate system to another coordinate system of the same type but with differing orientation of axes.

Figure 15A:
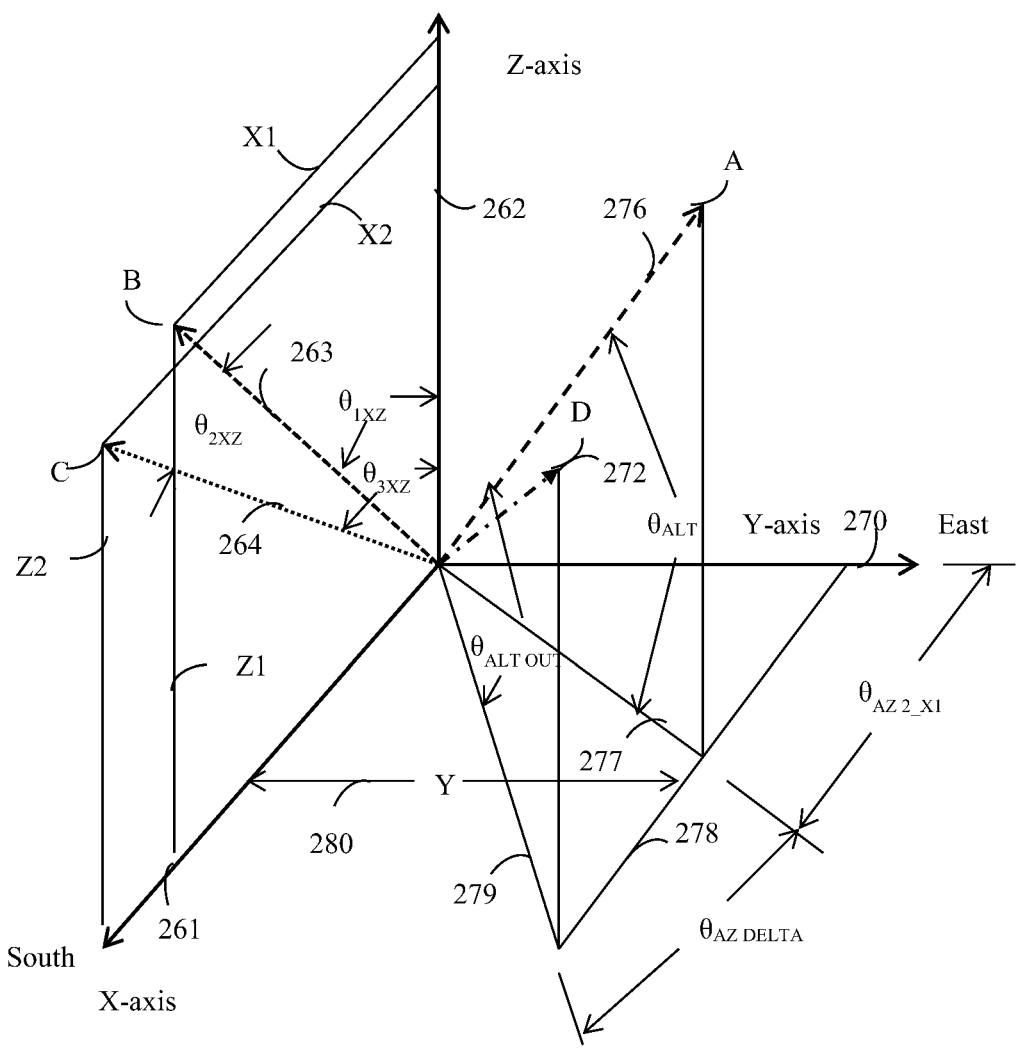
FIG. 15A presents a 3D Cartesian depiction of a coordinate transformation of solar azimuth and solar altitude to the local coordinate system of a solar concentrator system of arbitrary orientation.

FIG. 15A presents a 3D representation of the method used to calculate the position of the sun in the coordinate system of the solar concentrator system. The coordinate system of FIG. 15A comprises a standard Cartesian three dimensional grid with mutually perpendicular axes annotated as X-axis 261, Y-axis 270 and Z-axis 262. Spherical coordinate outputs are depicted in the drawing. Vector 276 of length r0 terminates at position A with coordinates X1, Y1 (not shown), and Z1. Vector 276 represents the angle of a solar axis defined by Theta AZ and Theta ALT from the NOAA Solar Concentrator translated into the XYZ coordinate system. Projection 263 of vector 276 onto the XZ plane defined by X-axis 261 and Z-axis 262 falls at point B with coordinates X1 and Z1. Vector 263 drawn from the origin of the grid system to point B forms angle $\theta_{1XZ}$ with Z-axis 262. Vector 263 terminating at point B is rotated by an angle $\theta_{2ZX}$ which is defined to be the value of Theta ALT Offset. Rotated vector 264 terminates at point C. All rotation takes place in the XZ plane about Y-axis 270. Since $\theta_{1XZ}$ and $\theta_{2XZ}$ fall in the same plane and are adjacent angles with the same vertex, the angle $\theta_{3XZ}$ between Z-axis 262 and rotated vector 264 is equal to $\theta_{1XZ} + \theta_{2XZ}$. Based on the length of rotated vector 264 and angle $\theta_{3XZ}$ it is possible to calculate new coordinates X2 and Z2. The length r1 of vector 263 is equal to $\sqrt{(X1^2+Z1^2)}$. Since vector 263 is rotated to point C in the XZ plane axiomatically it remains at length r1. Thus $r1=\sqrt{(X2^2+Z2^2)}$ and therefore $\sqrt{(X1^2+Z1^2)}=\sqrt{(X2^2+Z2^2)}$. Another consequence of the equality of $\sqrt{(X1^2+Z1^2)}$ and $\sqrt{(X2^2+Z2^2)}$ is that Y1=Y2. This follows because $r0=\sqrt{(X1^2+Y1^2+Z1^2)}$ and $r0=\sqrt{(X2^2+Y2^2+Z2^2)}$. Since it is established that $\sqrt{(X1^2+Z1^2)}=\sqrt{(X2^2+Z2^2)}$, by substitution $\sqrt{(X1^2+Y1^2+Z1^2)}=\sqrt{(X1^2+Y2^2+Z1^2)}$. Commonplace mathematical operations reduce this to Y1=Y2 (hereinafter Y, Y1 and Y2 are understood to have the same value for a rotation based on the same input Theta AZ and Theta ALT as indicated by distance line 280). This is also logical since all rotation is around the Y-axis. Since X2, Y (Y2), and Z2 are known, they can be used to calculate Theta AZ Out and Theta ALT Out which are represented by point D at the end of vector 272.

Angle Theta AZ2 X1 is defined as the included angle between projection 277 of vector 276 in the XY-plane and Y-axis 270. Angle Theta AZ2 X2 (not shown) is defined as the included angle between projection 279 of vector 272 and Y-axis 270. Theta AZ2 Delta is defined as the angle subtended by projection 277 of vector 276 onto the XY plane and projection 279 of vector 272 onto the XY plane. By inspection Theta2 X1–Theta2 X2=Theta AZ2 Delta Theta AZ is the angle subtended by projection 277 of vector 276 and the north end of the daily axis (not shown). The daily axis is nominally the X-axis. Theta AZ Out is the angle subtended by projection 279 of vector 272 and the north end of the daily axis (not shown). Theta AZ Out is equal to Theta AZ+Theta AZ2 Delta with some adjustments disclosed in conjunction with FIG. 15C. Theta ALT Out is the arcsine of $Z2/\sqrt{(X2^2+Y^2+Z2^2)}$.

Figure 15B:
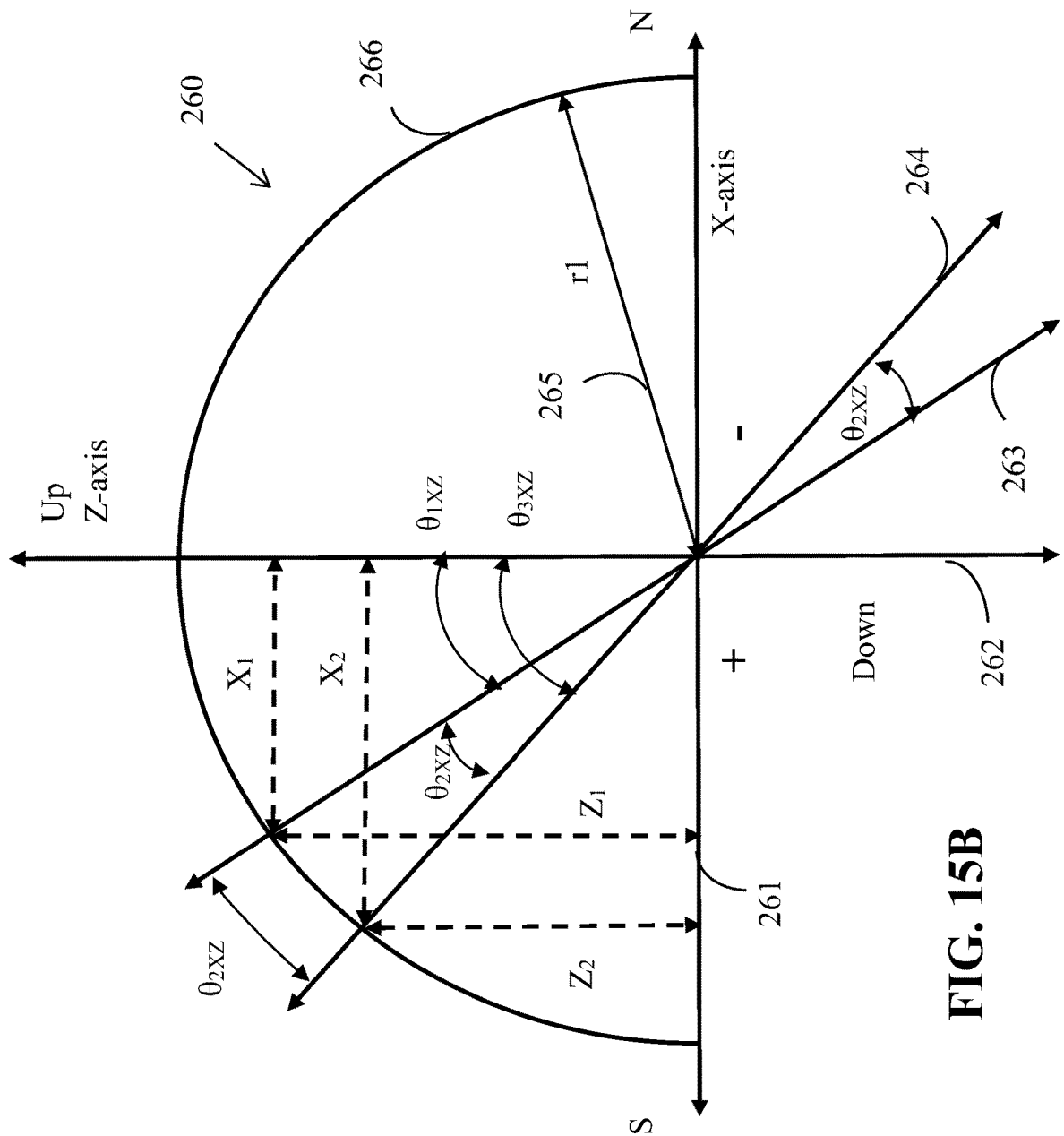
FIG. 15B presents a planar Cartesian view of the coordinate transformation of solar altitude and solar azimuth to the local coordinate system of a solar concentrator system of arbitrary orientation.

FIG. 15B depicts a view of the XZ plane of FIG. 15A as viewed along Y-axis 270. Vector 263 represents an angular position of a solar concentrator module (not shown) wherein the solar concentrator module is part of a solar concentrator system after FIG. 13B wherein the daily axis is substantially parallel to the local ground plane. Vector 263 forms angle $\theta_{1xz}$ with Z-axis vector 262. Vector 264 represents the position vector after the south end of a daily axle (not shown) situated in the Northern hemisphere is raised such that the south end of the daily axle is higher than the north end of the daily axle relative to the local ground plane (not shown) in a manner analogous to that disclosed in FIG. 13C. In practice the degree of incline of X-axis 261 relative to the ground plane is equal to angle $\theta_{2XZ}$. The angle formed between vector 263 and vector 264 is $\theta_{2XZ}$, making the total angle $\theta_{3XZ}$ between rotated vector 263 and Z-axis 262 equal to $\theta_{1XZ}+\theta_{2XZ}$. Vector 263 projects a distance $X_1$ onto X-axis 261 and a distance $Z_1$ onto Z-axis 262. Vector 264 similarly projects a distance $X_2$ onto X-axis 261 and a distance $Z_2$ onto Z-axis 262. X2 and Z2 may be considered the coordinates of vector 264 in Cartesian coordinate form.

Stated in other terms, the following equations apply:

$X1 = r1 * \sin\theta_{1XZ}$ $Z1 = r1 * \cos\theta_{1XZ}$ $X2 = r1 * \sin\theta_{3XZ}$ $Z2 = r1 * \cos\theta_{3XZ}$ For the present application, only a simple example requiring a coordinate transform is presented. The case in point is the example where the daily axis is not aligned to the north-south axis but rather is rotated to some arbitrary angle. The example does not involve tilt of the daily axis along the north-south axis as described in FIG. 14A and the rotation of the frame about the daily axis includes a point at which the frame is substantial parallel to the local horizontal plane.

FIG. 15C presents a table comprising a series of calculations that accept latitude, longitude local time and angle Theta AZ Offset, which is the angle between the daily axis of the solar concentrator system and the north-south axis. The table yields Theta N-S and Theta E-W. Theta E-W and Theta N-S are a position of the sun in the coordinate system of the solar concentrator system as described in FIGS. 14A, 14B and 14C. Theta E-W and Theta N-S are then adapted to be used as inputs in the previously described equations useful to position the daily axis and seasonal axis (not shown) of a solar concentrator system so that the optical axes of the solar concentrator modules are substantially oriented at the sun. The calculations may be implemented in commercially available spreadsheets, such as LibreOffice Calc or Microsoft Office Excel. The calculation may alternatively be implemented in higher order programming languages such as C, C++, C#, Pascal, and many others.

The table of FIG. 15C is organized into 7 major blocks noted by letters A through G. The steps within all blocks are number sequentially as 1 through 22. Those of skill in the art will recognize that many of the steps can be taken in orders other than the presented order without changing the output of the set of calculations. Numbering in the following paragraphs shall refer to FIGS. 15A and 15B.

Block A, steps 1 and 2, describes the information to be collected for the initial calculations of the NOAA Sun Position Calculator. Latitude and longitude are most typically described in degrees, minutes and seconds East or West and North or South, although a program may be configured by its programmer to accept alternative forms such as degrees including minutes and seconds converted to a decimal form. Latitude and longitude do not vary with time unless the solar concentrator system itself is moved for any reason, such as maintenance. Real time clock may similarly be expressed in hours, minutes and seconds or alternative as hours and decimal fractions thereof.

Block B, steps 3 and 4, present the data output of the NOAA Solar Position Calculator. Theta AZ is determined clockwise from true north and Theta Alt is determined as up from the local horizontal plane. Both may be presented in degrees, degrees, second and minutes or in radians or in arbitrary units.

Block C, step 5, presents the value Theta AZ Offset, which is the angle between the north-south axis of the earth and the orientation of the daily axis of the solar concentrator system. This angle does not vary with time unless the solar concentrator system itself is moved for any reason, such as maintenance. The angle may be determined through the use of ordinary surveying equipment or the like.

Block D, step 6, presents a step which subtracts Theta AZ Offset from step 5 from Theta AZ to yield Theta2 AZ, which is the calculated position of the sun in an intermediate coordinate system similar to the outputs of the NOAA Sun Position Calculator but with the azimuth angle shifted from relative to true north to the orientation relative to the angle of the daily axis of the solar concentrator system. This is an interim set of calculations Block E, steps 7-10, performs the full transformation from the intermediate coordinates of step 6 to a set of coordinates in the coordinate system of the solar concentrator system.

Step 7 calculates a sign value multiplier normalized to one or minus one so that it only affects the sign of values multiplied by it. The purpose is to insure that the final result of the calculations of the table conforms to the sign conventions disclosed in FIGS. 14A through 14C.

Step 8 calculates an intermediate value comprising part of the equation for Theta E-W disclosed in the part of the specification preceding the text regarding FIG. 14A.

Step 9 calculates the value of Theta E-W using the intermediate value for Step 8 together with the remainder of the equation for Theta E-W previously noted. Theta E-W is the angle of the daily axis as previously described.

Step 10 calculates the value of Theta N-S implementing fully the equation previously disclosed. Theta N-S is the angle of the seasonal axis which positions each of the solar concentrator module Block F, step 11, describes the method for converting coordinates based on the two orthogonal axes of a solar concentrator system into commands useful to drive a stepper motor or similar device from a first position to a second position.

Thus, a full tracking solution is provided for a solar concentrator system comprising a two angular movement systems operative to track the sun in both azimuth and altitude. The solar concentrator system can be operated open loop if necessary, or it may be operated with closed loop tracking with the use of the tracking solution only for initial operation to acquire the sun. An additional alternative is to operate open loop with periodic closed loop tracking updates to insure continued optimal operation. The trigger for an update may be based on time of day or alternatively on reduction in output providing a provision is made for shading by clouds or other obstacles. The open-loop tracking makes use of trigonometric calculations to convert from Theta AZ and Theta ALT from the NOAA Solar Calculator to a coordinate system of the solar concentrator system based on control of two stepper motors. The solar concentrator makes use of pulleys connect by wire cable to a driver pulley attached to a stepper motor to insure all solar concentrator modules move in concert.

One aspect of the solar concentrator system 50 is a need to achieve the greatest possible performance at the lowest possible cost. While performance is easily quantified, cost often must include items that do not contribute directly to performance such as the value of the surface on which the solar concentrator system must be mounted. For this reason, the performance of the solar concentrator system 50 is normally at some sort of premium.

Figure 16A:
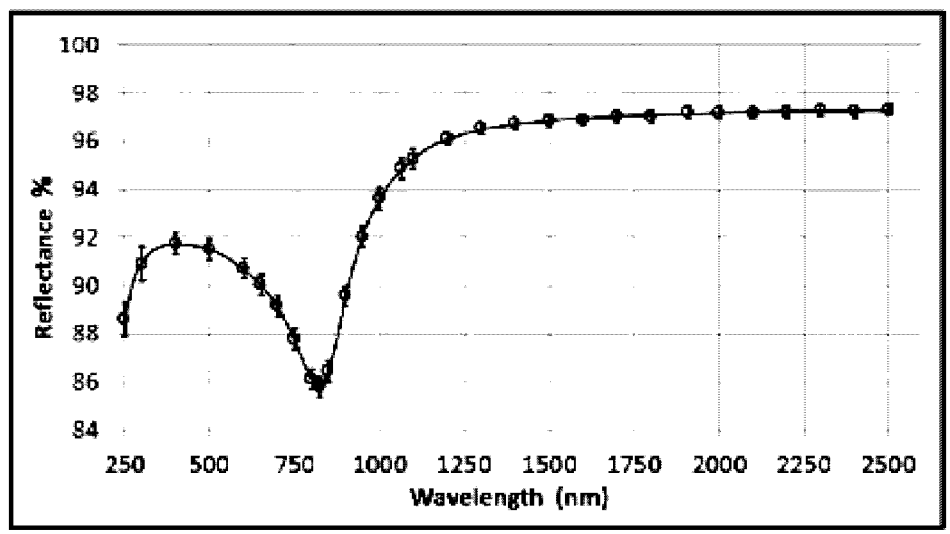
FIG. 16A presents the reflectance of an aluminum mirror across a range of wavelengths from 250 nm to 2500 nm.

One problem with the solar concentrator system 50 using reflective concentrator mirrors is that the materials used to form the reflective surface often have efficiency that varies within the spectrum of interest. FIG. 16A presents the reflectance spectrum for a mirror formed by coating a planar surface with aluminum. The reflectance for the visible light spectrum is roughly in the 90-92% range. At 800 nanometers (nm) the reflectance reaches a low point of 85.5% and for longer wavelengths beyond 800 nm the reflectance gradually rises to 97%. An improvement to reflectance at all wavelengths below 1100 nm would be useful.

An additional problem is that metals used for mirrors such as aluminum and silver are prone to oxidation which will further reduce its reflectivity. The problem of oxidation can be solved through the use of deposited coatings that protect the metal surface from oxidation, while the reflectance problem requires a different type of solution.

One solution to both problems may be found in the use of commercially available films that can be applied to a suitably formed mirror substrate. An example is the Cool Mirror Film 330 available from 3M™. These films include a reflective metal layer that is encapsulated so that oxidation of the metal layer does not occur. The film also includes dielectric layers above the metal layer that are designed to reflect light in the wavelength ranges where the metal reflectance is deficient and to not interfere with other wavelength ranges.

This property of dielectric mirrors is known. US 2009/0283133, for example, disclose a variety of possible dielectric mirror performances that are tuned to different parts of a spectrum of solar radiation. It is obvious that as part of the tuning the reflective properties of the underlying substrate can be taken into account.

Figure 16B:
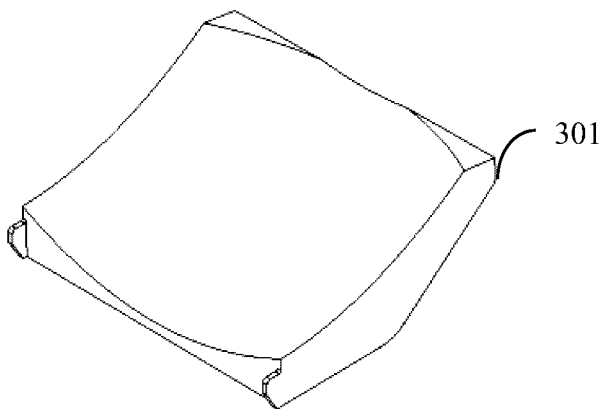
FIG. 16B presents a mirror substrate with curvature in two dimensions or axes.

Evaluation of the commercially available films has resulted in the understanding that the stiffness of these materials is relatively high. The inverse property to stiffness is compliance and materials of a low compliance are stiffer than materials of a high compliance. These films can easily be attached to a planar surface or to a trough mirror with gain in only one axis. Attaching the same film to the surface of a mirror or substrate with curvature in more than one axis, such as that of FIG. 16B, represents a more serious challenge. FIG. 16B depicts a concave mirror substrate 301 with curvature in two orthogonal axes. Use of a pressure sensitive adhesive on the surface of the planar substrate that is adjacent to the curved substrate is a common and accepted way for attaching a highly compliant material to a more rigid one or of attaching two thin materials. This is well known in the art.

Figure 16C:
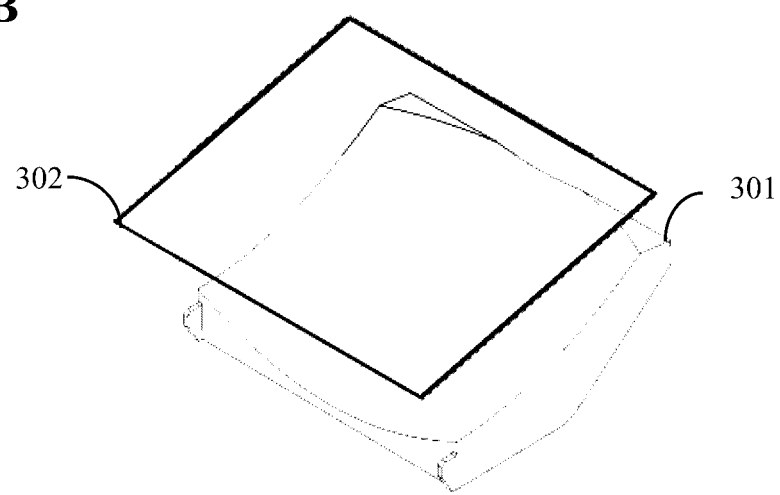
FIG. 16C presents a mirror substrate with curvature dimensions and a planar film to be applied to the substrate.

FIG. 16C illustrates the problem. Mirror substrate 301 represents a concave surface with curvature in two orthogonal axes while film 302 is planar. A planar substrate can be made to curve in one axis with the understanding that the stiffness of the material may limit the radius of curvature to a minimum number. Fixing a planar substrate to a concave substrate with curvature in two axes necessarily requires deformation of the planar substrate.

Figure 16D:
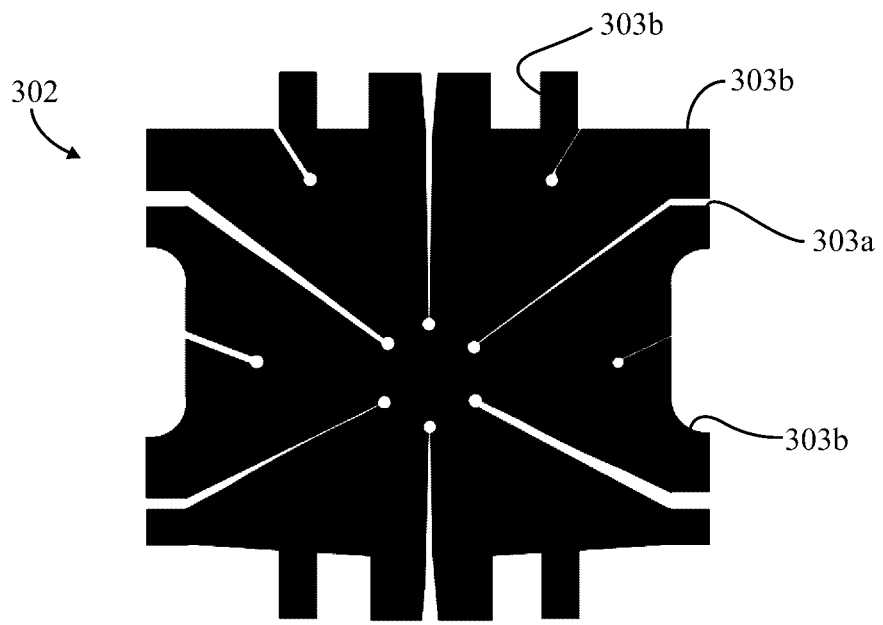
FIG. 16D presents a pattern of slots defined in a planar film to enable it to be applied to a mirror substrate with curvature in two dimensions

To overcome these difficulties, the present disclosure teaches a process to apply a planar film 302 to a substrate 301 having a concave surface with curvature along two axes. As briefly discussed here, a planar film 302, such as shown in FIG. 16D, is provided that has a plurality of first slots 303a defined radially from an outer edge toward a central portion of the planar film 302. The planar film 302 is also provided with a plurality of second slots 303b defined in the outer edge of the planar film 302. The planar film 302 is oriented adjacent the concave surface of the substrate 301 by supporting the outer edge of the planar film 302 with the second slots 303b. The planar film 302 is moved against the concave surface by: applying force against the planar film 302 from an applicator (e.g., 325a: FIG. 16F, 403: FIG. 16H) having a deformable surface, affixing the central portion of the planar film 302 first to the concave surface with the applied force of the application, and affixing progressively radial portions about the central portion of the planar film 302 to the concave surface by deforming the deformable surface of the applicator with the applied force.

Looking at the application techniques in more detail, FIG. 16D depicts a pattern of slots 303a-b that may be cut into a planar film 302. This approach is useful when the stiffness of a planar film is high enough to make it difficult to deform. By removing material as shown it has been demonstrated experimentally that a planar film 302 with high stiffness can be used to form a reflective surface on the surface of a concave mirror substrate 301 with curvature in two axes. Patterns of slots 303a-b other than the pattern shown have been tested and proven to work.

Figure 16E:
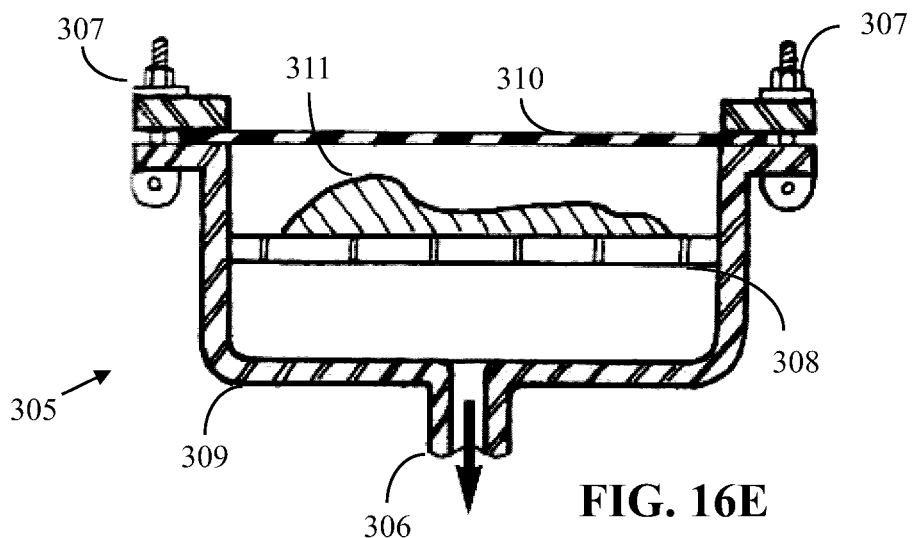
FIG. 16E presents a vacu-forming device utilizing air pressure outside a vacuum area to force compliance of a first material onto a second material within the vacu-forming device.

FIG. 16E depicts vacu-form (vacuum forming) device 305. Vacu-form device 305 comprises vacuum housing 309, evacuation port 306, platen 308, mold 311, toggle clamps 307 and planar substrate 310 and a vacuum pump (not shown). The vacuum pump is operative to reduce the pressure of air or any other gas within the vacuum housing. In one embodiment, a heater assembly (not shown) is mounted above planar substrate 310 to heat and thereby soften the material to add thermo-forming capability. In one embodiment, a vacuum seal membrane (not shown) is placed above planar substrate 310 to reduce the surface area of planar substrate 310 required to the minimum necessary. The vacuum seal membrane pushes down on planar substrate 310 forcing it to conform to the shape of mold 311. In an embodiment mold 311 is a mirror substrate similar to mirror substrate 301.

A vacu-forming process can be adapted to attach a planar film to a substrate. This differs in that the planar film should adhere to the surface of the substrate rather than releasing after pressure is removed as is typical of a mold process. A limitation of a vacu-forming approach is that the pressure that is applied to planar substrate 310, whether directly or by a vacuum seal membrane, is limited to atmospheric pressure, nominally 14.696 pounds per square inch or 101.325 kPa at sea level. In some instances, it may be desirable to be able to apply a greater level of pressure. Another desirable characteristic of a method of attaching a planar film to a substrate with curvature in two axes is that the film should adhere to the surface without forming air bubbles or other inclusions that may lead to a tarnishing of the reflective metal layer due to oxidation. While it is possible to perform manufacturing in a relatively inert atmosphere such as nitrogen, it is desirable to find a less complex way to do this.

The point at which to apply additional pressure is a position wherein the additional pressure reinforces the movement of the vacuum seal membrane of FIG. 16E in pressing planar substrate 310 onto mold 311. The distribution of the additional pressure is a matter for consideration. A particular mold configuration may dictate that a particular approach is more suitable than another. A surface configuration of interest is the situation of a concave surface with curvature in two axes such as that shown in FIG. 16B.

FIG. 16F discloses a solution to these problems. Vacuforming device 315 comprises vacuum housing 316, evacuation port 317, platen 318, shims 319, and deformable membrane 323. Shims 319 act to hold mirror substrate 320 steady on platen 318. Mirror substrate 320 comprises a concave surface with curvature on two axes, wherein interior curve 322 comprises a maximum depth curve, and interior curve 321 comprises a set of edges of the mirror substrate 320 parallel to interior curve representing local maxima relative to interior surface 322. Similar curves exist in the orthogonal view (not shown). An applicator or ball 325a represents, in one embodiment, a sphere with a gas sealed within, acting as a pressure medium, selected such that its radius of curvature (not shown) is less than that of interior curve 322 and is also less than that of the interior curve orthogonal (not shown) to interior curve 322. In another embodiment, the sphere is a solid sphere with no internal gas fabricated from a suitably compliant material. Establishing this requirement for radius of curvature insures that the first point of contact between mirror substrate 320 and ball 325a is at a point considered to be the bottom of the central curve 322 of mirror substrate 320 as depicted.

In one embodiment, evacuation port 317 is connected to a vacuum pump (not shown) by suitable hoses (not shown). In one embodiment, evacuation port 317 is not connected to a vacuum pump and acts as a vent port.

Using a pressurized gas within ball 325a assists in insuring that the compliance of ball 325a is limited. The actual internal pressure may be somewhat above or even equal to atmospheric pressure, but the surface of ball 325a is a curvilinear sealed entity into which no substantial amount of gas may be introduced or taken out during routine operation. When pressed by force 326 from a position opposite to the position of mirror substrate 320, ball 325a is deformed into non-spherical ball 325b. Ball 325a and ball 325b represent the same physical ball for the applicator in different states of deformation and are not to be construed as separate items. Force 326 may be applied by a mechanical element similar in concept to the movement of a drill press chuck (not shown) and spindle (not shown) without the rotation normally associated with the spindle. The central axis of the chuck and spindle is aimed to lowest point 327 of mirror substrate 320 such that the first point of contact between ball 325a and mirror substrate 320 is the lowest point 327. Mirror substrate 320 may be fixed in a suitable locating with a jig (not shown) or another structure with similar function.

As further pressure is applied, ball 325a conforms to the curvature of concave mirror substrate 320 in both axes. The point of contact with concave mirror substrate 320 will spread from lowest point 327 as depicted to positions further out on all sides. This spread of the point of contact insures that reflective film 324 can be applied to mirror substrate 320 without the development of air bubbles or other inclusions. Those of skill in the art will recognize that the approach depicted in FIG. 16F need not necessarily require the use of a vacu-forming device such as that shown in FIG. 16E, although it may be necessary that the assembly have a vent port to insure that no internal pressure develops during the application of a planar substrate. The process described above need not be limited to mirror surfaces.

One issue with the use of spherical ball 325a for the applicator is that the radius of ball 325a limits the surface area over which added pressure can be applied. This is inherent in this choice of pressure medium. The exact area is dependent on the compliance of ball 325a. Ball 325a must have sufficient stiffness to be able to push reflective film 324 onto the surface of mirror substrate 320 and also must have a low enough stiffness to conform to the surface of concave mirror substrate 320 under pressure. These requirements are somewhat in conflict but applicant has demonstrated this in experimentation so it is proven that both requirements can be satisfied through selection of a suitable material for ball 325a. In one embodiment, ball 325a is filled with air. As pressure is applied to ball 325a to deform it as shown in ball 325b, the volume of ball 325b shrinks somewhat relative to ball 325a and the pneumatic air pressure within ball 325b rises. This in turn will increase the stiffness of ball 325b.

Figure 16G:
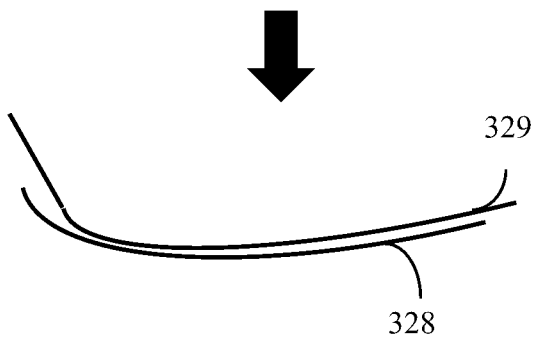
FIG. 16G depicts a process of providing for external pressure on a curved surface within a vacu-forming device.
Figure 16F:
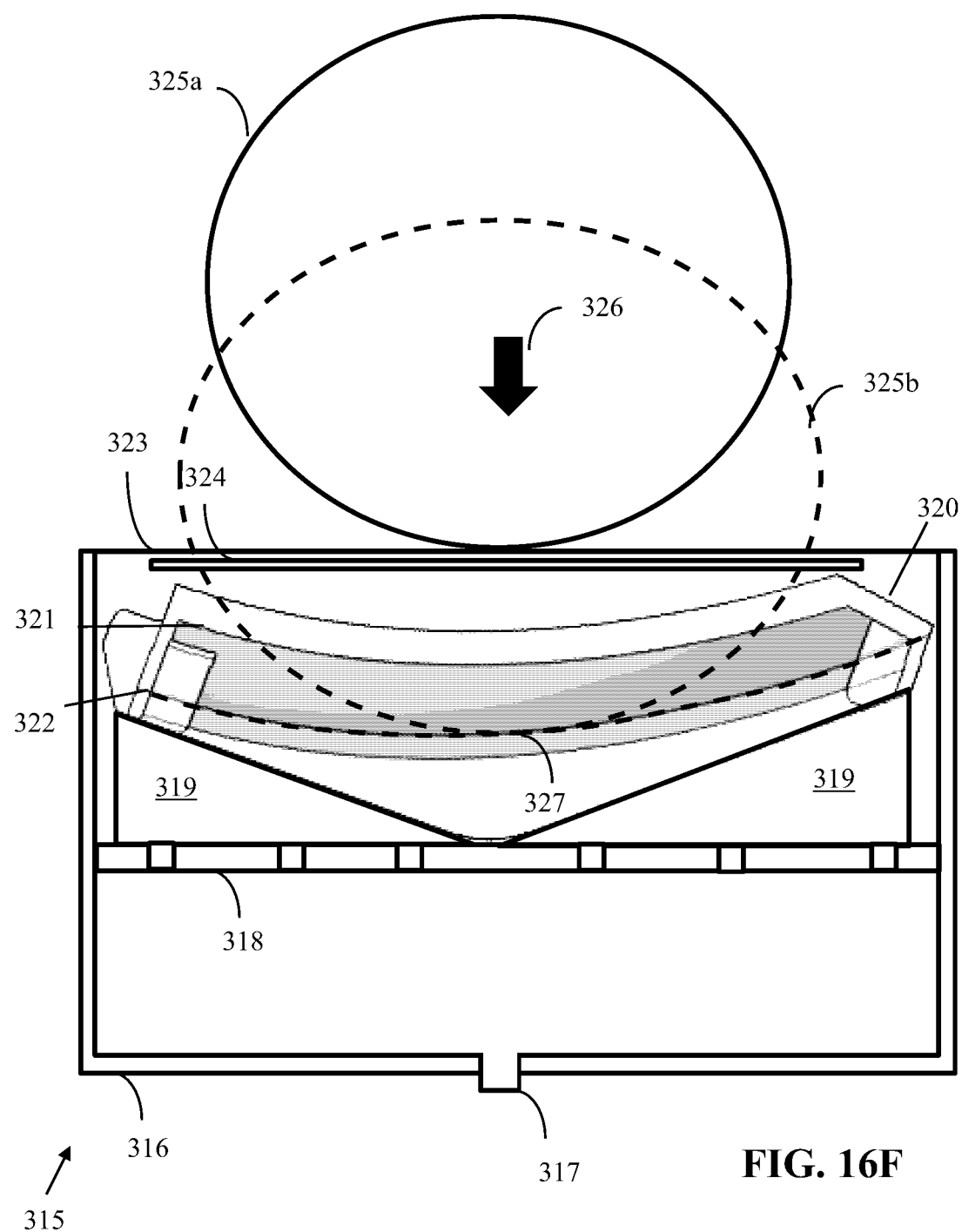
FIG. 16F presents an adaptation of the vacu-forming device of FIG. 16E with the addition of a deformable, spherical pressure medium located outside the vacuum area.
Figure 16H:
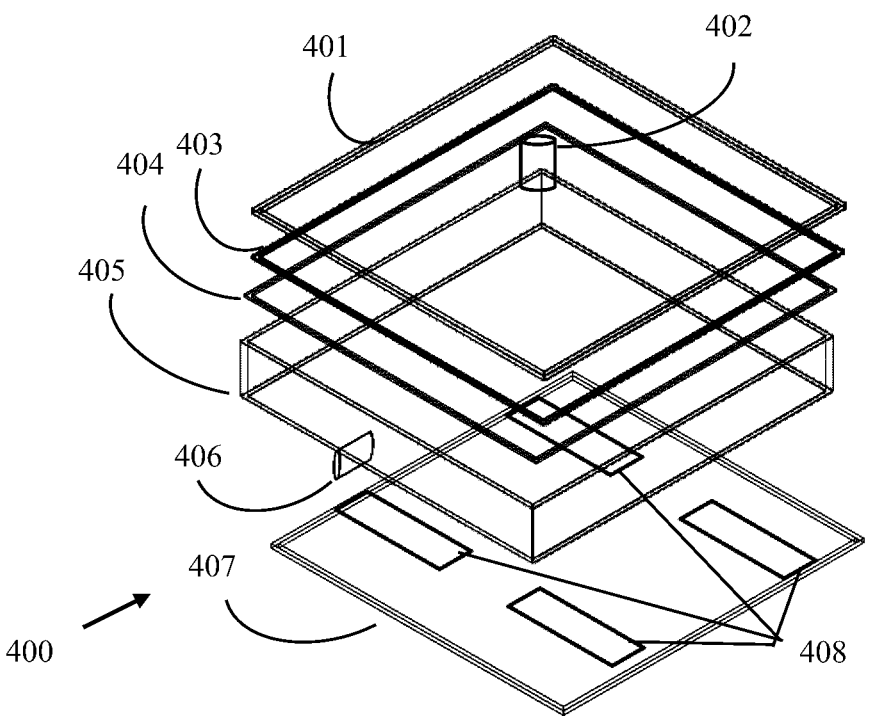
FIG. 16H depicts a perspective view of the stack for the process of providing pressure on a curved substrate.

FIG. 16G depicts one way of overcoming this limitation. Curved surface 328 are shown to represent the curvature of a mirror substrate (not shown), and curved surface 329 are shown to represent the curvature of a curvilinear pressure medium (not shown) used to press a film similar to reflective film 324 of FIG. 16F onto the surface of the substrate. The use of a curvilinear pressure medium pressure medium still requires that the local radius of curvature of the pressure medium is less that the radius of curvature of the substrate. By inspection, the radius of curvature for curved surface 328 is clearly greater than that of curvature 329 of the pressure medium. In one embodiment, the substrate is a mirror substrate.

Figure 16I:
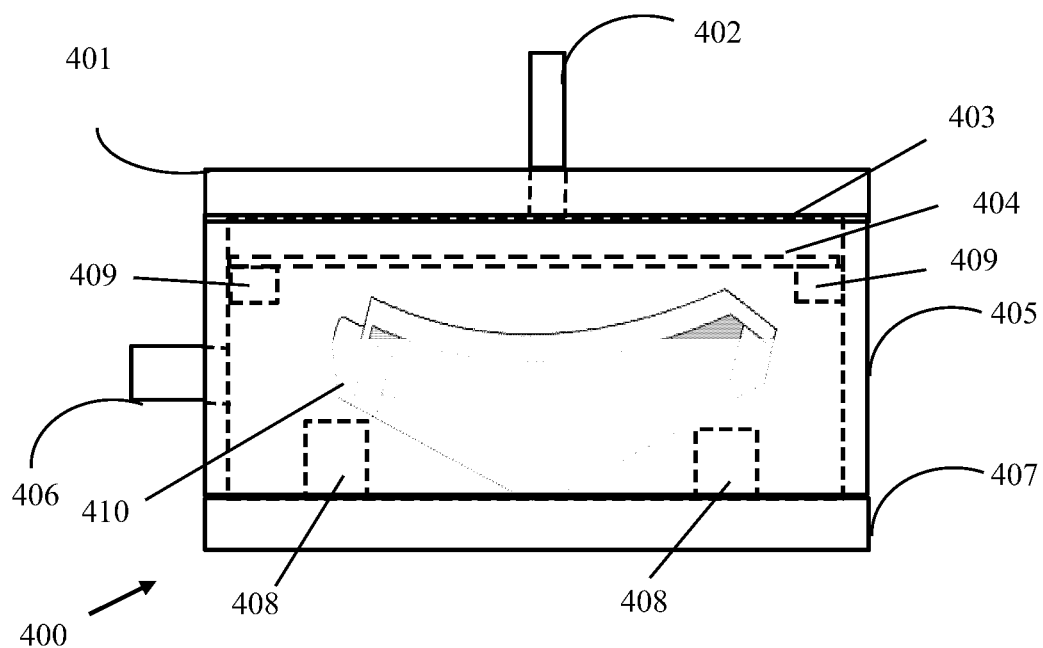
FIG. 16I depicts a side view of a process for providing pressure on a curved substrate.

FIGS. 16H and 16I present an alternative assembly device 400 capable of fixing a planar film to a concave surface with curvature in two axes. Assembly device 400 comprises top plate 401 with inlet aperture 402 affixed thereto, pressure system frame 405 with evacuation port 406 affixed thereto, bottom plate 407 with jig components 408 affixed thereto, substantially impermeable membrane or applicator 403, and film holding fixture 409. Together, pressure frame 405 and bottom plate 407 comprise a vacuum housing similar to vacuum housing 316 of FIG. 16F. In one embodiment, evacuation port 406 is affixed to bottom plate 407. Concave substrate 410 is held in placed by jig components 408 such that it is oriented in a position with its concave surface facing membrane 403. (Substrate 301 of FIG. 16B depicts an alternative view of concave substrate 410.)

Film 404 is positioned between concave substrate 410 and the membrane or applicator 403. Film 404 is held in place substantially parallel to top plate 401 by holding fixture 409. Ideally, holding fixture 409 is a friction restraining device able to release film 404 when sufficient pressure is applied perpendicular to the plane of film 404. In one configuration, a set of binder clips may be used to provide this friction in conjunction with a cross bar. Other solutions are available.

Membrane 403 as the applicator is a substantially impermeable membrane selected to have substantially compliance and elasticity. Membrane 403 may be mounted directly to top plate 401 at a position near the interface between top plate 401 and pressure system frame 405. Alternatively, membrane 403 may form part of a gasket between top plate 401 and pressure system frame 405 or may be affixed to the interior walls of pressure system frame 405. Membrane 403 acts to divide the interior of assembly device 400 into two chambers, an upper chamber, and a lower chamber. The upper and lower chambers are of variable size. Inlet aperture 402 is connected to a pressure pump (not shown) by hoses (not shown) such that a gas under pressure may be introduced through inlet aperture 402 into the upper chamber and thereby cause membrane 403 to expand inside the interior chamber of assembly device 401.

Evacuation port 406 is connected to a vacuum pump (not shown) by hoses (not shown) wherein the vacuum pump is operative to pump gas from the lower chamber of assembly device 400 and thereby cause membrane 403 to expand into the lower chamber of the interior of assembly device 400. The hoses connected to the upper and lower chambers of the interior of assembly device may be configured with relief valves operative to restore the upper chamber and the lower chamber to the pressure of the gas surrounding the exterior of assembly device 400. In one embodiment, evacuation port 406 is not connected to a vacuum pump and acts as a vent port.

When a vacuum pump acts alone to evacuate the lower chamber and no pressure is added to the upper chamber, the limit on pressure that can be applied is the pressure of a standard atmosphere, assuming that all gas is evacuated from the lower chamber. This was demonstrated experimentally to be insufficient for the application of a film with substantially stiffness to a concave substrate with curvature in two axes. In one embodiment, a vacuum pump (not shown) is operative to remove gas from the lower chamber of the interior of assembly device 400 and a pressure pump (not shown) is operative to apply pneumatic pressure to the upper chamber of the interior of assembly device 400 substantially simultaneously.

In some instances, it may be advantageous to operate with film 404 at an elevated temperature to reduce its stiffness. In one embodiment, a heating element (not shown) is included in film holding fixture 409 to transfer heat to film 404. In one embodiment, the gas within the interior of assembly device 400 is pre-heated. In one embodiment, the gas introduced through inlet aperture 402 is preheated.

While this has been described by way of example, and in terms of embodiments, it is to be understood that the present disclosure is not limited to the disclosed embodiments. To the contrary it is intended to cover various modifications and similar arrangements that would be apparent to those skilled in the art. Therefore, the scope of the appended claims should be accorded the widest possible interpretation so as to encompass all such modifications and similar arrangements.

What is claimed is:

1. A system for use on a surface to collect solar energy from the sun, the system comprising:
   a stand supportable on the surface and having first opposing ends, the first opposing ends having first rotational points;
   a frame having second opposing ends with second rotational points, the second rotational points rotatably disposed on the first rotational points of the stand, the module frame rotatable on the first and second rotational points about a first axis of rotation;
   a first drive disposed on the stand and operable to provide first rotation;
   a hoop disposed on the frame and defining a curvature about the first axis;
   at least one first cable connected between the hoop and the first drive and rotating the frame about the first axis with the hoop in response to the first rotation of the first drive; and
   a plurality of solar collector modules disposed on the frame for collecting solar energy;
   wherein each solar collector module is mounted rotationally to the frame and rotatable about a second axis of rotation, each solar collector module comprising a reflective mirror with curvature in two orthogonal axes, wherein one of said orthogonal axes is parallel to the second axis of rotation of the solar collector module; and
   wherein each of the solar collector modules comprise a photovoltaic cell disposed on a planar surface.

2. The system of claim 1, wherein the at least one first cable comprises a pre-stretched wire cable.

3. The system of claim 1, wherein first drive comprises an encoder, a stepper motor, a linear actuator, a DC motor, an AC motor, a brushless motor, or a brushed motor.

4. The system of claim 1, wherein the first drive comprises a drive pulley having the at least one first cable disposed thereon and being rotatable with the first rotation by the first drive.

5. The system of claim 4, wherein the drive pulley defines a helical groove thereabout in which the at least one first cable at least partially wraps.

6. The system of claim 4, wherein the at least one first cable comprises:
   a first cable segment having one end affixed to the drive pulley and having an opposing end affixed to the hoop on one side thereof; and
   a second cable segment having one end affixed to the drive pulley and having an opposing end affixed to the hoop on an opposing side thereof.

7. The system of claim 1, further comprising a first tensioner tensioning the at least one first cable.

8. The system of claim 7, wherein the first tensioner comprises a turnbuckle disposed in line with the at least one first cable, an idler pulley, a biasing element, a catch biased to grip in tension and release in slack, or a combination thereof.

9. The system of claim 1, wherein the plurality of solar collector modules are disposed in parallel to one another between the second opposing ends of the frame.

10. The system of claim 9, wherein each of the solar collector modules has an optic axis, and wherein the solar collector modules orient with the optic axes of the solar collector modules substantially parallel to one another.

11. The system of claim 10, wherein the system comprises:
the frame having the second opposing ends and having opposing sides, the second axes of rotation of the solar collector modules being parallel to one another, and the solar collector modules being rotatable along the second parallel axes between the opposing sides of the frame;
a plurality of pulleys disposed along at least one of the opposing sides and connected to the second axes of the solar collector modules;
a second drive disposed on the frame and operable to provide a second rotation; and
at least one second cable connected between the second drive and the plurality of pulleys and rotating the solar collector modules in tandem about the second axes in response to the second rotation.

12. The system of claim 11, further comprising a control system operating the first and second drives in conjunction with one another to at least repeatedly orient the optic axes of the solar collector modules toward the sun.

13. The system of claim 11, wherein the second axes are oriented perpendicular to the first axis of the stand, whereby the first axis is configured to orient parallel to a north-south cardinal direction and the second axes are configured to orient parallel to an east-west cardinal direction.

14. The system of claim 11, wherein the second drive comprises an encoder, a stepper motor, a linear actuator, a DC motor, an AC motor, a brushless motor, or a brushed motor.

15. The system of claim 11, wherein the second drive comprises a drive pulley having portion of the at least one second cable affixed thereto.

16. The system of claim 11, wherein each of the pulleys defines a helical groove thereabout in which the at least one second cable at least partially wraps.

17. The system of claim 11, comprising a second tensioner tensioning the at least one second cable.

18. The system of claim 17, wherein the second tensioner comprises a turnbuckle disposed in line with the at least one second cable, an idler pulley, a biasing element, a catch biased to grip in tension and release in slack, or a combination thereof.

19. The system of claim 11, wherein
the reflective mirror of each solar collector module is disposed on a first face of the respective solar collector module; and
the photovoltaic cell of each solar collector module is disposed on a second face of the respective solar collector module, wherein the second face is angled and adjacent with respect to the first face, the photovoltaic cell disposed at a focus of the reflective mirror and converting solar energy reflected thereto into photovoltaic energy.

20. The system of claim 19, wherein each of the solar collector modules comprises: a tray having opposing ends and having the adjacent first and second faces extending between the opposing ends of the tray, the adjacent first and second faces defining an open trough of the tray, the opposing ends of the tray having third rotational points rotatably connected to the opposing sides of the frame.

21. The system of claim 20, wherein each of the trays comprises:
a transparent cover disposed on the open trough of the tray; and
a brush affixed to the tray at a position approximately opposite the transparent cover of the respective tray and configured to contact with the transparent cover of an adjacent one of the solar collector modules with the second rotation of the adjacent solar collector modules.

22. The system of claim 1, wherein the system further comprises at least one other stand having at least one other frame, the stands positioned end-to-end, the first drive operable to rotate the frames in tandem.

23. A system for use on a surface to collect solar energy from the sun, the system comprising:
a stand supportable on the surface and having opposing first ends, the first opposing ends having first rotational points;
a frame having opposing sides and second opposing ends with second rotational points, the second rotational points rotatably disposed on the first rotational points of the stand, the frame rotatable on the first and second rotational points about a first axis of rotation;
a first drive disposed on the stand and operable to provide first rotation;
a hoop disposed on the frame and defining a curvature about the first axis;
at least one first cable connected between the hoop and the first drive and rotating the frame about the first axis with the hoop in response to the first rotation of the first drive; and
a plurality of solar collector modules for collecting solar energy with the solar collector modules disposed parallel to one another and mounted to the opposing sides of the frame with optic axes substantially parallel to one another,
each solar collector module comprising:
a reflector on a first surface and a photovoltaic cell on a second surface adjacent to the first surface; and
a tray having opposing ends and adjacent first and second faces extending between the opposing ends of the tray, the first and second faces defining an open trough of the tray, the opposing ends of the tray having third rotational points rotatably connected to the opposing sides of the frame, a transparent cover disposed on the open trough of the tray, and
a brush affixed to the tray at a position approximately opposite the transparent cover of the respective tray and configured to contact with the transparent cover of an adjacent one of the solar collector modules with the rotation of the adjacent solar collector modules.

24. A system for use on a surface to collect solar energy, the system comprising:
a frame having opposing sides and a plurality of solar collector modules with the solar collector modules disposed parallel to one another and mounted to the opposing sides of the frame with optic axes substantially parallel to one another, each solar collector module comprising:
a reflector on a first surface and a photovoltaic cell on a second surface;
a tray having opposing ends and adjacent first and second faces extending between the opposing ends, the first and second faces defining an open trough of the tray, the opposing ends having rotation points rotatably connected to the opposing sides of the frame, a transparent cover disposed on the open trough of the tray, and
a brush affixed to the tray at a position approximately opposite the transparent cover of the respective tray and configured to contact with the transparent cover of an adjacent one of the solar collector modules with the rotation of the adjacent solar collector modules.

\* \* \* \* \*